(12) United States Patent
Lee et al.

(10) Patent No.: US 12,096,683 B2
(45) Date of Patent: Sep. 17, 2024

(54) ORGANIC ELECTROLUMINESCENCE DEVICE

(71) Applicant: Samsung Display Co., Ltd., Yongin-si (KR)

(72) Inventors: Jungsub Lee, Hwaseong-si (KR); Hyunyoung Kim, Yongin-si (KR); Jiyoung Lee, Hwaseong-si (KR); Hyejin Jung, Hwaseong-si (KR); Minje Kim, Suwon-si (KR); Eung Do Kim, Seoul (KR); Hyojeong Kim, Hwaseong-si (KR); Hyosup Shin, Hwaseong-si (KR); Seokgyu Yoon, Hwaseong-si (KR); Youngki Lee, Asan-si (KR); Kunwook Cho, Seoul (KR); Hyeon Gu Cho, Yongin-si (KR); Minsoo Choi, Seoul (KR); Youngeun Choi, Jeonju-si (KR); Hyein Jeong, Suwon-si (KR); Jaejin Lyu, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1025 days.

(21) Appl. No.: 17/035,552

(22) Filed: Sep. 28, 2020

(65) Prior Publication Data
US 2021/0098716 A1    Apr. 1, 2021

(30) Foreign Application Priority Data
Oct. 1, 2019    (KR) .................... 10-2019-0121814

(51) Int. Cl.
*H01L 51/54*    (2006.01)
*H10K 85/30*    (2023.01)
(Continued)

(52) U.S. Cl.
CPC ....... *H10K 85/6572* (2023.02); *H10K 85/342* (2023.02); *H10K 85/344* (2023.02);
(Continued)

(58) Field of Classification Search
None
See application file for complete search history.

(56) References Cited

U.S. PATENT DOCUMENTS 9,276,228 B2    3/2016    Seo et al.
9,666,817 B2    5/2017    Kim et al.
(Continued)

FOREIGN PATENT DOCUMENTS

| CN | 109456326 A | 3/2019 |
|---|---|---|
| EP | 3438104 A1 | 2/2019 |
| EP | 3544076 B1 | 8/2020 |
| JP | 2016-130231 A | 7/2016 |
| JP | 2017143243 A | 8/2017 |
| KR | 10-2011-0113297 A | 10/2011 |

(Continued)

OTHER PUBLICATIONS

Yuan et al. Adv. Optical Mater. 2019, 7, 1801536. (Year: 2019).*
(Continued)

*Primary Examiner* — Andrew K Bohaty
(74) *Attorney, Agent, or Firm* — Lewis Roca Rothgerber Christie LLP

(57) ABSTRACT

An organic electroluminescence device according to an embodiment of the present disclosure includes a first electrode, a second electrode, and an emission layer. The emission layer includes host compounds and dopant compounds. The hot compounds include a first host compound represented by Formula 1, and a second host compound represented by Formula 2, and the dopant compounds include an assistant dopant compound represented by Formula 3, and a light-emitting dopant compound represented by Formula 4:

Formula 1

Formula 2

Formula 3

(Continued)

-continued

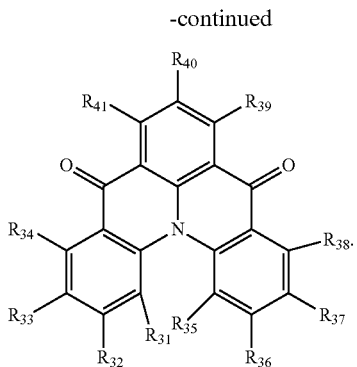

Formula 4

Accordingly, the organic electroluminescence device according to an embodiment may achieve high efficiency and long life.

25 Claims, 2 Drawing Sheets

(51) Int. Cl.
 H10K 85/40 (2023.01)
 H10K 85/60 (2023.01)
(52) U.S. Cl.
 CPC ......... H10K 85/346 (2023.02); H10K 85/348 (2023.02); H10K 85/371 (2023.02); H10K 85/40 (2023.02); H10K 85/636 (2023.02)

(56) References Cited

U.S. PATENT DOCUMENTS

| | | | |
|---|---|---|---|
| 9,923,155 | B2 | 3/2018 | Li et al. |
| 10,090,483 | B2 | 10/2018 | Kim et al. |
| 10,177,329 | B2 | 1/2019 | Kim et al. |
| 10,224,376 | B2 | 3/2019 | Kim et al. |
| 10,290,816 | B2 | 5/2019 | Forrest et al. |
| 10,374,166 | B2 | 8/2019 | Hatakeyama et al. |
| 10,418,573 | B2 | 9/2019 | Kim et al. |
| 10,916,715 | B2 | 2/2021 | Ko et al. |
| 2016/0087227 | A1 | 3/2016 | Kim et al. |
| 2016/0164020 | A1 | 6/2016 | Kim et al. |
| 2016/0301014 | A1 | 10/2016 | Kawamura et al. |
| 2018/0108857 | A1 | 4/2018 | Adachi et al. |
| 2018/0375036 | A1 | 12/2018 | Chen et al. |
| 2019/0198773 | A1 | 6/2019 | Yamatani |
| 2019/0296254 | A1 | 9/2019 | Ko et al. |
| 2019/0378997 | A1 | 12/2019 | Ishikawa et al. |
| 2021/0104689 | A1 | 4/2021 | Kim et al. |

FOREIGN PATENT DOCUMENTS

| | | |
|---|---|---|
| KR | 10-2011-0116635 A | 10/2011 |
| KR | 10-1219668 B1 | 1/2013 |
| KR | 10-1419810 B1 | 7/2014 |
| KR | 10-2016-0012941 A | 2/2016 |
| KR | 10-2016-0034528 A | 3/2016 |
| KR | 10-2016-0039974 A | 4/2016 |
| KR | 10-1617877 B1 | 5/2016 |
| KR | 10-2016-0067629 A | 6/2016 |
| KR | 10-1646732 B1 | 8/2016 |
| KR | 10-2016-0119683 A | 10/2016 |
| KR | 10-2017-0014797 A | 2/2017 |
| KR | 10-1706752 B1 | 2/2017 |
| KR | 10-2017-0057163 A | 5/2017 |
| KR | 10-2017-0078573 A | 7/2017 |
| KR | 10-2017-0083960 A | 7/2017 |
| KR | 10-2018-0013380 A | 2/2018 |
| KR | 10-2018-0043886 A | 5/2018 |
| KR | 10-2019-0000812 A | 1/2019 |
| KR | 10-1956425 B1 | 3/2019 |
| KR | 10-2019-0034126 A | 4/2019 |
| KR | 1020210041161 A | 4/2021 |
| WO | WO 2016/152605 A1 | 9/2016 |
| WO | 2018/159662 A1 | 9/2018 |

OTHER PUBLICATIONS

Zhang, Huaqiang, et al., "Synthesis, characterization, and electroluminescent properties of star shaped donor-acceptor dendrimers with carbazole dendrons as peripheral branches and heterotriangulene as central core," Tetrahedron, vol. 65, 2009, pp. 4455-4463.

Yuan, Yi et al., "The Design of Fused Amine/Carbonyl System for Efficient Thermally Activated Delayed Fluorescence: Novel Multiple Resonance Core and Electron Acceptor", Adv. Optical Mater. 2019, 1801536, DOI: 10.1002/adom.201801536 (6 pages).

Li, Xing et al., "Thermally Activated Delayed Fluorescence Carbonyl Derivatives for Organic Light-Emitting Diodes with Extremely Narrow Full Width at Half-Maximum", ACS Appl. Mater. Interfaces 2019, 11, 13472-13480 (9 pages).

\* cited by examiner

ORGANIC ELECTROLUMINESCENCE DEVICE

CROSS-REFERENCE TO RELATED APPLICATION

This application claims priority to and the benefit of Korean Patent Application No. 10-2019-0121814, filed on Oct. 1, 2019, the entire content of which is hereby incorporated by reference.

BACKGROUND

1. Field

One or more aspects of embodiments of the present disclosure herein relate to an organic electroluminescence device.

2. Description of the Related Art

As an image display device, the development of an organic electroluminescence device is being actively conducted. The organic electroluminescence device is a self-luminescent display device in which holes and electrons injected from a first electrode and a second electrode recombine in an emission layer, and a light-emitting material, which is an organic compound included in the emission layer, emits light.

As the organic electroluminescence device, for example, an organic device may be composed of a first electrode, a hole transport layer on the first electrode, an emission layer on the hole transport layer, an electron transport layer on the emission layer, and a second electrode on the electron transport layer. Holes are injected from the first electrode, and the holes thus injected move through the hole transport layer and are injected into the emission layer. Meanwhile, electrons are injected from the second electrode, and the electrons thus injected move through the electron transport layer and are injected into the emission layer. Through the recombination of the holes and electrons injected into the emission layer, excitons are produced in the emission layer. The organic electroluminescence device emits light using light generated through the transition of the excitons back to a ground state.

In the application of an organic electroluminescence device to a display device, the increase of the life and efficiency of the organic electroluminescence device is required (or desired).

SUMMARY

One or more aspects of embodiments of the present disclosure are directed toward an organic electroluminescence device having high efficiency and long life.

An organic electroluminescence device according to an embodiment of the present disclosure may include a first electrode, a second electrode on the first electrode, and an emission layer between the first electrode and the second electrode. The emission layer may include host compounds and dopant compounds. The host compounds may include a first host compound represented by the following Formula 1, and a second host compound represented by the following Formula 2. The dopant compounds may include an assistant dopant compound represented by the following Formula 3 and a light-emitting dopant compound represented by the following Formula 4:

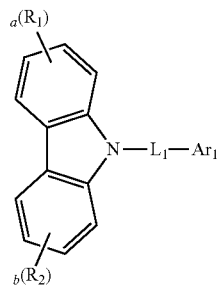

Formula 1

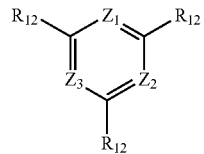

Formula 2

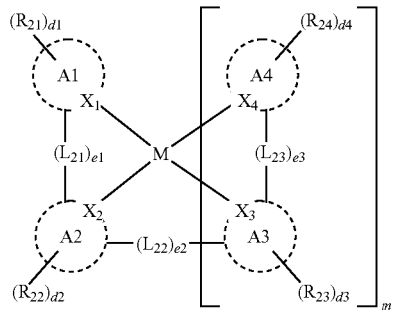

Formula 3

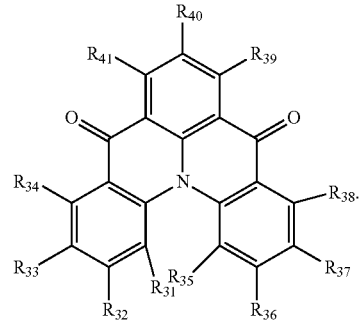

Formula 4

In Formula 1, $R_1$ and $R_2$ may be each independently a substituted or unsubstituted aryl group of 6 to 30 carbon atoms for forming a ring, or a substituted or unsubstituted heteroaryl group of 3 to 30 carbon atoms for forming a ring. $L_1$ may be a substituted or unsubstituted arylene group of 6 to 30 carbon atoms for forming a ring, or a substituted or unsubstituted heteroarylene group of 3 to 30 carbon atoms for forming a ring. $Ar_1$ may be a substituted or unsubstituted aryl group of 6 to 30 carbon atoms for forming a ring, or a substituted or unsubstituted heteroaryl group of 3 to 30 carbon atoms for forming a ring. "a" and "b" may be each independently an integer of 0 to 4.

In Formula 2, $Z_1$ to $Z_3$ may each independently be $CR_{11}$, or N. One or more $R_{11}$ and a plurality of $R_{12}$ may be each independently a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring.

In Formula 3, A1 to A4 may be each independently a substituted or unsubstituted aryl group of 6 to 30 carbon atoms for forming a ring, or a substituted or unsubstituted heteroaryl group of 1 to 30 carbon atoms for forming a ring. $X_1$ to $X_4$ may be each independently C or N. $R_{21}$ to $R_{24}$ may be each independently a hydrogen atom, a deuterium atom, a halogen atom, a cyano group, a substituted or unsubstituted amine group, a substituted or unsubstituted alkyl group of 1 o 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{21}$ to $R_{24}$ may be optionally combined with an adjacent group to form a ring. d1 to d4 may be each independently an integer of 0 to 4. $L_{21}$ to $L_{23}$ may be each independently a direct linkage,

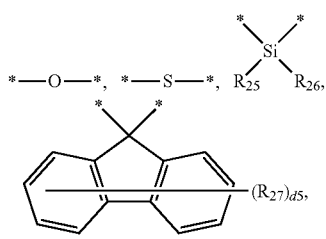

a substituted or unsubstituted divalent alkyl group of 1 to 20 carbon atoms, a substituted or unsubstituted arylene group of 6 to 30 carbon atoms for forming a ring, or a substituted or unsubstituted heteroarylene group of 2 to 30 carbon atoms for forming a ring. $R_{25}$ to $R_{27}$ may be each independently a substituted or unsubstituted alkyl group of 1 to 20 carbon atoms, a substituted or unsubstituted aryl group of 6 to 30 carbon atoms for forming a ring, or a substituted or unsubstituted heteroaryl group of 3 to 30 carbon atoms for forming a ring, and any of $R_{25}$ to $R_{27}$ may be combined with an adjacent group to form a ring. d5 may be an integer of 0 to 8. M may be platinum, palladium, copper, osmium, iridium, rubidium, or rhodium. e1 to e3 may be each independently 0 or 1. "m" may be 1 or 2. When M is platinum, palladium, copper or osmium, "m" may be 1. When M is iridium, rubidium, or rhodium, "m" may be 2, and e2 may be 0.

In Formula 4, $R_{31}$ to $R_{41}$ may be each independently a hydrogen atom, a deuterium atom, a halogen atom, a substituted or unsubstituted silyl group, a substituted or unsubstituted amine group, a substituted or unsubstituted carbonyl group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 3 to 30 carbon atoms for forming a ring.

In an embodiment, $L_1$ may be a substituted or unsubstituted phenylene group, a substituted or unsubstituted divalent biphenyl group, or a substituted or unsubstituted carbazolene group.

In an embodiment, $Ar_1$ may be a substituted or unsubstituted carbazole group, a substituted or unsubstituted dibenzofuran group, a substituted or unsubstituted dibenzothiophene group, or a substituted or unsubstituted biphenyl group.

In an embodiment, Formula 2 may be represented by the following Formula 2-1:

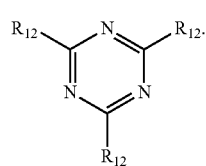

Formula 2-1

In Formula 2-1, a plurality of $R_{12}$ may be each independently a substituted or unsubstituted aryl group of 6 to 30 carbon atoms for forming a ring, or a substituted or unsubstituted heteroaryl group of 3 to 30 carbon atoms for forming a ring.

In an embodiment, Formula 2 may be represented by the following Formula 2-2:

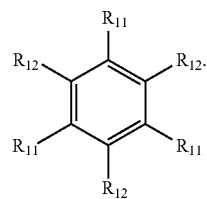

Formula 2-2

In Formula 2-2, one or more $R_{11}$, and a plurality of $R_{12}$ may be each independently a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring. At least one among the plurality of $R_{11}$, and the plurality of $R_{12}$ may be a cyano group, an aryl group of 6 to 30 carbon atoms that includes at least one cyano group as a substituent, or a heteroaryl group of 3 to 20 carbon atoms for forming a ring that includes at least one cyano group as a substituent.

In an embodiment, Formula 3 may be represented by the following Formula 3-1

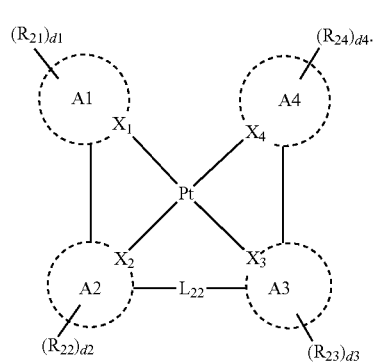

Formula 3-1

In Formula 3-1, A1 to A4, $X_1$ to $X_4$, $R_{21}$ to $R_{24}$, d1 to d4, and $L_{22}$ may be the same as defined in Formula 3.

In an embodiment, A1 to A4 may be each independently represented by any one among the following Structures 1-1 to 1-3:

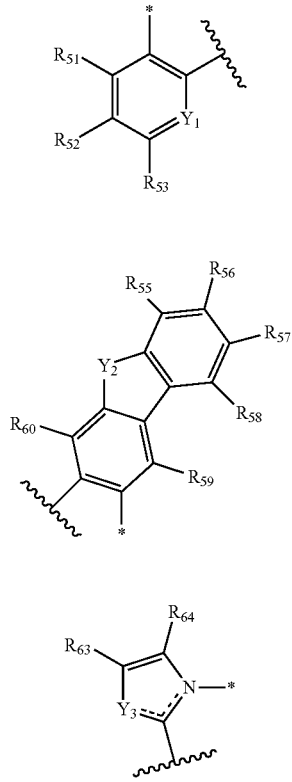

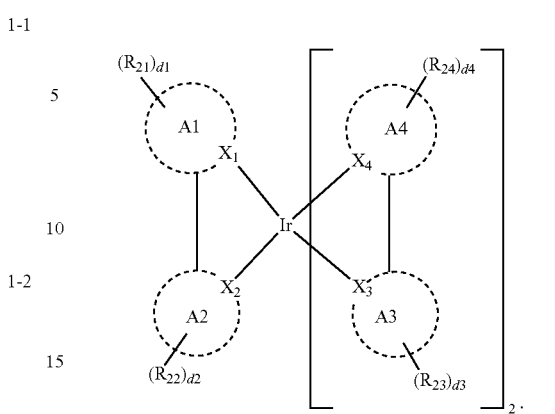

In Structures 1-1 to 1-3, $Y_1$ may be

or $CR_{54}$, $Y_2$ may be

or $NR_{61}$, $Y_3$ may be

or $NR_{62}$. $R_{51}$ to $R_{64}$ may be each independently a substituted or unsubstituted alkyl group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, and any of $R_{51}$ to $R_{64}$ may be combined with an adjacent group to form a ring.

In an embodiment, Formula 3 may be represented by the following Formula 3-2:

In Formula 3-2, A1 to A4, $X_1$ to $X_4$, $R_{21}$ to $R_{24}$, and d1 to d4 may be the same as defined in Formula 3.

In an embodiment, A1 to A4 may be each independently represented by the following Structures 2-1, or 2-2:

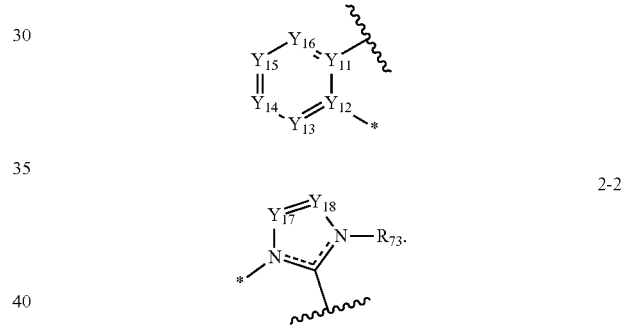

In Structure 2-1, $Y_{11}$, and $Y_{12}$ may be each independently C or N. $Y_{13}$ to $Y_{16}$ may be each independently N or $CR_{71}$. One or more $R_{71}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 1 to 30 carbon atoms for forming a ring, and $R_{71}$ may be combined with an adjacent group to form a ring.

In Structure 2-2, $Y_{17}$ and $Y_{18}$ may each independently be N or $CR_{72}$. $R_{72}$ and $R_{73}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{72}$ and $R_{73}$ may be combined with an adjacent group to form a ring.

In an embodiment, Formula 4 may be represented by the following Formula 4-1:

Formula 4-1

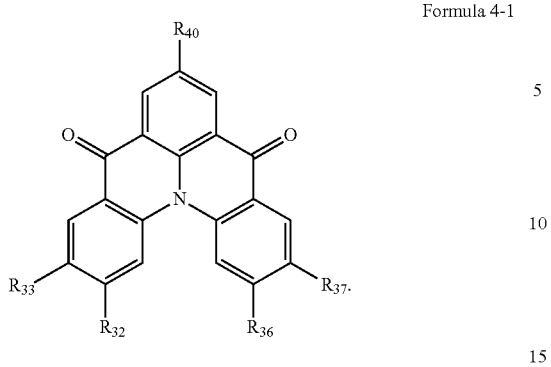

In Formula 4-1, $R_{32}$, $R_{33}$, $R_{36}$, $R_{37}$, and $R_{40}$ may be each independently a hydrogen atom, a deuterium atom, a halogen atom, a substituted or unsubstituted silyl group, a substituted or unsubstituted amine group, a substituted or unsubstituted carbonyl group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 3 to 30 carbon atoms for forming a ring. At least one among $R_{32}$, $R_{33}$, $R_{36}$, $R_{37}$, and $R_{40}$ may not be a hydrogen atom.

In an embodiment, the emission layer may emit blue light as delayed fluorescence.

In an embodiment, based on a total weight of the first host compound, the second host compound, the assistant dopant compound, and the light-emitting dopant compound, an amount of the assistant dopant compound may be from about 10 wt % to about 15 wt %, and an amount of the light-emitting dopant compound may be from about 1 wt % to about 5 wt %.

In an embodiment, based on a total weight of the host compounds, a weight ratio of the first host compound to the second host compound may be from about 7:3 to about 3:7.

In an embodiment, the first host compound may include at least one among compounds represented in the following Compound Group 1:

Compound Group 1

HT-01

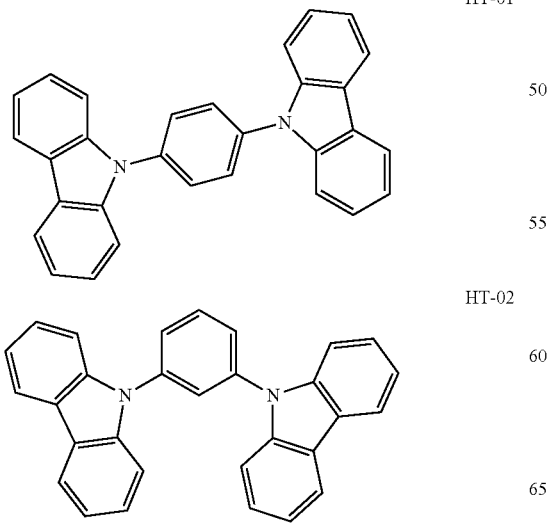

HT-02

HT-03

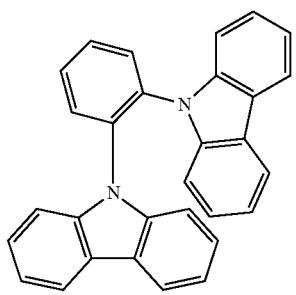

HT-04

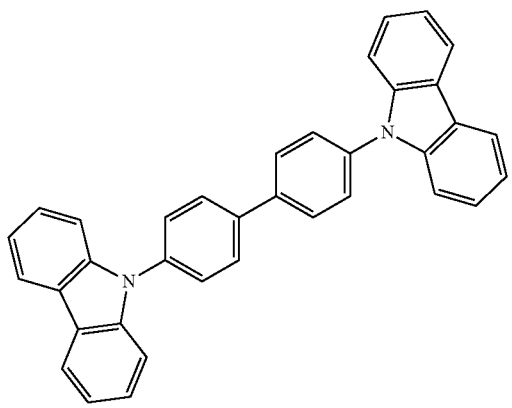

HT-05

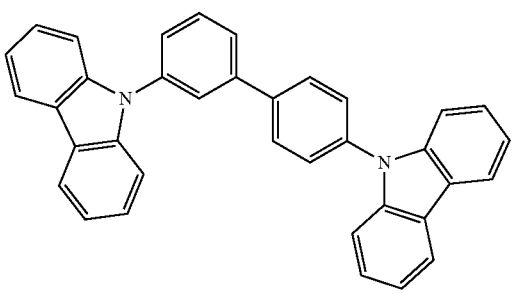

HT-06

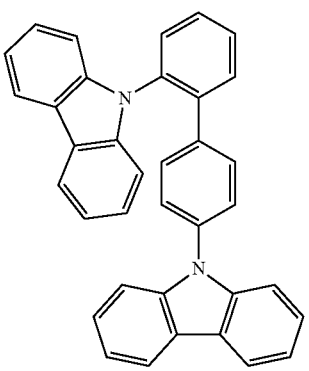

HT-07
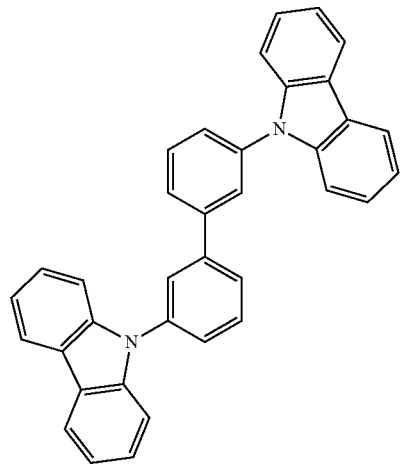
HT-08
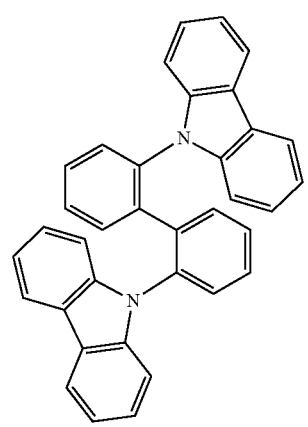
HT-09
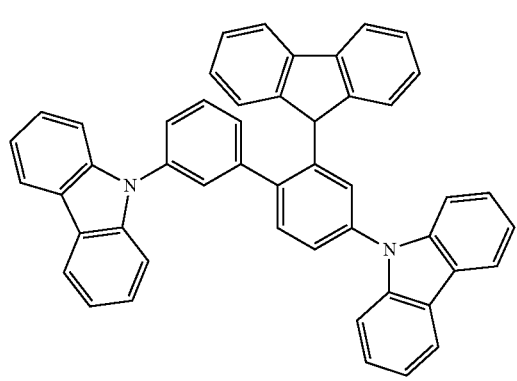
HT-10
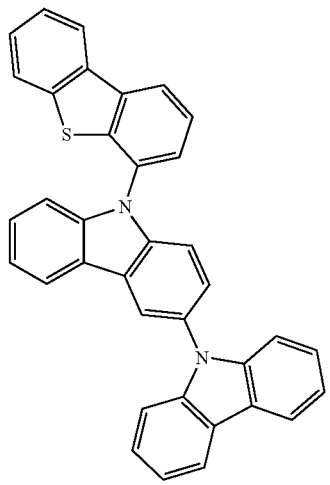
HT-11
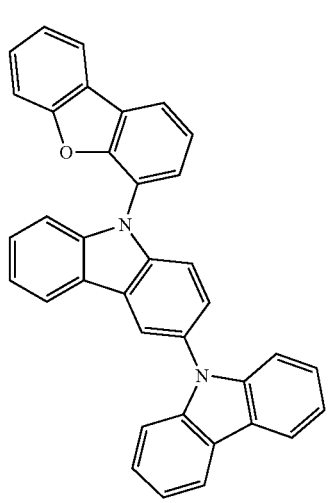
HT-12
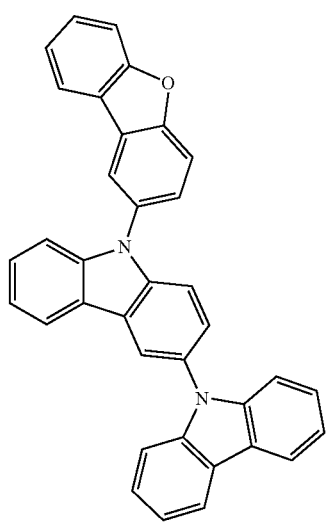

HT-13
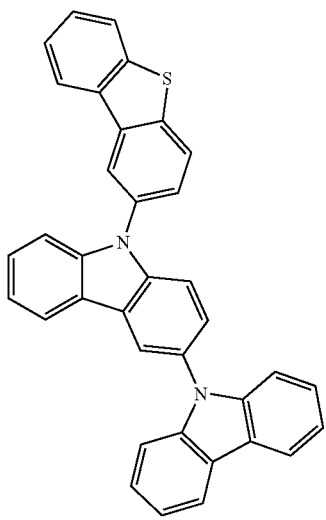
HT-14
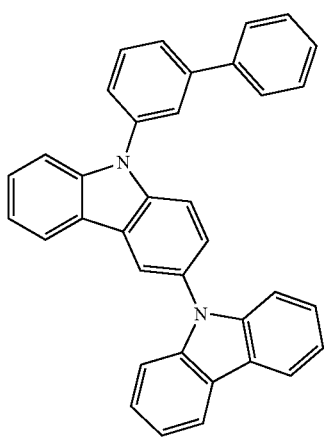
HT-15
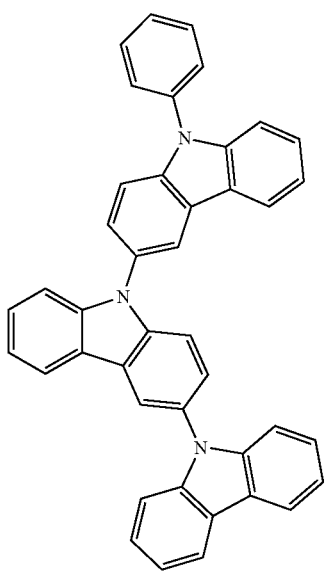
HT-16
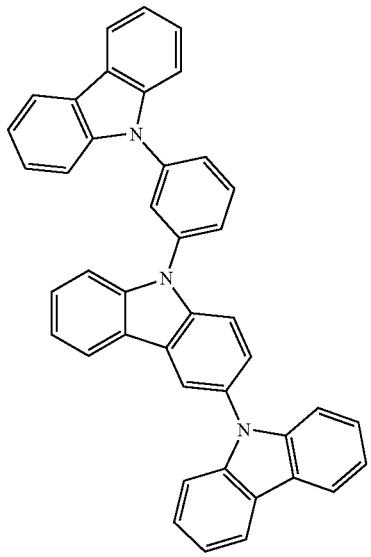
HT-17
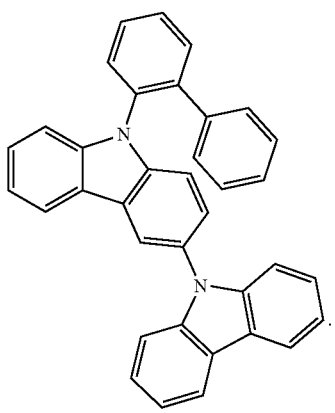
In an embodiment, the second host compound may include at least one among compounds represented in the following Compound Group 2-1:
Compound Group 2-1
ET1-1
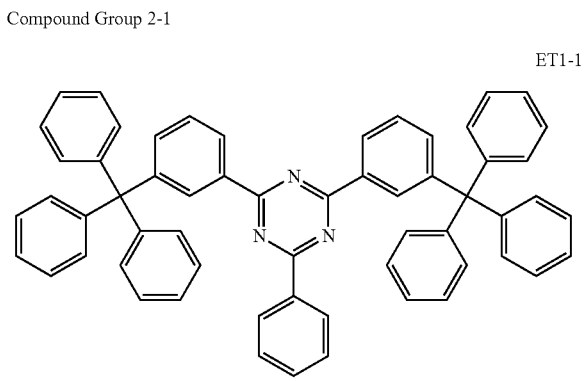

-continued
ET1-2
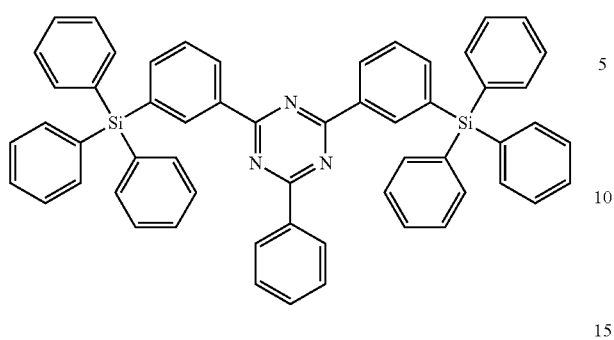
ET1-3
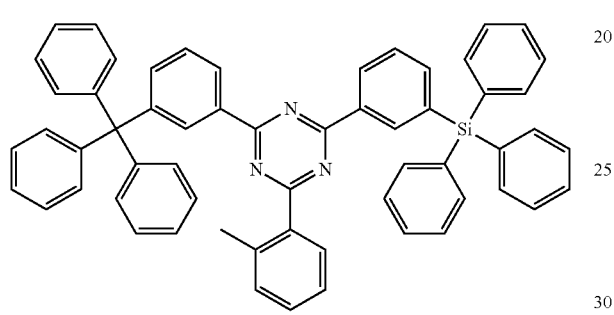
ET1-4
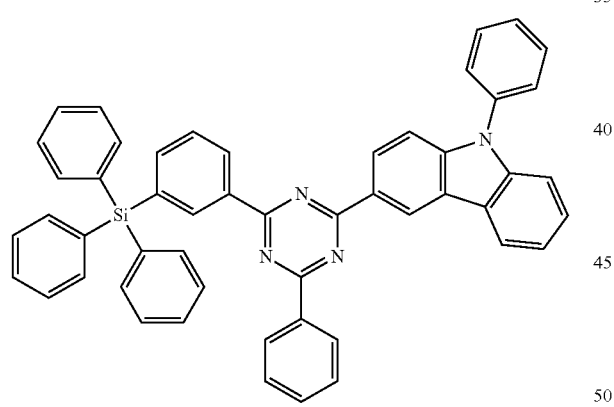
ET1-5
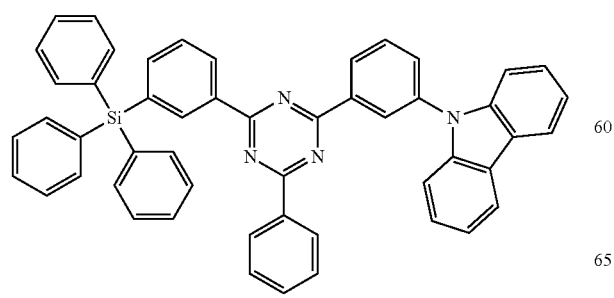
ET1-6
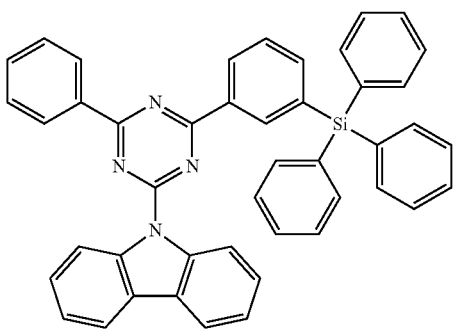
ET1-7
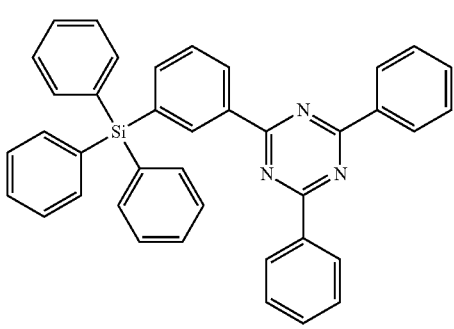
ET1-8
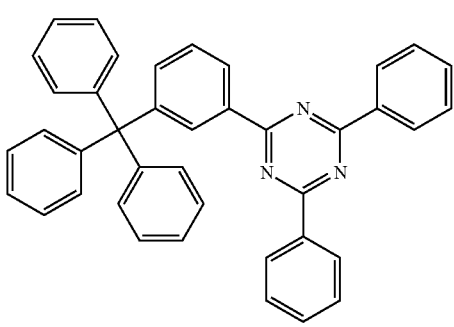
ET1-9

ET1-10
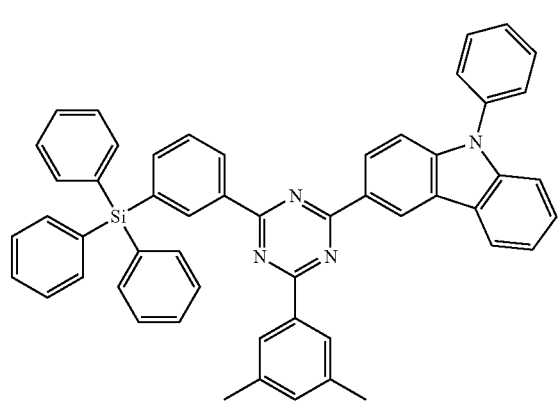
ET1-11
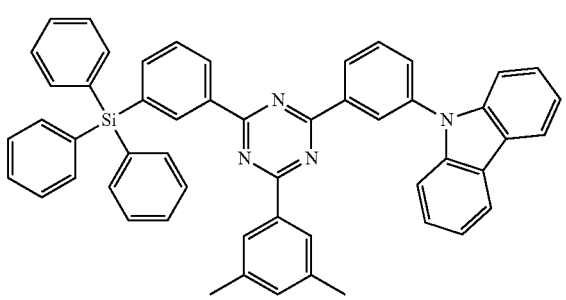
ET1-12
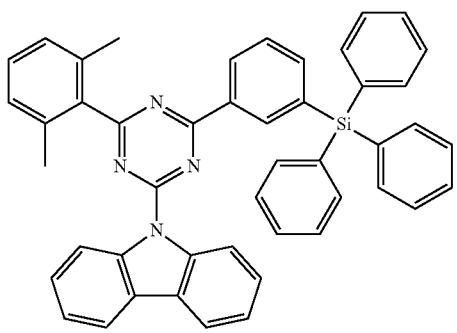
ET1-13
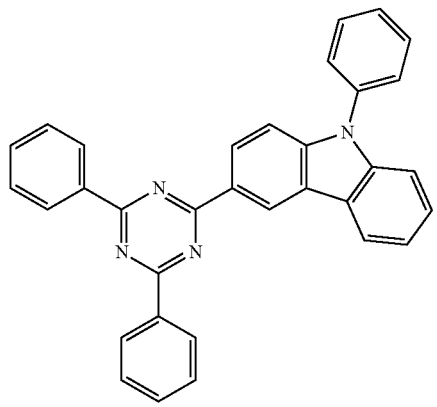
ET1-14
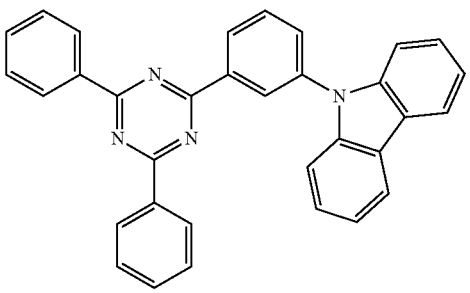
ET1-15
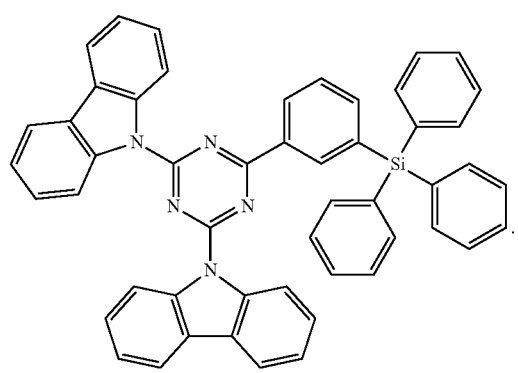
In an embodiment, the second host compound may include at least one among compounds represented in the following Compound Group 2-2:
Compound Group 2-2
ET2-1
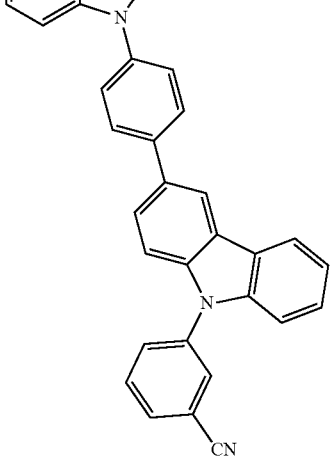

ET2-2
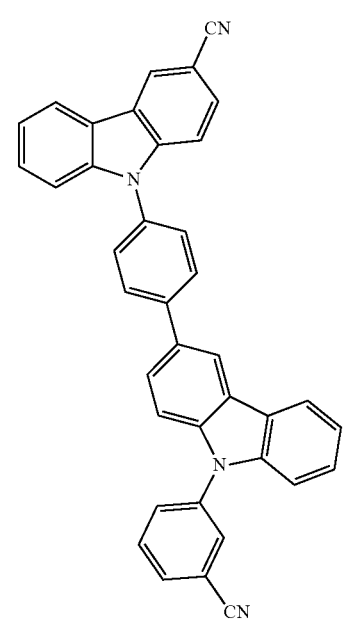
ET2-3
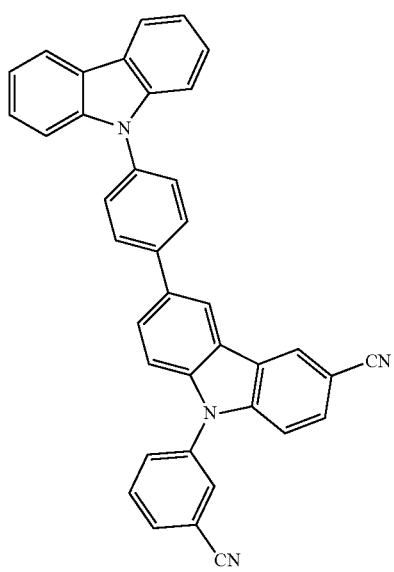
ET2-4
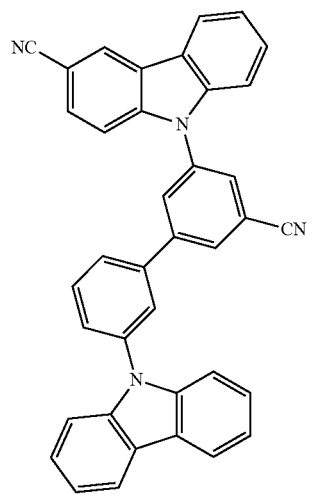
ET2-5
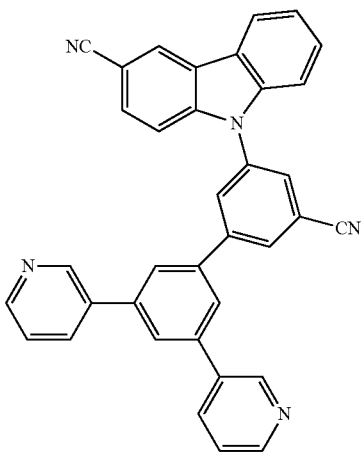
ET2-6
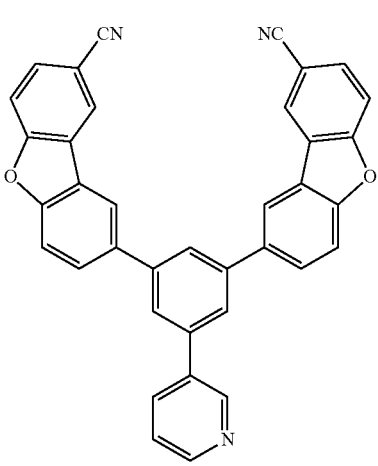
ET2-7
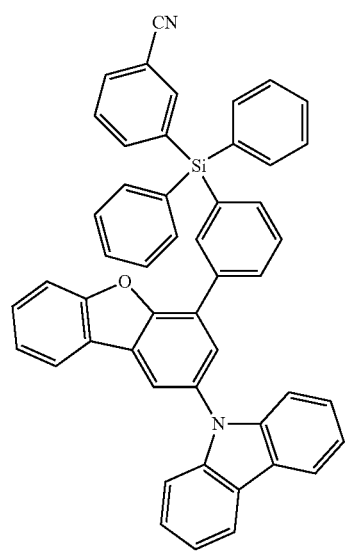

ET2-8
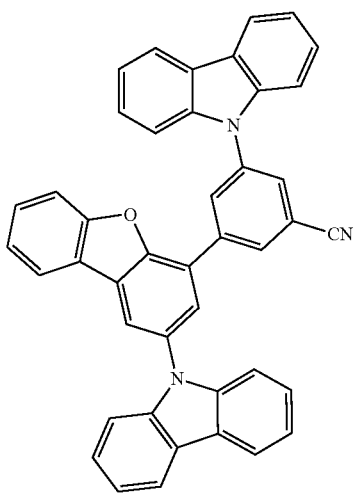
ET2-11
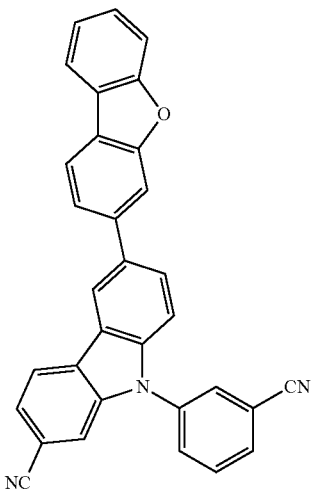
ET2-9
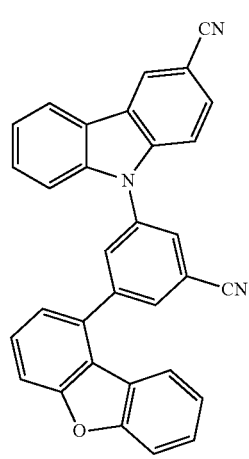
ET2-12
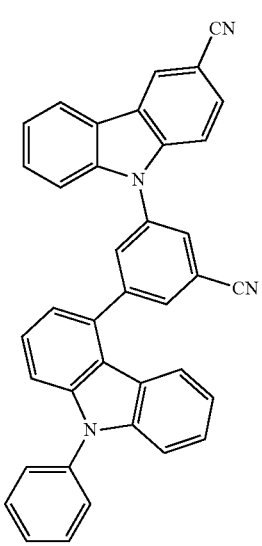
ET2-10
In an embodiment, the assistant dopant compound may include at least one among compounds represented in the following Compound Group 3-1:
Compound Group 3-1
D1-1
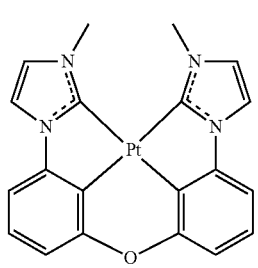

D1-2
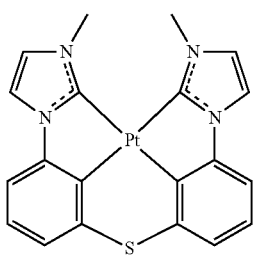
D1-3
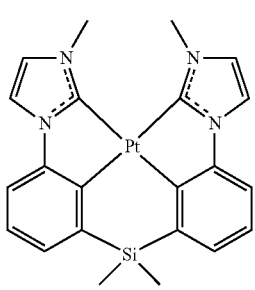
D1-4
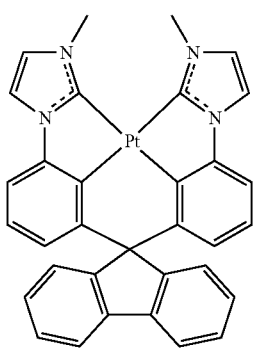
D1-5
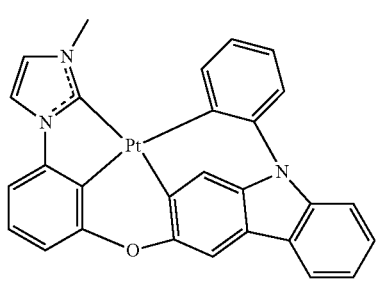
D1-6
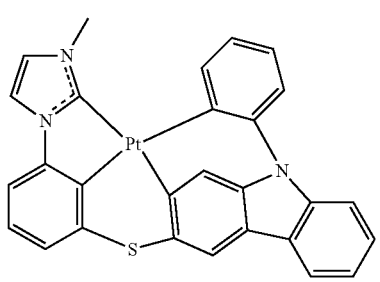
D1-7
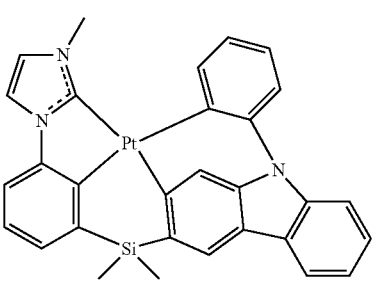
D1-8
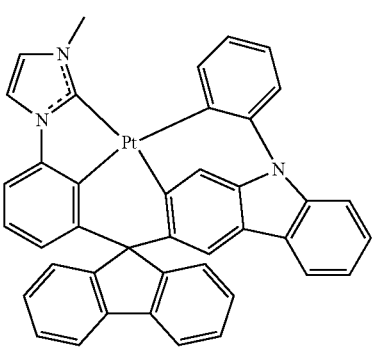
D1-9
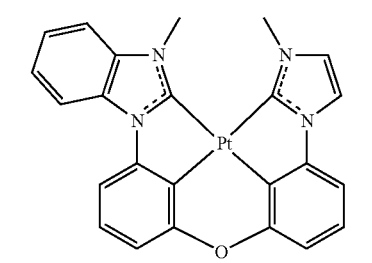
D1-10
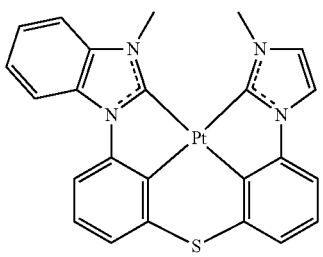
D1-11
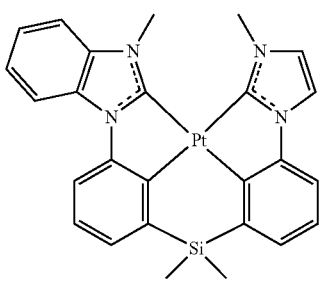

D1-12
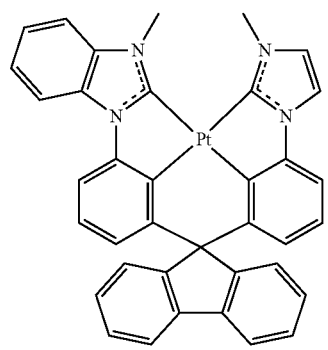
D1-13
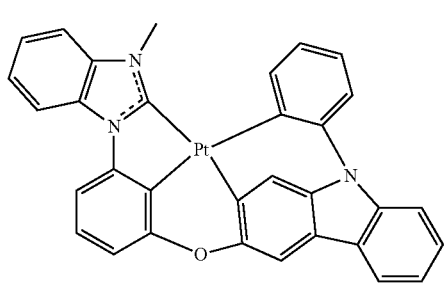
D1-14
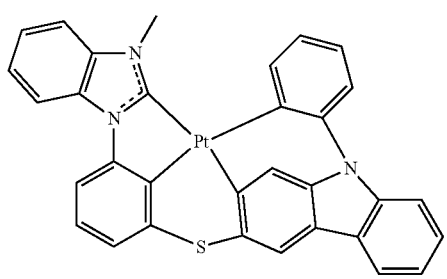
D1-15
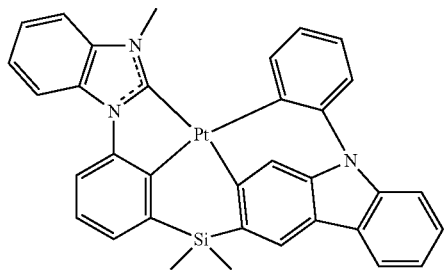
D1-16
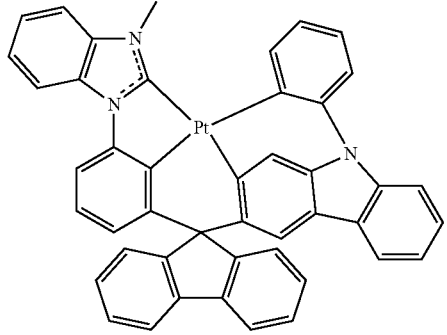
D1-17
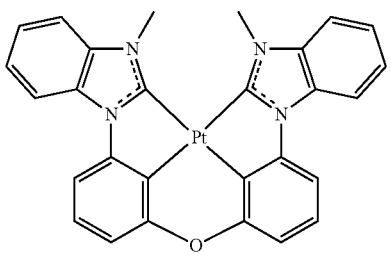
D1-18
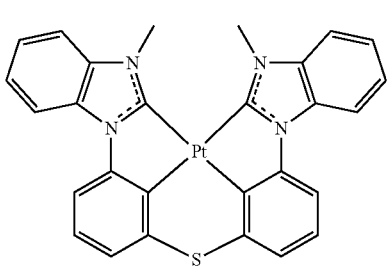
D1-19
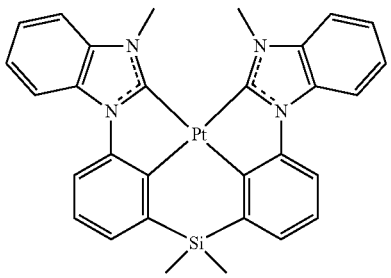
D1-20
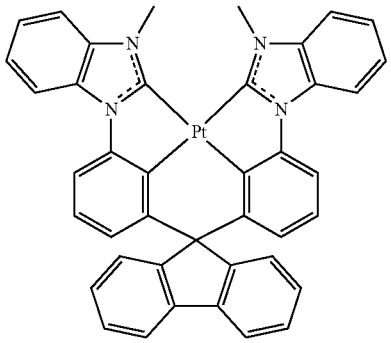
D1-21
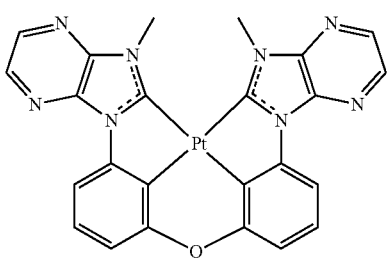

D1-22 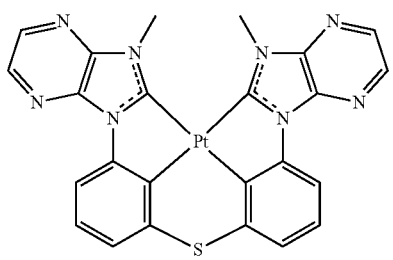
D1-23 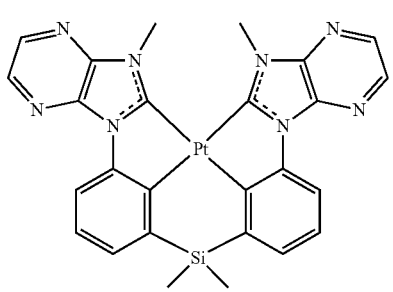
D1-24 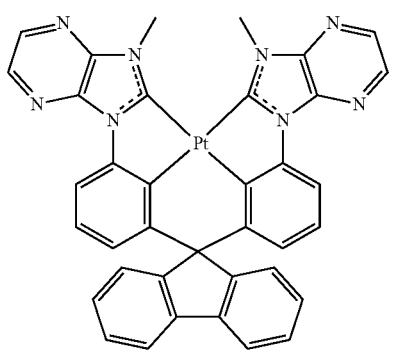
D1-25 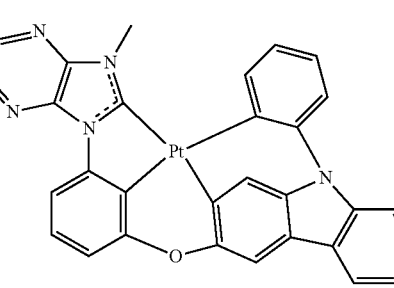
D1-26 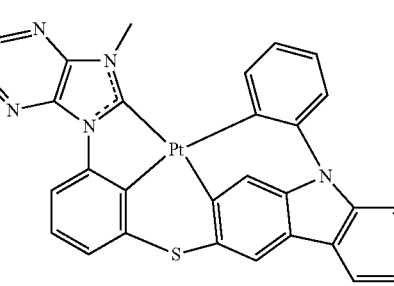
D1-27 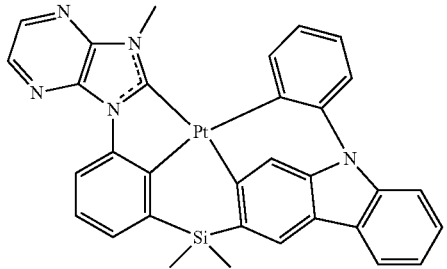
D1-28 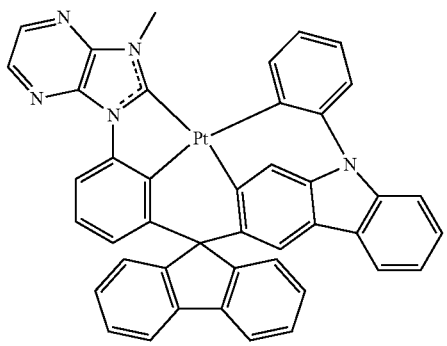
D1-29 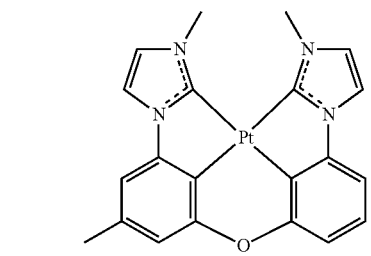
D1-30 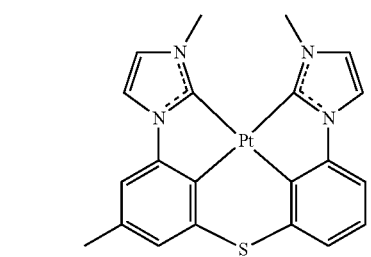
D1-31 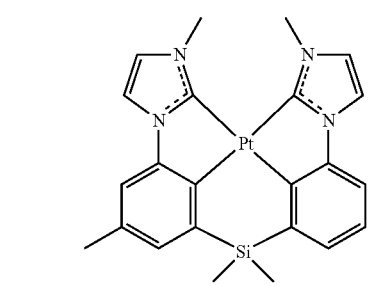

-continued
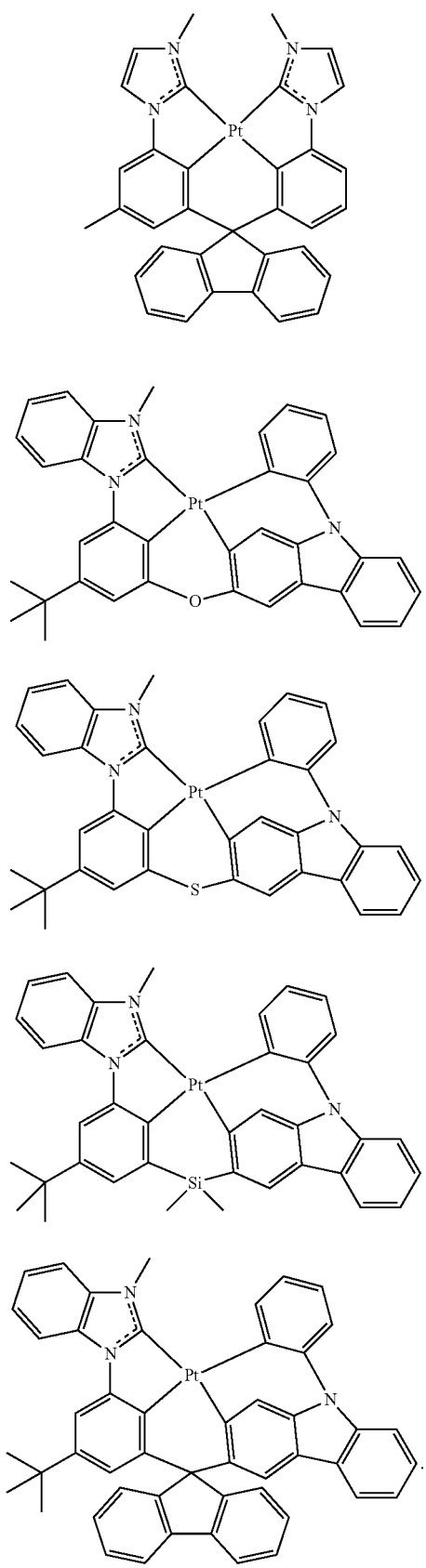
In an embodiment, the assistant dopant compound may include at least one among compounds represented in the following Compound Group 3-2:
Compound Group 3-2
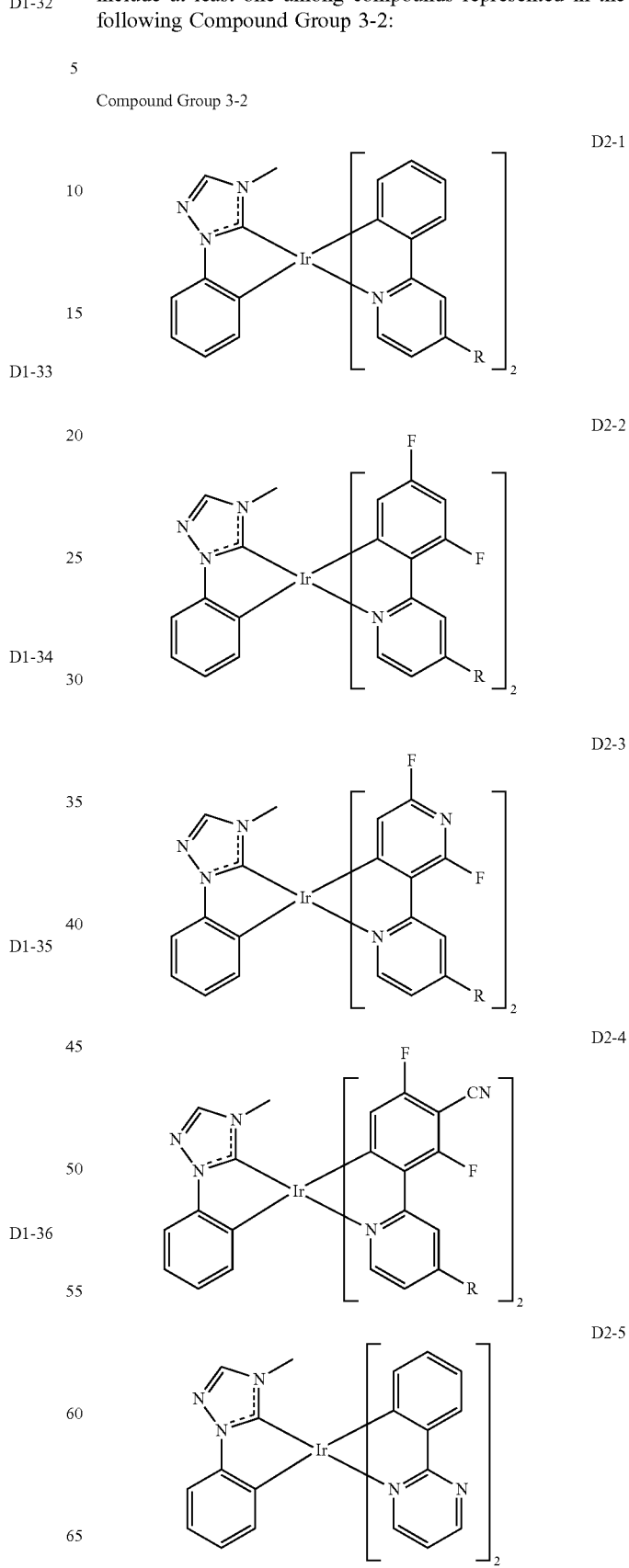

D2-6
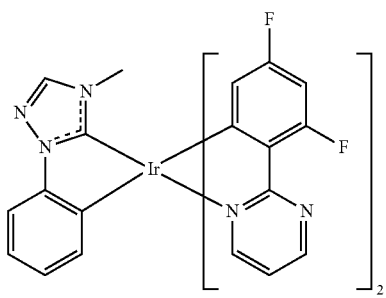
D2-7
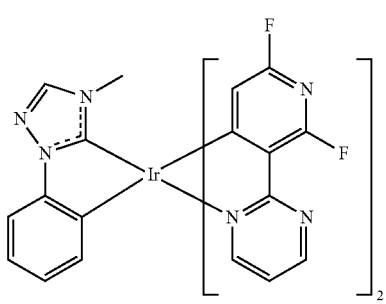
D2-8
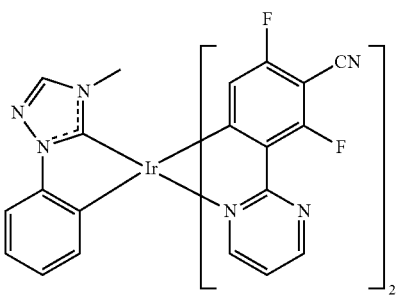
D2-9
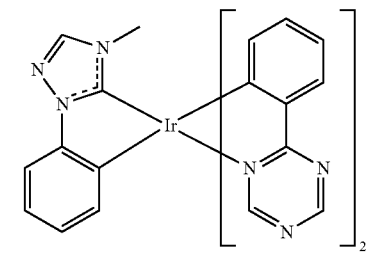
D2-10
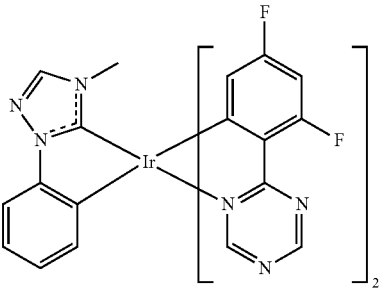
D2-11
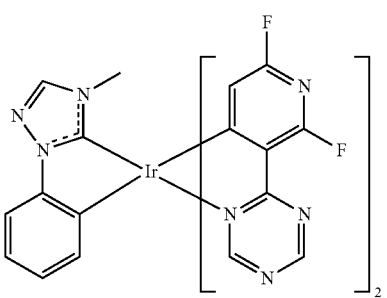
D2-12
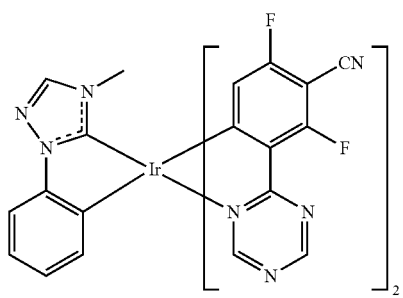
D2-13
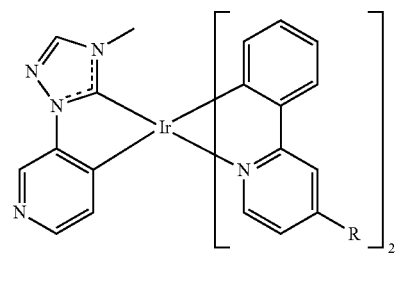
D2-14
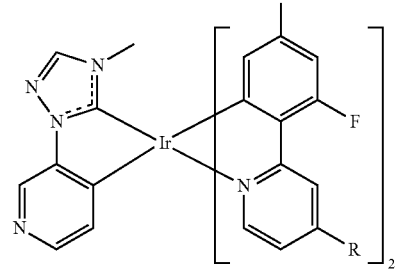
D2-15
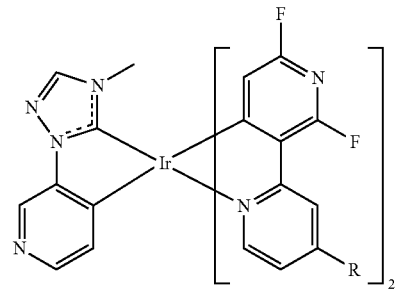

D2-16
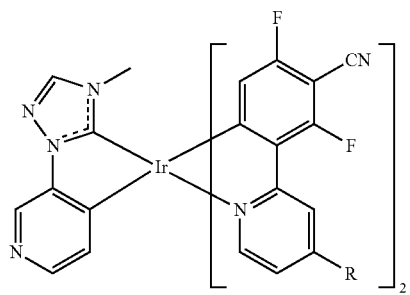
D2-17
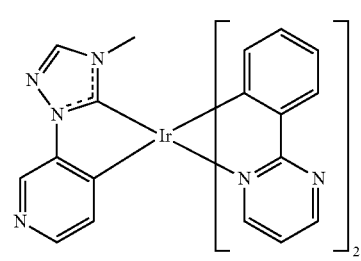
D2-18
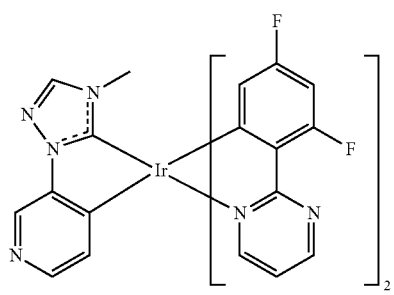
D2-19
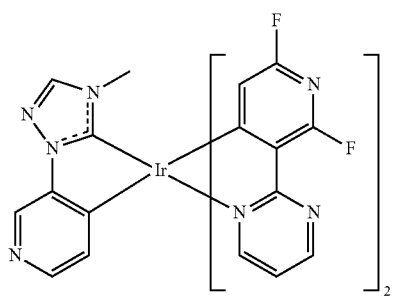
D2-20
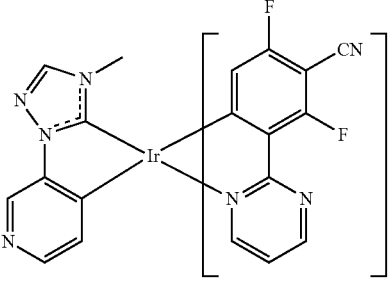
D2-21
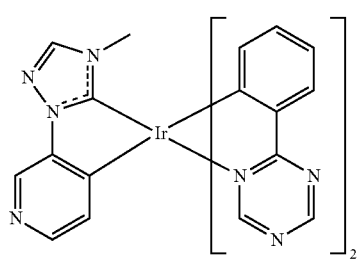
D2-22
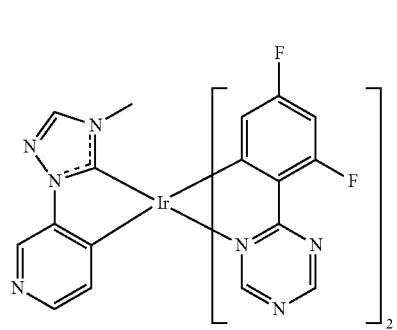
D2-23
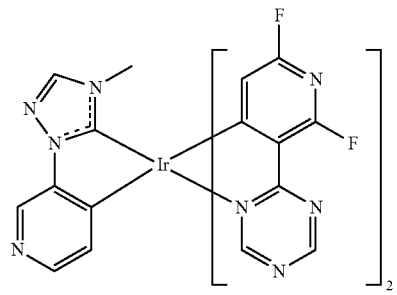
D2-24
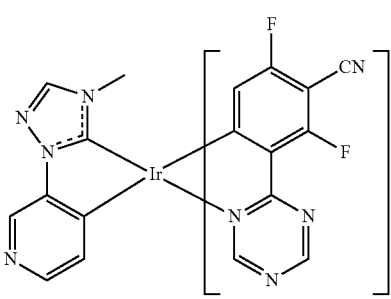
D2-25
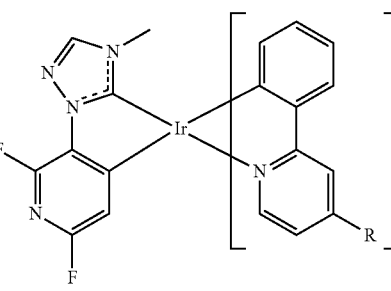

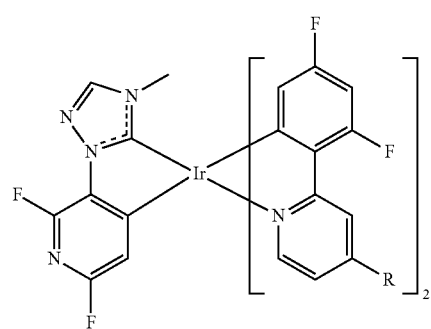
D2-26
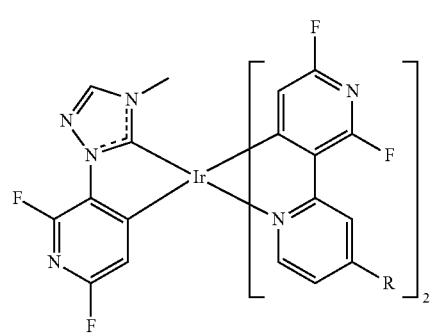
D2-27
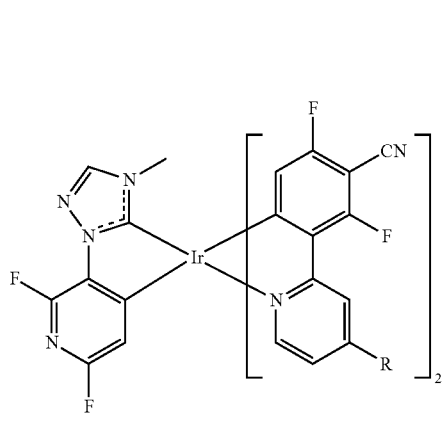
D2-28
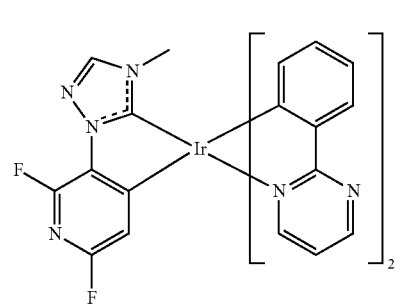
D2-29
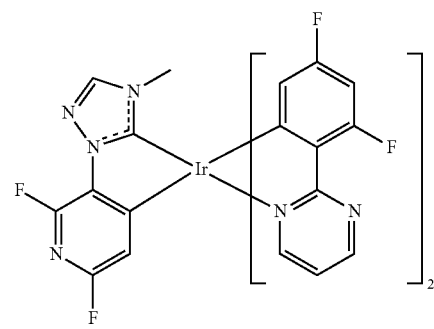
D2-30
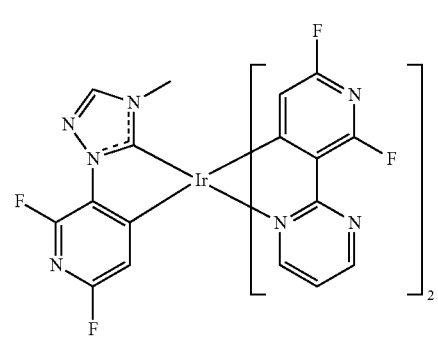
D2-31
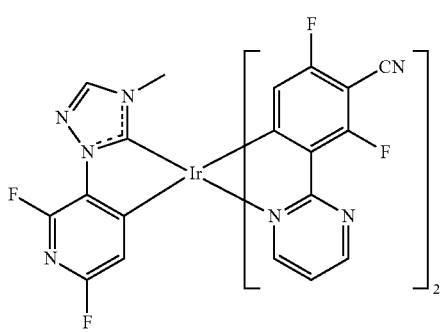
D2-32
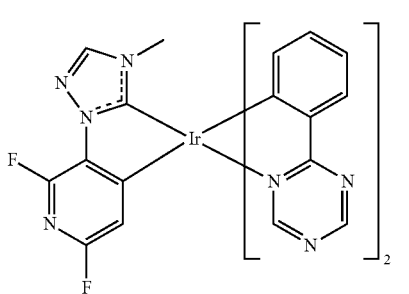
D2-33

D2-34
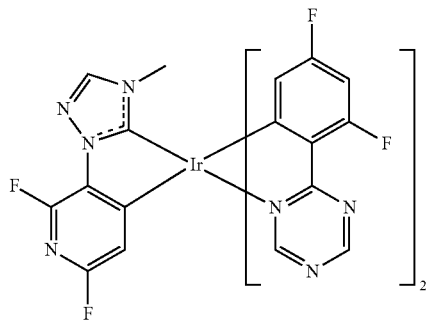
D2-35
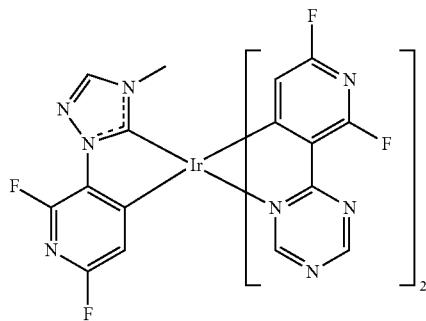
D2-36
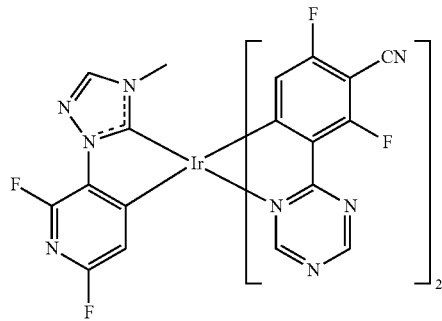
In Compounds D2-1 to D2-4, D2-13 to D2-16, and D2-25 to D2-28, one or more R may be each independently a hydrogen atom, a methyl group, an isopropyl group, a tert-butyl group, or a dimethylamine group.
In an embodiment, the light-emitting dopant compound may include at least one among compounds represented in the following Compound Group 4, and Formula 4-2:
Compound Group 4
D1
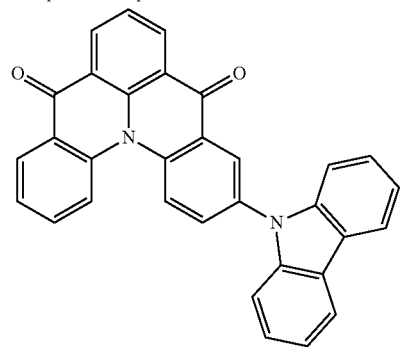
D2
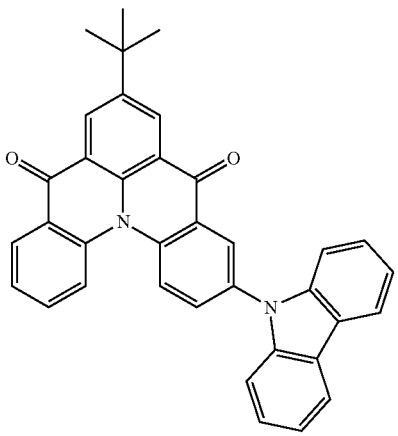
D3
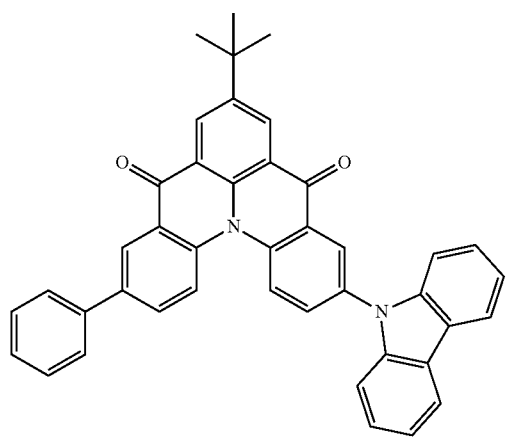
D4
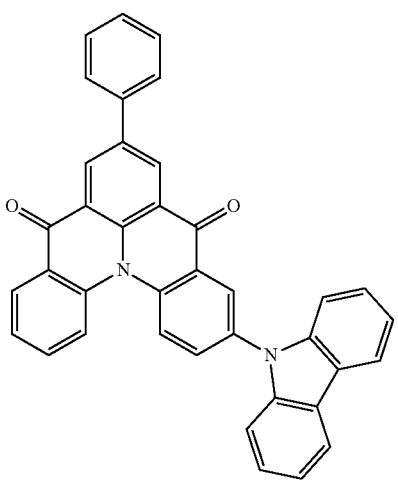

-continued
D5
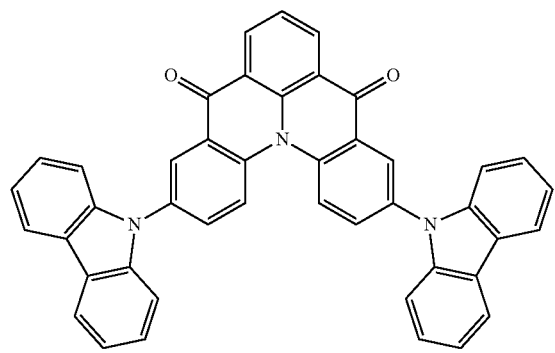
D6
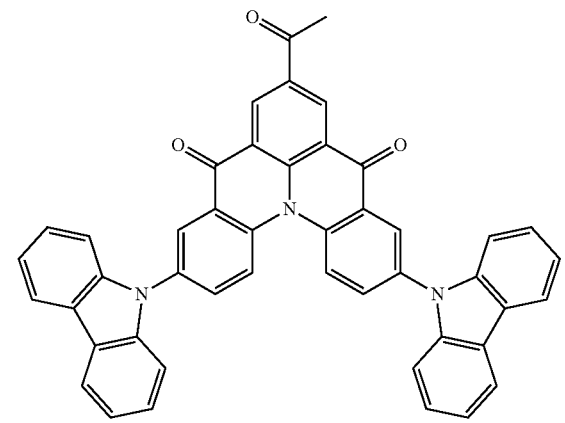
D7
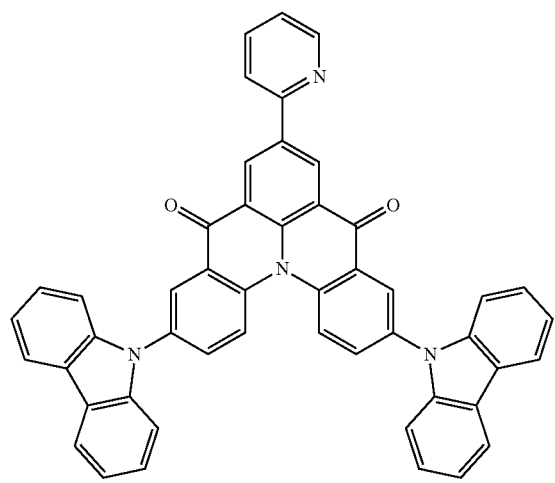
D8
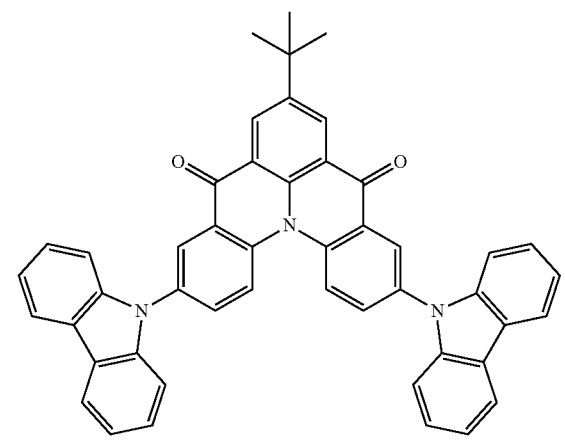
D9
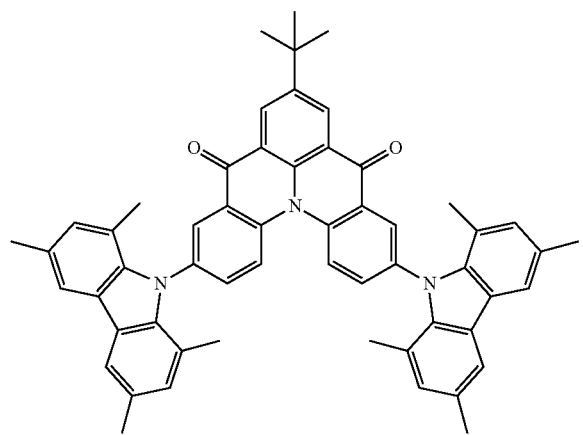
D10
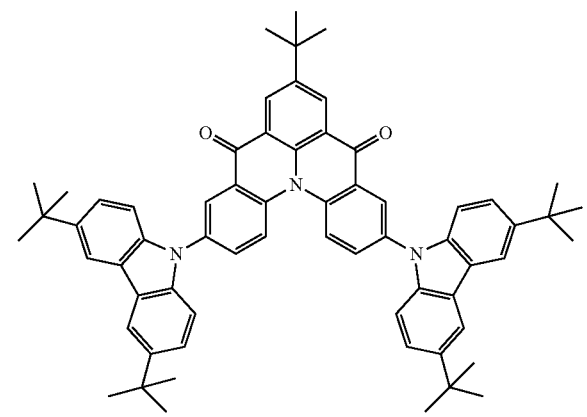

-continued
D11
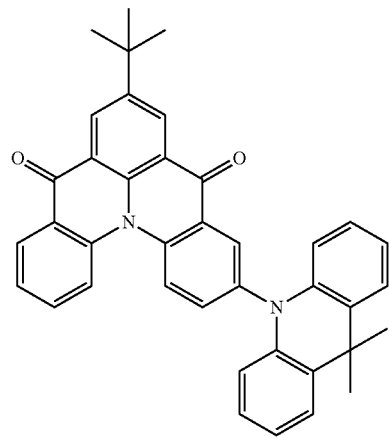
D12
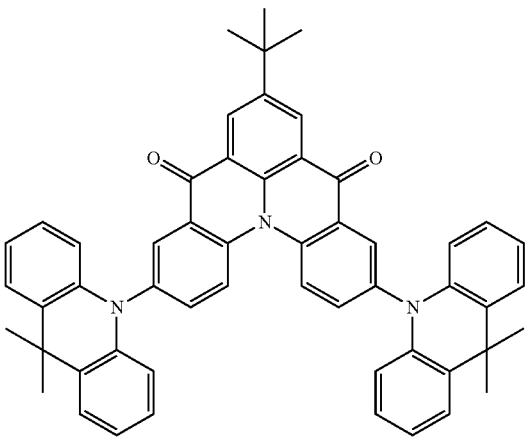
D13
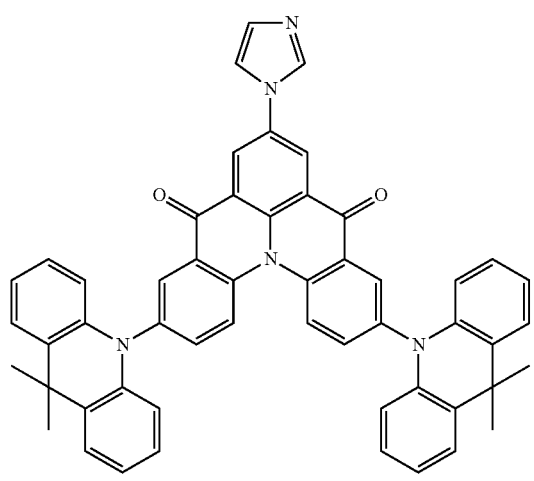
D14
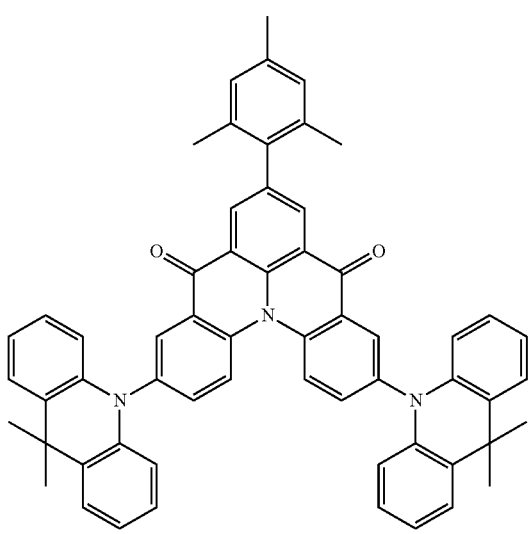
D15
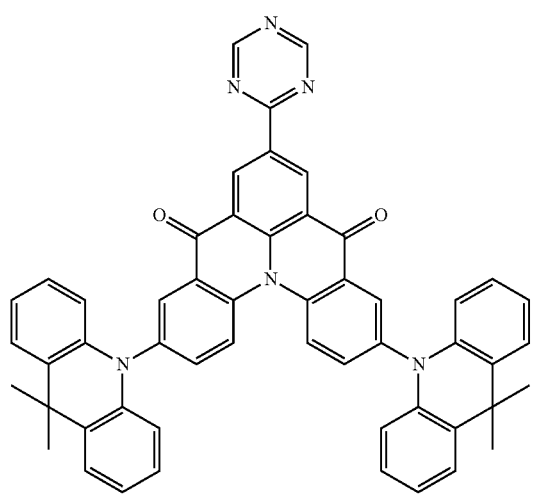
D16
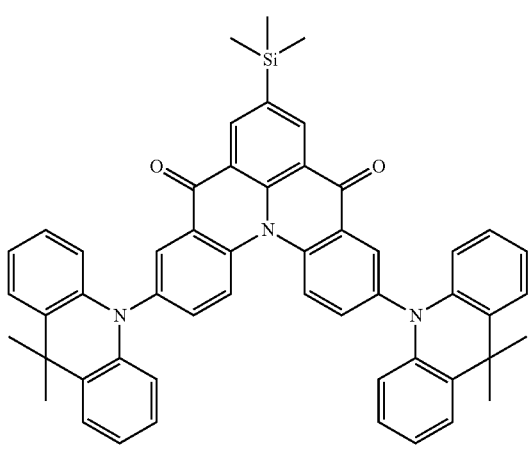

D17
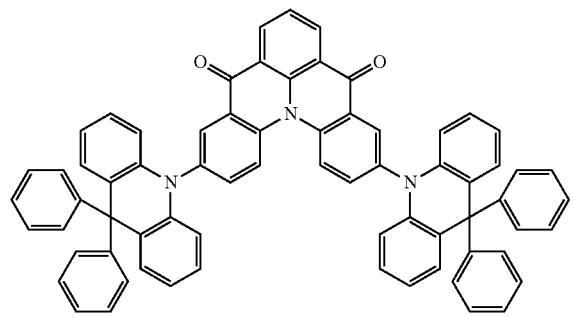
D18
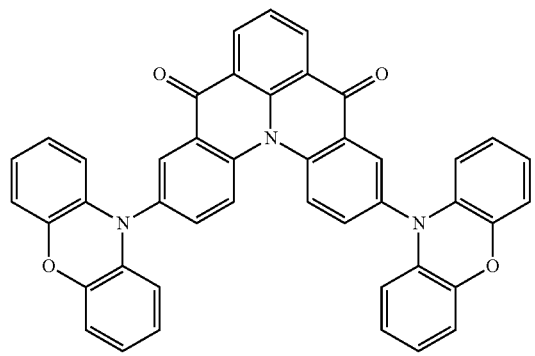
D19
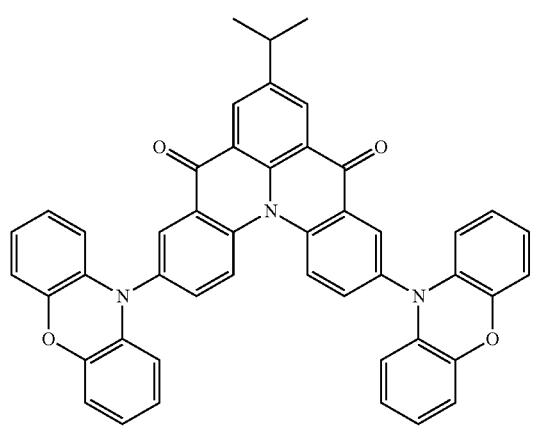
D20
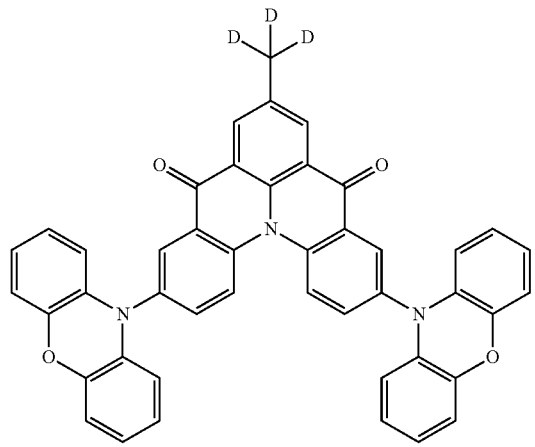
D21
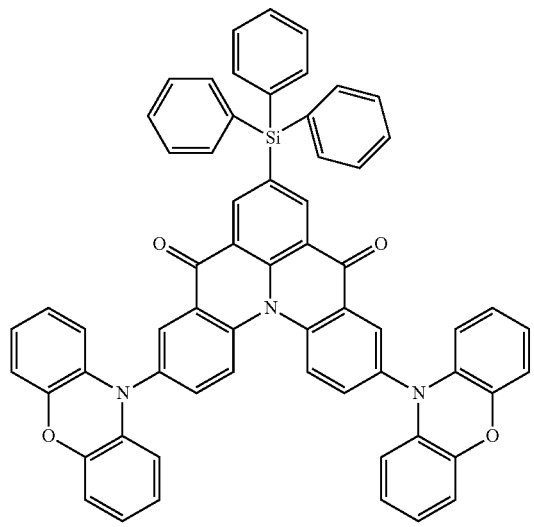
D22
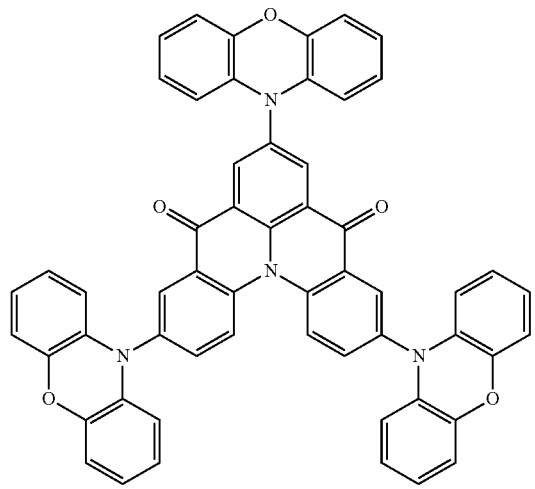

-continued
D23
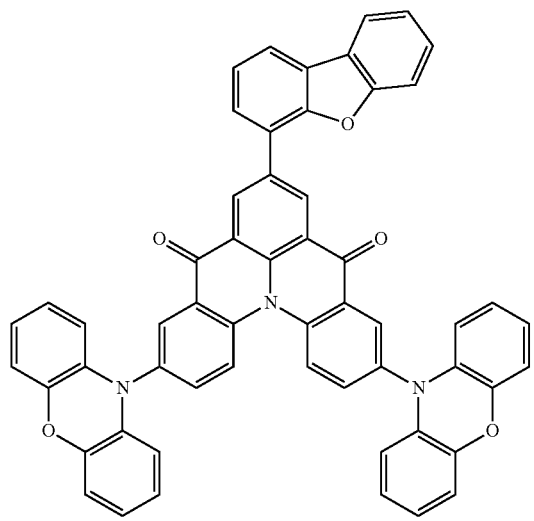
D24
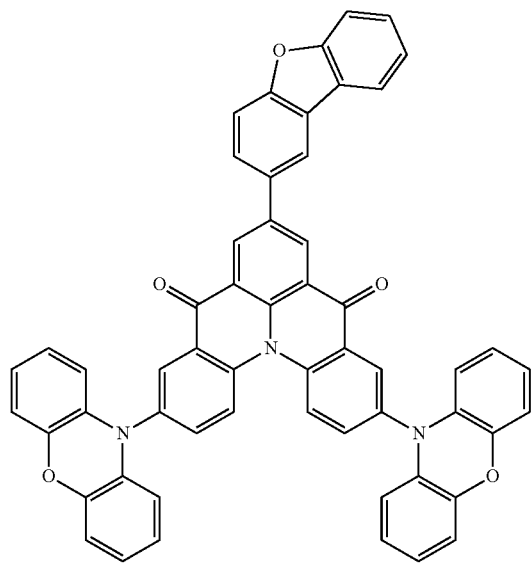
D25
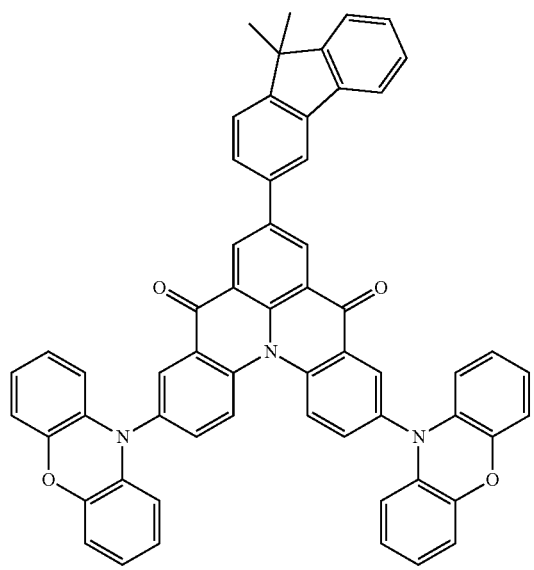
D26
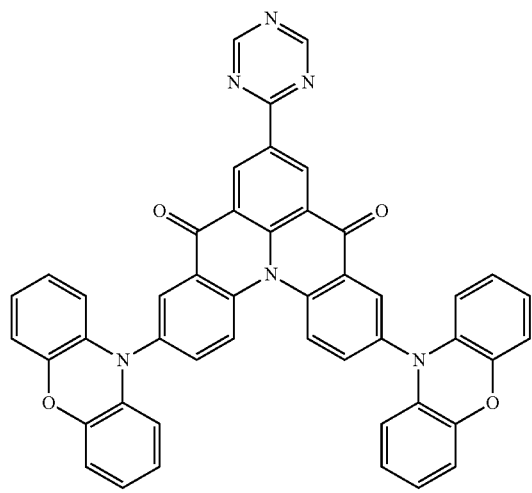
D27
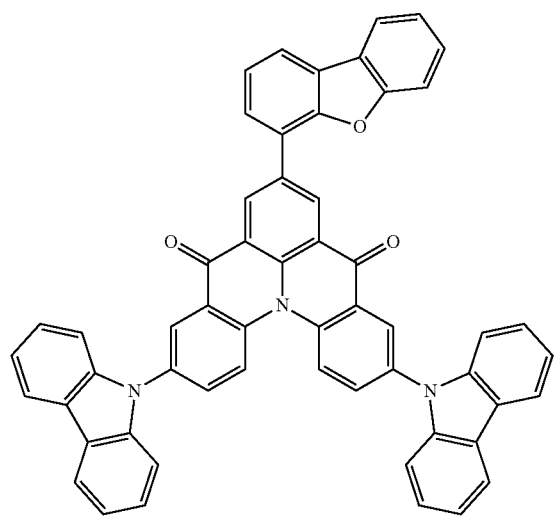
D28
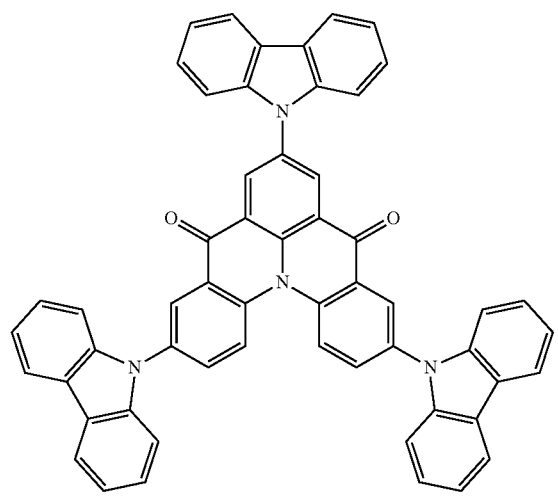

-continued
D29
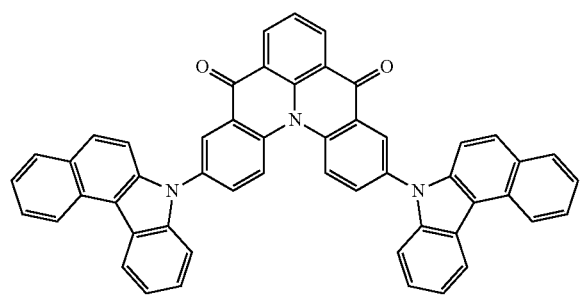
D30
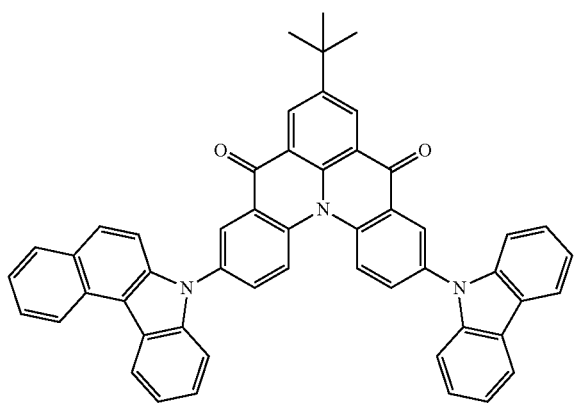
D31
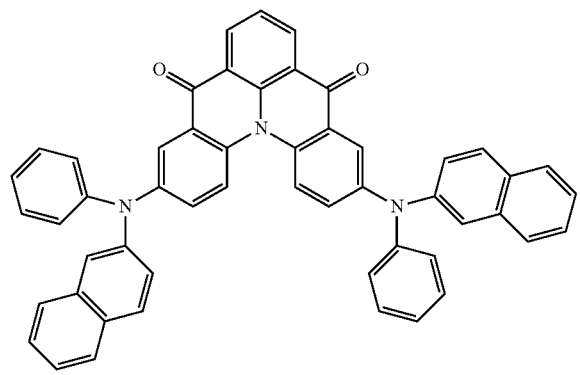
D32
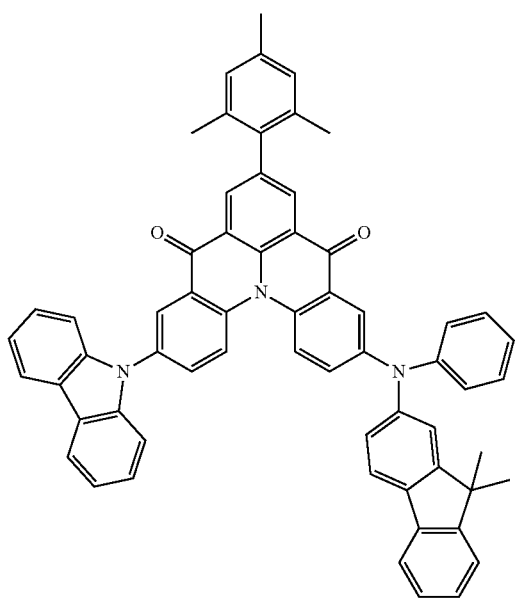
D33
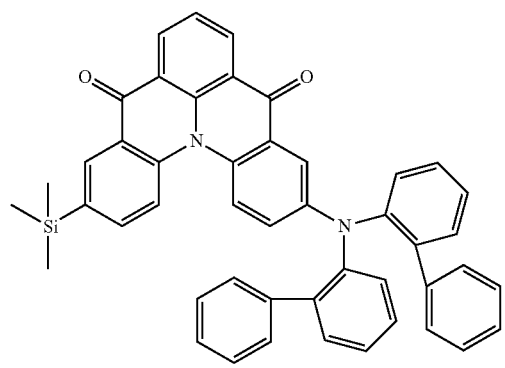
D34
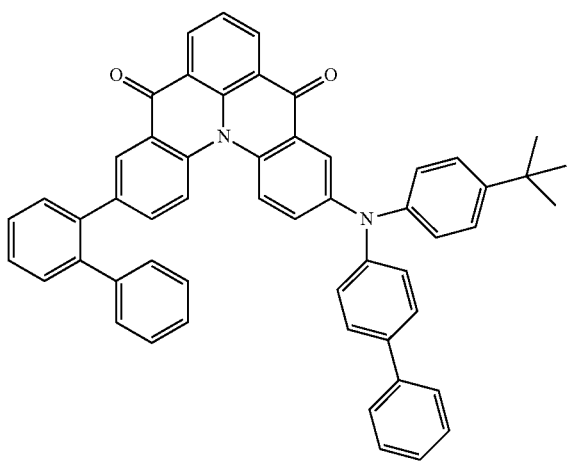

-continued
D35
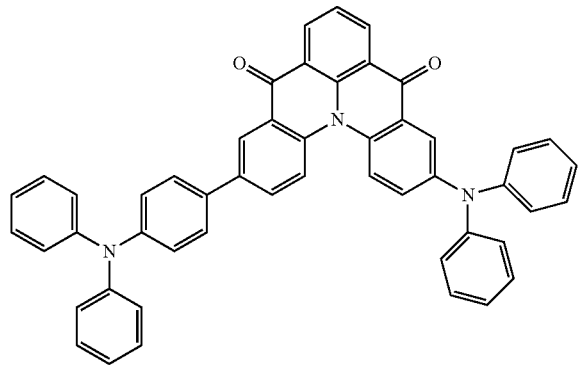
D36
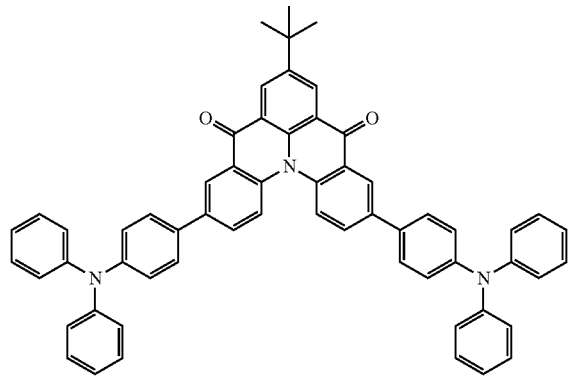
D37
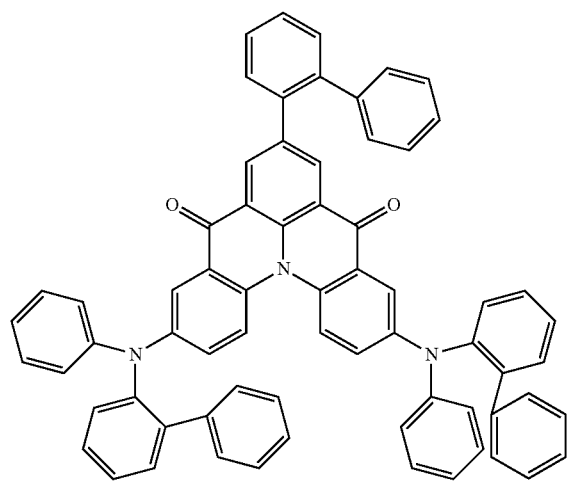
D38
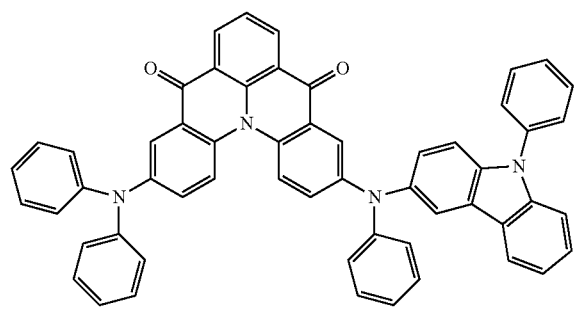
D39
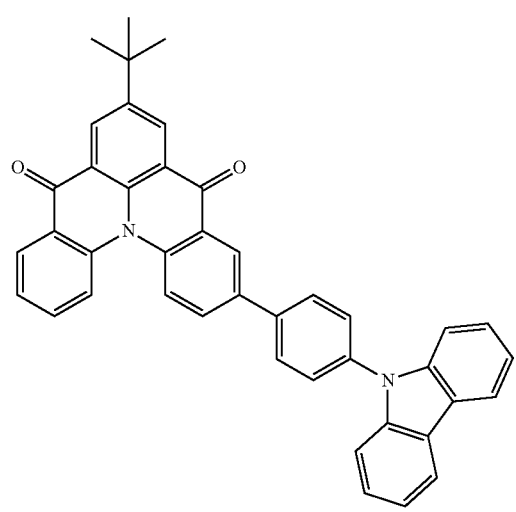

-continued

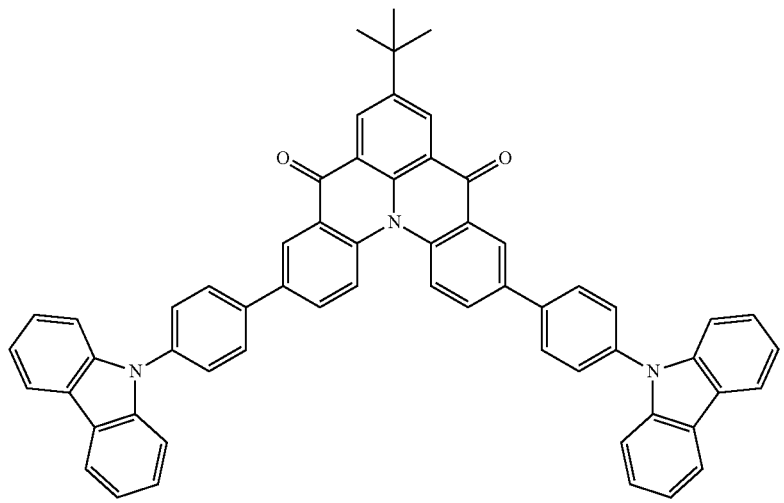

D40

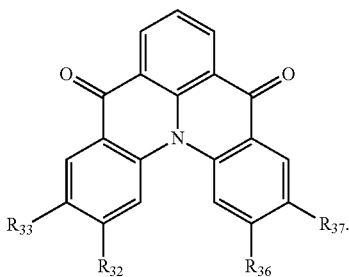

Formula 4-2

In Formula 4-2, $R_{32}$ and $R_{36}$ may be a hydrogen atom, and $R_{33}$ and $R_{37}$ may be each independently a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group.

In some embodiments, $R_{33}$ and $R_{37}$ may be a hydrogen atom, and $R_{32}$ and $R_{36}$ may be each independently a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group.

In an embodiment of the present disclosure, an organic electroluminescence device may include a first electrode, a second electrode on the first electrode, and an emission layer between the first electrode and the second electrode. The emission layer may include a first compound represented by Formula 1, a second compound represented by Formula 2, a third compound represented by Formula 3, and a fourth compound represented by Formula 4. Based on a total weight of the first to fourth compounds, an amount of the third compound may be from about 10 wt % to about 15 wt %, and an amount of the fourth compound may be from about 1 wt % to about 5 wt %. Formula 1 to Formula 4 may have the same structures as those of the above-described Formula 1 to Formula 4.

In an embodiment, a weight ratio of the first compound to the second compound may be from about 3:7 to about 7:3.

In an embodiment, the second compound may be represented by Formula 2-1, and the third compound may be represented by Formula 3-1. Formula 2-1 and Formula 3-1 may have the same structures as those of the above-described Formula 2-1 and Formula 3-1.

In an embodiment, the second compound may be represented by Formula 2-1, and the third compound may be represented by Formula 3-2. Formula 2-1 and Formula 3-2 may have the same structures as those of the above-described Formula 2-1 and Formula 3-2.

In an embodiment, the second compound may be represented by Formula 2-2, and the third compound may be represented by Formula 3-1. Formula 2-2 and Formula 3-1 may have the same structures as those of the above-described Formula 2-2 and Formula 3-1.

In an embodiment of the present disclosure, an organic electroluminescence device may include a first electrode, a second electrode on the first electrode, and an emission layer between the first electrode and the second electrode. The emission layer may include compounds represented by the above-described Formula 1 to Formula 4 and emit delayed fluorescence.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
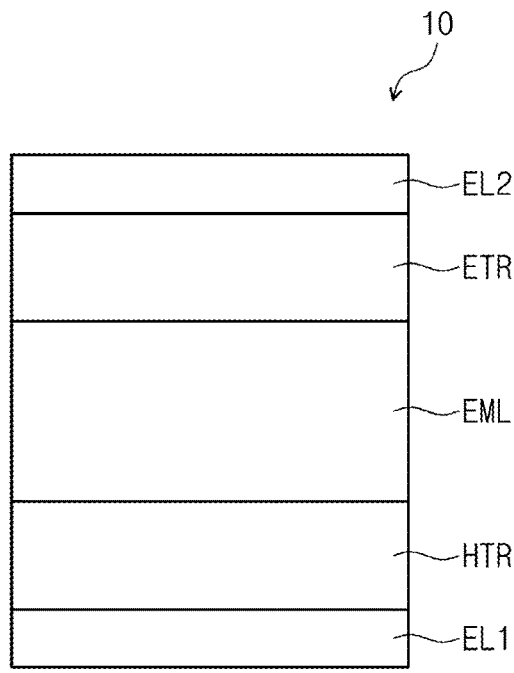
FIG. 1 is a cross-sectional view schematically illustrating an organic electroluminescence device according to an embodiment of the present disclosure.

The present disclosure may have various modifications and may be embodied in different forms, and example embodiments will be explained in detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be further understood that the terms "comprises," "includes," "including," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

It will also be understood that when a layer, a film, a region, a plate, etc. is referred to as being "on" or "above" another part, it can be "directly on" the other part (with no intervening layers therebetween), or intervening layers may also be present. Similarly, it will also be understood that when a layer, a film, a region, a plate, etc. is referred to as being "under" or "below" another part, it can be "directly under" the other part (with no intervening layers therebetween), or intervening layers may also be present. Also, when an element is referred to as being "on" another element, it can be under the other element.

In the description, the term "substituted or unsubstituted" corresponds to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group (e.g., a heterocycle). In addition, each of the substituents may itself be substituted or unsubstituted. For example, a biphenyl group may be interpreted as an aryl group or a phenyl group substituted with a phenyl group.

In the description, the term "forming a ring via the combination with an adjacent group" may refer to forming a substituted or unsubstituted hydrocarbon ring, or a substituted or unsubstituted heterocycle via the combination of one group with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may be a fluorine atom, a chlorine atom, a bromine atom and/or an iodine atom.

In the description, the alkyl may be a linear, branched or cyclic alkyl group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring group may refer to a functional group or substituent derived from an aliphatic hydrocarbon ring. The hydrocarbon ring group may be a saturated hydrocarbon ring group of 5 to 20 carbon atoms for forming a ring.

In the description, the aryl group may refer to a functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the fluorenyl group may be substituted, and two substituents may be combined with each other to form a spiro structure. Examples of a substituted fluorenyl group are as follows. However, an embodiment of the present disclosure is not limited thereto:

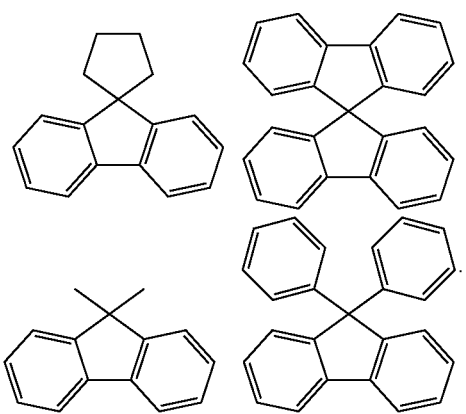

In the description, the heterocyclic group may include one or more selected from B, O, N, P, Si and S as heteroatoms. If the heterocyclic group includes two or more heteroatoms, two or more heteroatoms may be the same or different. The heterocyclic group may be a monocyclic heterocyclic group or a polycyclic heterocyclic group, and includes a heteroaryl group. The carbon number for forming a ring of the heterocyclic group (e.g., heteroaryl group) may be 2 to 30, 2 to 20, or 2 to 10.

In the description, the aliphatic heterocyclic group may include one or more selected from B, O, N, P, Si and S as heteroatoms. The carbon number for forming a ring of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the carbon number for forming a ring of the heteroaryl group may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, isooxazole, oxadiazole, thiadiazole, phenothiazine, acridane, dibenzosilole, dibenzofuran, etc., without limitation.

For example, the carbazole group may be bicarbazole, benzofurocarbazole, thienocarbazole, and/or indolocarbazole, without limitation.

In the description, the explanation of the aryl group may be applied to the arylene group except that the arylene group is a divalent group. The explanation of the heteroaryl group may be applied to the heteroarylene group except that the heteroarylene group is a divalent group. The explanation on the alkyl group may be applied to the divalent alkyl group except that the divalent alkyl group is a divalent group.

In the description, the silyl group includes an alkyl silyl group, an aryl silyl group, and a heteroaryl silyl group. The explanation of the above-described alkyl group, aryl group, and heteroaryl group may be applied to the alkyl, group, aryl group, and the heteroaryl group in the aryl silyl group and the heteroaryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the carbon number of the amino group is not specifically limited, but may be 1 to 30. The amino group may include an alkyl amino group, an aryl amino group, and/or a heteroaryl amino group. The explanation of the above-described alkyl group, aryl group, and heteroaryl group may be applied to the alkyl, group, aryl group, and the heteroaryl group in the alkyl amino group, aryl amino group, and heteroaryl amino group. Examples of the amino group include a methylamino group, a dimethylamino group, a phenylamino group, a diphenylamino group, a naphthylamino group, a 9-methyl-anthracenylamino group, a triphenylamino group, etc., without limitation.

In the description, the carbon number of the carbonyl group is not specifically limited, but may be 1 to 40, 1 to 30, or 1 to 20. For example, the carbonyl group may have the structure(s) below, but an embodiment of the present disclosure is not limited thereto:

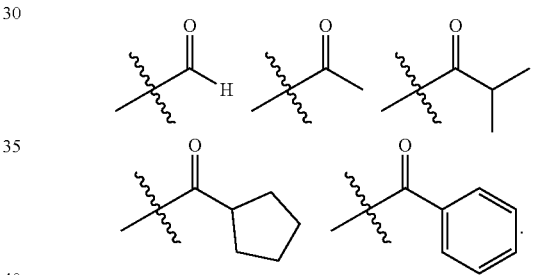

In the description, the alkenyl group may be a linear chain or a branched chain hydrocarbon group with one or more carbon-carbon double bonds at one or more positions along the hydrocarbon chain. The carbon number of the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the alkynyl group may be a linear chain or a branched chain hydrocarbon group with one or more carbon-carbon triple bonds at one or more positions along the hydrocarbon chain. The carbon number of the alkynyl group is not specifically limited but may be 2 to 30, 2 to 20, or 2 to 10. Examples of the alkynyl group may include an acetylenyl group, a 1-butynyl group, a 1-pentynyl group, a 1,3-butadiynyl aryl group, etc., without limitation.

In the description, "atoms for forming a ring" may refer to ring-forming atoms.

In the description, the direct linkage may refer to a single bond.

FIG. 1 is a cross-sectional view schematically showing an organic electroluminescence device according to an embodiment of the present disclosure. The organic electroluminescence device 10 according to an embodiment may include a first electrode EL1, a hole transport region HTR, an emission layer EML, an electron transport region ETR, and a second electrode EL2 stacked in this order.

FIGS. 1 to 4 are cross-sectional views schematically showing organic electroluminescence devices according to example embodiments of the present disclosure. Referring to FIGS. 1 to 4, in an organic electroluminescence device 10 according to one or more embodiments, a first electrode EL1 and a second electrode EL2 are oppositely positioned, and between the first electrode EL1 and the second electrode EL2, an emission layer EML may be provided.

In addition, the organic electroluminescence device 10 further includes a plurality of functional groups (functional layers) between the first electrode EL1 and the second electrode EL2, in addition to the emission layer EML. The plurality of the functional groups (functional layers) may include a hole transport region HTR and an electron transport region ETR. For example, the organic electroluminescence device 10 of an embodiment may include a first electrode EL1, a hole transport region HTR, an emission layer EML, an electron transport region ETR, and a second electrode EL2, stacked in this order. In some embodiments, the organic electroluminescence device 10 may include a capping layer CPL on the second electrode EL2.

The organic electroluminescence device 10 of an embodiment may include one or more compounds of an embodiment, which will be explained in more detail later, in the emission layer EML, which is provided between the first electrode EL1 and the second electrode EL2. However, an embodiment of the present disclosure is not limited thereto, and the organic electroluminescence device 10 may include the one or more compounds of an embodiment in the hole transport region HTR and/or the electron transport region ETR, which are functional groups (functional layers) between the first electrode EL1 and the second electrode EL2, or include the one or more compounds of an embodiment in the capping layer CPL on the second electrode EL2, in addition to being in the emission layer EML.

Figure 2:
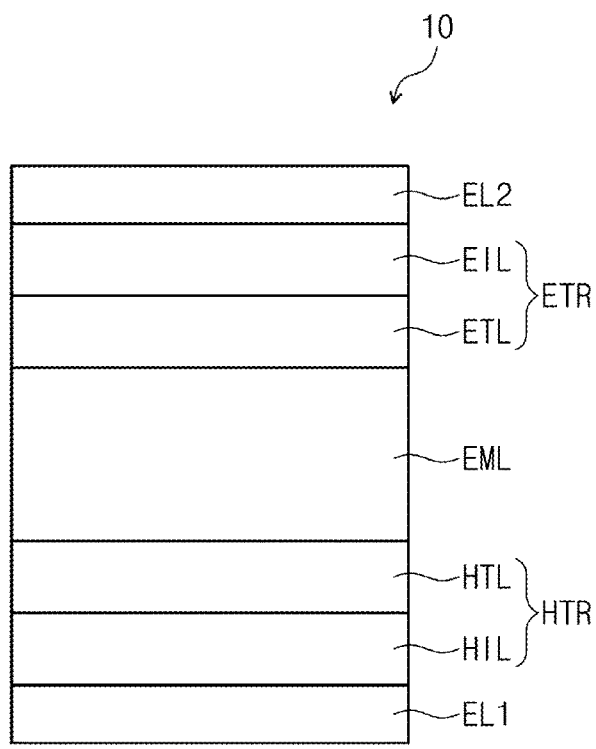
FIG. 2 is a cross-sectional view schematically illustrating an organic electroluminescence device according to an embodiment of the present disclosure.
Figure 3:
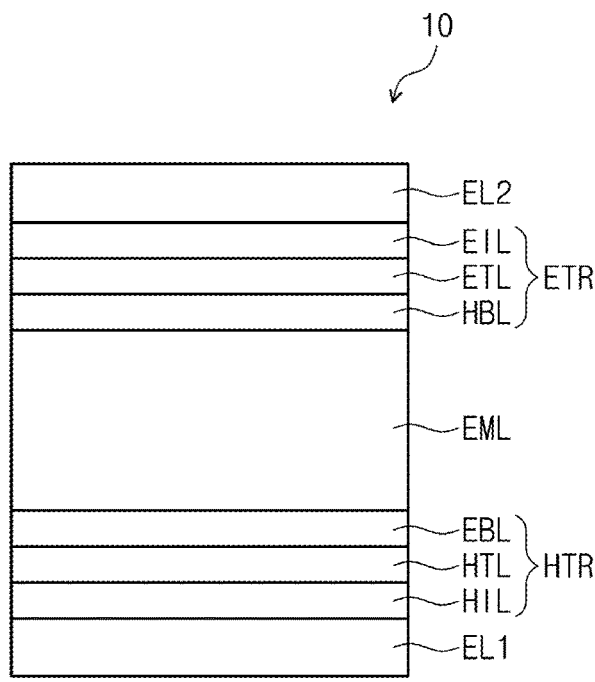
FIG. 3 is a cross-sectional view schematically illustrating an organic electroluminescence device according to an embodiment of the present disclosure.
Figure 4:
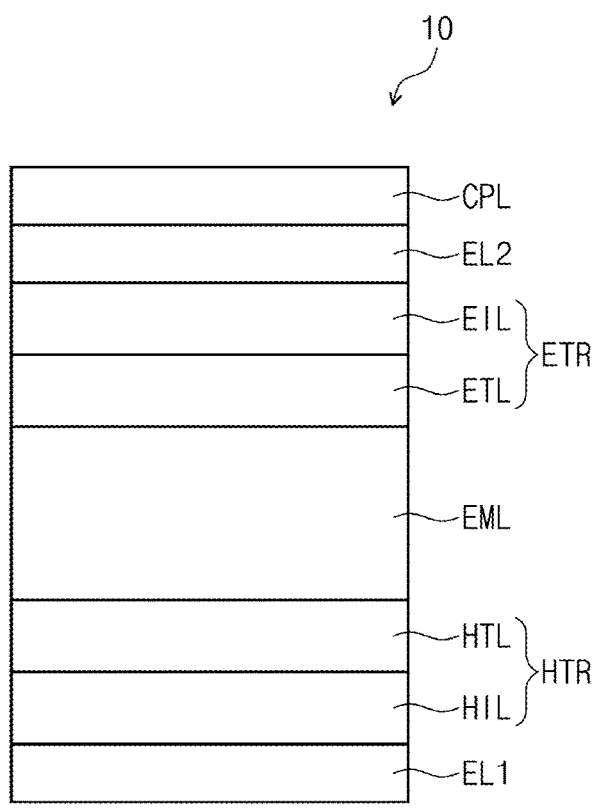
FIG. 4 is a cross-sectional view schematically illustrating an organic electroluminescence device according to an embodiment of the present disclosure.

When compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment, including a capping layer CPL on the second electrode EL2.

The first electrode EU has conductivity. The first electrode EL1 may be formed using a metal alloy or any suitable conductive compound. The first electrode EL1 may be an anode. In some embodiments, the first electrode EL1 may be a pixel electrode. The first electrode EL1 may be a transmissive electrode, a transflective electrode, or a reflective electrode. If the first electrode EU is the transmissive electrode, the first electrode EL1 may include a transparent metal oxide, for example, indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a structure including a plurality of layers including a reflective layer and/or a transflective layer formed using any of the above materials, and a transmissive conductive layer formed using ITO, IZO, ZnO, ITZO, etc. For example, the first electrode EL1 may include a three-layer structure of ITO/Ag/ITO. However, an embodiment of the present disclosure is not limited thereto. The thickness of the first electrode EL1 may be from about 1,000 Å to about 10,000 Å, for example, from about 1,000 Å to about 3,000 Å.

The hole transport region HTR may be provided on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of the hole injection layer HIL or the hole transport layer HTL, or a single layer structure formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4',4"-tris(N,N-diphenylamino)triphenylamine (TDATA), 4,4',4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, and/or dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(carbazol-9-yl)triphenylamine (TCTA)), N,N'-di(naphthalene-1-yl)-N,N'-diphenyl-benzidine (NPB), 4,4'-cyclohexylidene bis[N,N-bis(4-methylphenyl)benzeneamine]

(TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL, and the electron blocking layer EBL satisfy the above-described ranges, satisfactory (or suitable) hole transport properties may be achieved without substantial increase of a driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may be one selected from quinone derivatives, metal oxides, and cyano group-containing compounds, without limitation. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxide and/or molybdenum oxide), etc., without limitation.

As described above, the hole transport region HTR may further include at least one of a hole buffer layer or an electron blocking layer EBL, in addition to the hole injection layer HIL and the hole transport layer HTL. The hole buffer layer may compensate an optical resonance distance according to the wavelength of light emitted from an emission layer EML to increase light emission efficiency. Materials which may be included in the hole transport region HTR may be used as materials included in the hole buffer layer. The electron blocking layer EBL may prevent or reduce the electron injection from the electron transport region ETR to the hole transport region HTR.

The emission layer EML may be provided on the hole transport region HTR. The emission layer EML may have a thickness of, for example, about 100 Å to about 1,000 Å, or about 100 Å to about 300 Å. The emission layer EML may have a single layer formed using a single material, a single layer formed using a plurality of different materials, or a multilayer structure having a plurality of layers formed using a plurality of different materials.

In an embodiment, the emission layer EML may include a first compound, a second compound, a third compound, and a fourth compound of an embodiment, which will be explained in more detail later. The first to fourth compounds may be different compounds.

In an embodiment, the first compound may be represented by Formula 1:

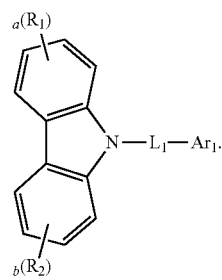

Formula 1

In Formula 1, $R_1$ and $R_2$ may each independently be an aryl group or a heteroaryl group. The aryl group may be a substituted or unsubstituted aryl group of 6 to 30 carbon atoms for forming a ring. The heteroaryl group may be a substituted or unsubstituted heteroaryl group of 3 to 30 carbon atoms for forming a ring. "a" and "b" may each independently be an integer of 0 to 4. For example, "a" and "b" may be 0. That is, the benzene rings of a carbazole group in Formula 1 may be unsubstituted.

$L_1$ may be a direct linkage, an arylene group, or a heteroarylene group. The arylene group may be a substituted or unsubstituted arylene group of 6 to 30 carbon atoms for forming a ring. The heteroarylene group may be a substituted or unsubstituted heteroarylene group of 3 to 30 carbon atoms for forming a ring. $L_1$ may be a substituted or unsubstituted phenylene group, a substituted or unsubstituted divalent biphenyl group, or a substituted or unsubstituted carbazolene group. If $L_1$ is substituted, the substituent of $L_1$ may be an aryl group and/or a heteroaryl group. For example, $L_1$ may be a divalent group which is substituted with a phenyl group and/or a carbazole group.

$Ar_1$ may be an aryl group or a heteroaryl group. The aryl group may be a substituted or unsubstituted aryl group of 6 to 30 carbon atoms for forming a ring. The heteroaryl group may be a substituted or unsubstituted heteroaryl group of 3 to 30 carbon atoms for forming a ring. $Ar_1$ may be, for example, a dibenzoheterocyclic group represented by Formula A:

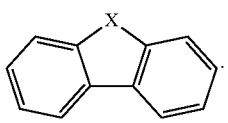

Formula A

In Formula A, X may be a heteroatom. For example, X may be B, O, N, P, Si or S. Benzene rings in Formula A may each independently be substituted with a substituent. For example, Formula A may be a substituted or unsubstituted carbazole group, a substituted or unsubstituted dibenzofuran group, or a substituted or unsubstituted dibenzothiophene group. Formula A may be an unsubstituted carbazole group, an unsubstituted dibenzofuran group, or an unsubstituted dibenzothiophene group.

In an embodiment, the second compound may be represented by Formula 2:

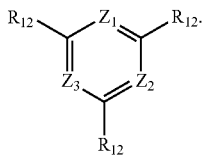

Formula 2

In Formula 2, $Z_1$ to $Z_3$ may each independently be $CR_{11}$, or N. For example, all $Z_1$ to $Z_3$ may be $CR_{11}$, or all may be N.

A plurality of $R_{11}$ and a plurality of $R_{12}$ may each independently be a hydrogen atom, a deuterium atom, a cyano group, a silyl group, an aryl group, or a heteroaryl group. The silyl group may be a substituted silyl group. The plurality of $R_{11}$ may be the same or different. The plurality of $R_{12}$ may be the same or different. The aryl group may be a substituted or unsubstituted aryl group of 6 to 30 carbon atoms for forming a ring. The heteroaryl group may be a substituted or unsubstituted heteroaryl group of 3 to 30 carbon atoms for forming a ring.

The substituted silyl group may be an aryl silyl group and/or a heteroaryl silyl group. For example, the aryl group in the aryl silyl group may be an aryl group substituted with a heteroaryl group.

The aryl group may be a substituted or unsubstituted phenyl group. The heteroaryl group may be a substituted or unsubstituted pyridine group and/or a dibenzoheterocyclic group represented by Formula A as described above. For example, the heteroaryl group may be a substituted or unsubstituted carbazole group, and/or a substituted or unsubstituted dibenzofuran group.

Formula 2 may be represented by Formula 2-1:

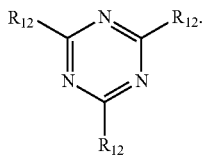

Formula 2-1

In Formula 2-1, a plurality of $R_{12}$ may each independently be a substituted or unsubstituted aryl group of 6 to 30 carbon atoms for forming a ring, or a substituted or unsubstituted heteroaryl group of 3 to 30 carbon atoms for forming a ring. $R_{12}$ may be, for example, each independently a phenyl group substituted with a triphenylmethyl group, a phenyl group substituted with a triphenylsilyl group, a phenyl group substituted with a methyl group, or a carbazole group substituted with a phenyl group.

Formula 2 may be represented by Formula 2-2:

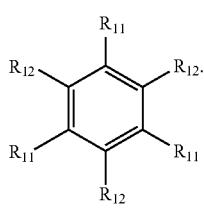

Formula 2-2

In Formula 2-2, a plurality of $R_{11}$ and a plurality of $R_{12}$ may each independently be a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring. At least one selected from the plurality of $R_{11}$ and the plurality of $R_{12}$ may be a cyano group, or an aromatic cyclic group including at least one cyano group as a substituent. The aromatic cyclic group including at least one cyano group as a substituent may be an aryl group of 6 to 30 carbon atoms for forming a ring, which includes at least one cyano group as a substituent, and/or a heteroaryl group of 3 to 30 carbon atoms for forming a ring, which includes at least one cyano group as a substituent. The aromatic cyclic group including at least one cyano group as a substituent may be a carbazole group in which a cyano group is substituted, and/or a dibenzofuran group in which a cyano group is substituted.

In an embodiment, the third compound may be represented by Formula 3:

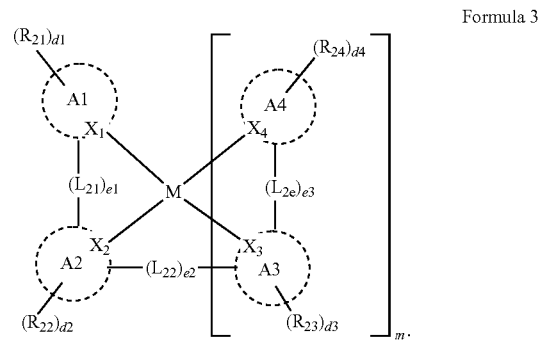

Formula 3

In Formula 3, A1 to A4 may each independently be an aryl group or a heteroaryl group. The aryl group may be a substituted or unsubstituted aryl group of 6 to 30 carbon atoms for forming a ring. The heteroaryl group may be a substituted or unsubstituted heteroaryl group of 1 to 30 carbon atoms for forming a ring.

$X_1$ to $X_4$ may each independently be C or N.

$R_{21}$ to $R_{24}$ may each independently be a hydrogen atom, a deuterium atom, a halogen atom, a cyano group, an amine group, an alkyl group, an aryl group, or a heteroaryl group, and any of $R_{21}$ to $R_{24}$ may be combined with an adjacent group to form a ring. The amine group may be a substituted or unsubstituted amine group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 1 to 30 carbon atoms for forming a ring. d1 to d4 may each independently be an integer of 0 to 4. For example, in case where $R_{21}$ to $R_{24}$ are alkyl groups, a methyl group, an isopropyl group, and/or a tert-butyl group may be included. In case where $R_{21}$ to $R_{24}$ are amine groups, a dimethylamine group may be included. In case where $R_{21}$ to $R_{24}$ are halogen atoms, a fluorine atom (F) may be included.

$L_{21}$ to $L_{23}$ may each independently be a direct linkage,

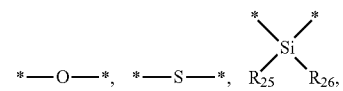

-continued

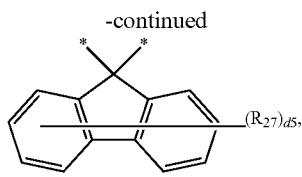

a divalent alkyl group, an arylene group, or a heteroarylene group. The divalent alkyl group may be a substituted or unsubstituted divalent alkyl group of 1 to 20 carbon atoms. The arylene group may be a substituted or unsubstituted arylene group of 6 to 30 carbon atoms for forming a ring. The heteroarylene group may be a substituted or unsubstituted heteroarylene group of 2 to 30 carbon atoms for forming a ring.

In $L_{21}$ to $L_{23}$,

refers to a part connected with A1 to A4.

$R_{25}$ to $R_{27}$ may each independently be an alkyl group, an aryl group, or a heteroaryl group, and any of $R_{25}$ to $R_{27}$ may be combined with an adjacent group to form a ring. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 3 to 30 carbon atoms for forming a ring. d5 may be an integer of 0 to 8. For example, d5 may be 0.

M may be a metal atom. For example, M may be platinum, palladium, copper, osmium, iridium, rubidium, or rhodium. e1 to e3 may each independently be 0 or 1. m may be 1 or 2. When M is platinum, palladium, copper or osmium, "m" may be 1. When M is iridium, rubidium, or rhodium, "m" may be 2 and e2 may be 0.

A1 to A4 may each independently be represented by any one selected from Structures 1-1 to 1-3:

1-1

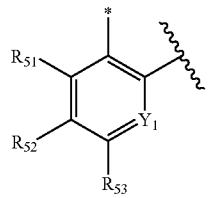

1-2

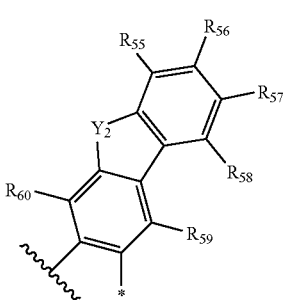

1-3

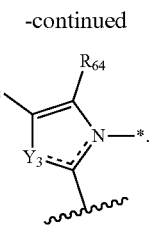

In Structures 1-1 to 1-3, $Y_1$ may be

or $CR_{54}$. $Y_2$ may be

or $NR_{61}$. $Y_3$ may be

or $NR_{62}$. In Structures 1-1 to 1-3,

refers to a part connected with a metal atom.

refers to a part connected with a neighboring ligand (i.e., A1 to A4), or a linker (i.e., $L_{21}$ to $L_{23}$).

$R_{51}$ to $R_{64}$ may each independently be an alkyl group, an aryl group, or a heteroaryl group, and any of $R_{51}$ to $R_{64}$ may be combined with an adjacent group to form a ring. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 6 to 30 carbon atoms for forming a ring.

For example, $R_{63}$ and $R_{64}$ may be combined with each other to form a ring. For example, Structure 1-3 may be represented by any of Structures 1-3-1 to 1-3-3 below:

1-3-1

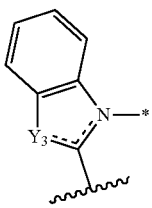

-continued

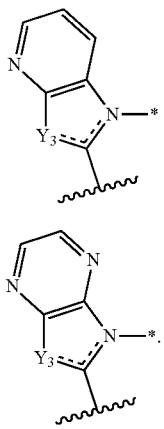

1-3-2

1-3-3

In Structures 1-3-1 to 1-3-3, $Y_3$ may be the same as defined in Structure 1-3. A1 to A4 may each independently be represented by Structure 2-1 or Structure 2-2:

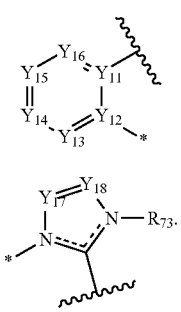

2-1

2-2

In Structure 2-1, $Y_{11}$, and $Y_{12}$ may each independently be C or N, and $Y_{13}$ to $Y_{16}$ may each independently be N or $CR_{71}$. For example, Structure 2-1 may include phenyl derivatives, pyridine derivatives, and/or 1,3,5-triazine derivatives.

$R_{71}$ may each independently be a hydrogen atom, a deuterium atom, a halogen atom, a cyano group, an amine group, an alkyl group, an aryl group, or a heteroaryl group, and any of $R_{71}$ may be combined with an adjacent group to form a ring. The amine group may be a substituted or unsubstituted amine group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 1 to 30 carbon atoms for forming a ring.

In Structure 2-2, $Y_{17}$ and $Y_{18}$ may each independently be N or $CR_{72}$. $R_{72}$ and $R_{73}$ may each independently be a hydrogen atom, a deuterium atom, a halogen atom, a cyano group, an amine group, an alkyl group, an aryl group, or a heteroaryl group, and any of $R_{72}$ and $R_{73}$ may be combined with an adjacent group to form a ring. The amine group may be a substituted or unsubstituted amine group. The alkyl group may be a substituted or unsubstituted alkyl group of 1 to 20 carbon atoms. The aryl group may be a substituted or unsubstituted aryl group of 6 to 30 carbon atoms for forming a ring. The heteroaryl group may be a substituted or unsubstituted heteroaryl group of 1 to 30 carbon atoms for forming a ring. For example, $R_{72}$ may be a hydrogen atom. For example, $R_{73}$ may be a methyl group.

In Formula 3, A1 to A4 may each independently be represented by any one selected from Structures 1-1 to 1-3, 2-1, and 2-2.

Formula 3 may be represented by Formula 3-1:

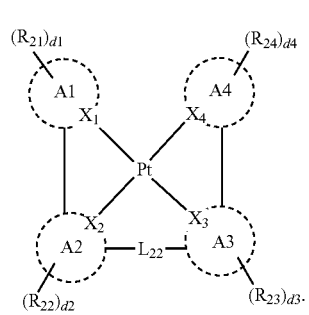

Formula 3-1

In Formula 3-1, A1 to A4, $X_1$ to $X_4$, $R_{21}$ to $R_{24}$, d1 to d4, and $L_{22}$ may be the same as defined in Formula 3. For example, A1 to A4 may each independently be represented by any one selected from Structures 1-1 to 1-3 above.

Formula 3 may be represented by Formula 3-2:

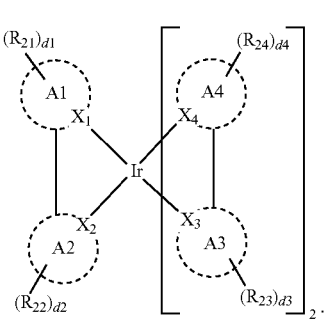

Formula 3-2

In Formula 3-2, A1 to A4, $X_1$ to $X_4$, $R_{21}$ to $R_{24}$, and d1 to d4 may be the same as defined in Formula 3. For example, A1 to A4 may each independently be represented by Structure 2-1 or Structure 2-2 above.

For example, Formula 3-2 may be represented by Formula 3-2-1:

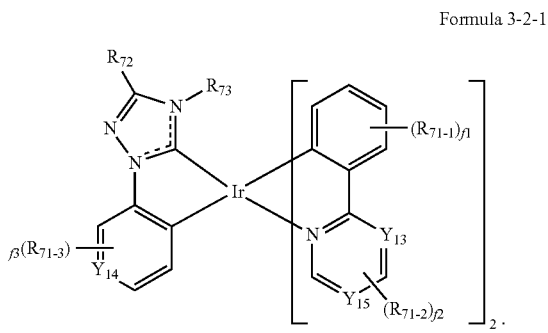

Formula 3-2-1

$Y_{13}$ and $Y_{15}$ may be the same as defined in Structure 2-1. In Formula 3-2-1, $R_{72}$ and $R_{73}$ may be the same as defined in Structure 2-2.

$R_{71}$-1, $R_{71}$-2, and $R_{71}$-3 may be defined the same as $R_{71}$. f1 may be an integer of 0 to 4. If f1 is 2 or more, a plurality of $R_{71}$-1 groups may be the same or different. f2 may be 1 or 2. If f2 is 2, two $R_{71}$-2 groups may be the same or different. f3 may be an integer of 0 to 3. If f3 is 2 or more, a plurality of $R_{71}$-3 groups may be the same or different.

In an embodiment, the fourth compound may be represented by Formula 4:

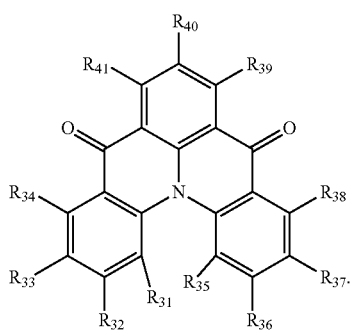

Formula 4

In Formula 4, $R_{31}$ to $R_{41}$ may each independently be a hydrogen atom, a deuterium atom, a halogen atom, a silyl group, an amine group, a carbonyl group, an alkyl group, an alkenyl group, an alkynyl group, an aryl group, or a heteroaryl group. The silyl group may be a substituted or unsubstituted silyl group. The amine group may be a substituted or unsubstituted amine group. The carbonyl group may be a substituted or unsubstituted carbonyl group. The alkyl group may be a substituted or unsubstituted alkyl group of 1 to 20 carbon atoms. The alkenyl group may be a substituted or unsubstituted alkenyl group of 2 to 20 carbon atoms. The alkynyl group may be a substituted or unsubstituted alkynyl group of 2 to 20 carbon atoms. The aryl group may be a substituted or unsubstituted aryl group of 6 to 30 carbon atoms for forming a ring. The heteroaryl group may be a substituted or unsubstituted heteroaryl group of 3 to 30 carbon atoms for forming a ring. At least one of $R_{31}$ to $R_{41}$ may not be a hydrogen atom.

For example, $R_{31}$ to $R_{41}$ may each independently be a tri-deuterium methyl ($CD_3$) group, an isopropyl group, a t-butyl group, a trimethylsilyl group, a triphenylsilyl group, a substituted or unsubstituted acetyl group, a substituted or unsubstituted fluorenyl group, a substituted or unsubstituted imidazole group, a substituted or unsubstituted triazine group, a substituted or unsubstituted pyridine group, a substituted or unsubstituted dibenzofuran group, a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group. The substituted monoamine group, and the substituted diamine group may not include nitrogen as a substituent. For example, the substituted monoamine group may be a dimethylamine group and/or a diarylamine group.

Formula 4 may be represented by Formula 4-1:

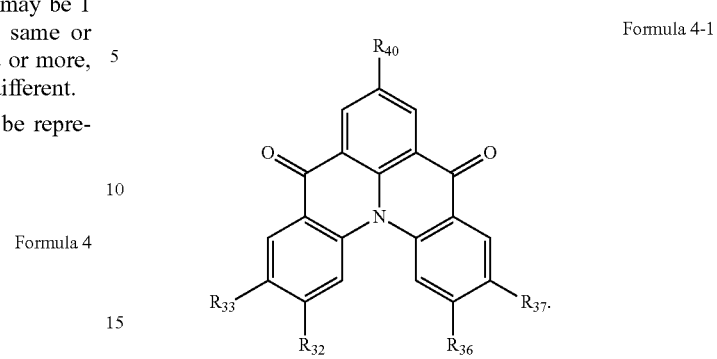

Formula 4-1

$R_{32}$, $R_{33}$, $R_{36}$, $R_{37}$, and $R_{40}$ may be the same as defined in Formula 4. At least one selected from $R_{32}$, $R_{33}$, $R_{36}$, $R_{37}$, and $R_{40}$ may not be a hydrogen atom.

Formula 4-1 may be represented by Formula 4-2 below:

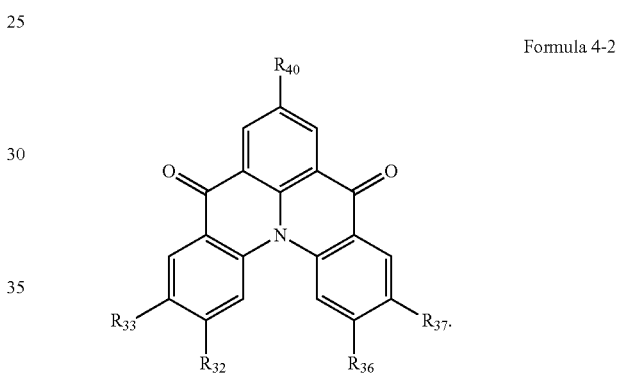

Formula 4-2

In Formula 4-2, $R_{32}$, $R_{33}$, $R_{36}$, and $R_{37}$ may be the same as defined in Formula 4. For example, in Formula 4-2, $R_{32}$ and $R_{36}$ may be hydrogen atoms, and $R_{33}$ and $R_{37}$ may not be hydrogen atoms. In some embodiments, $R_{32}$ and $R_{36}$ may not be hydrogen atoms, and $R_{33}$ and $R_{37}$ may be hydrogen atoms.

The first compound of an embodiment may include at least one selected from the compounds represented in the following Compound Group 1:

Compound Group 1

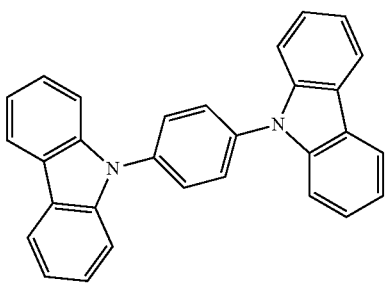

HT-01

HT-02
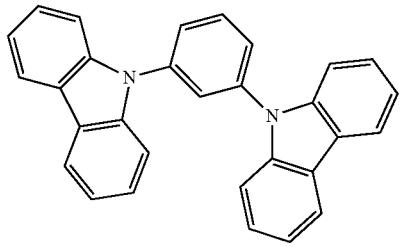
HT-03
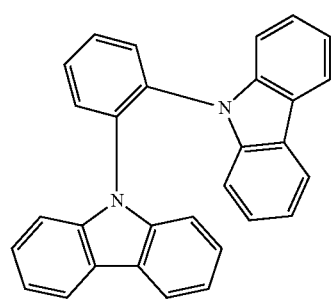
HT-04
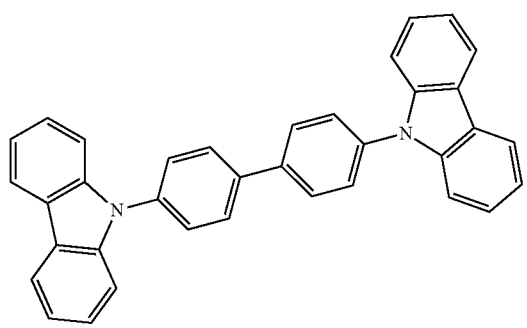
HT-05
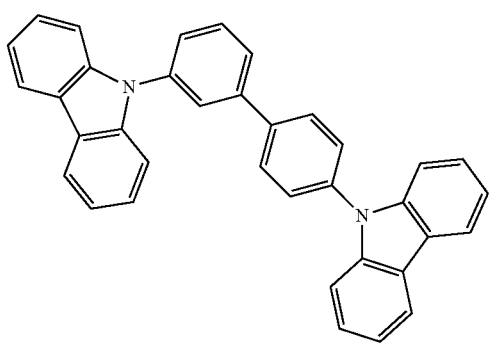
HT-06
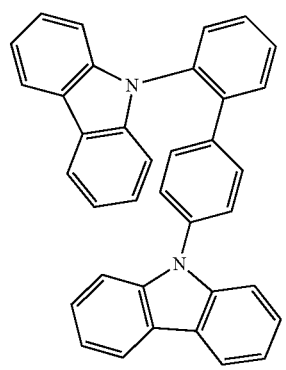
HT-07
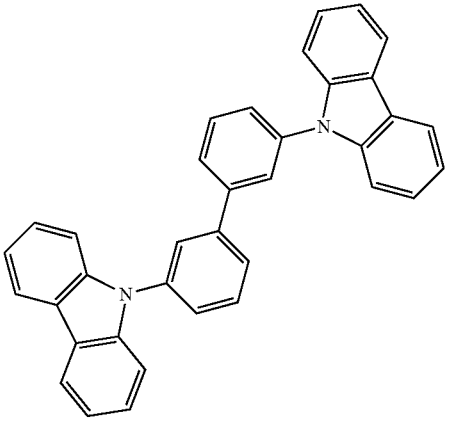
HT-08
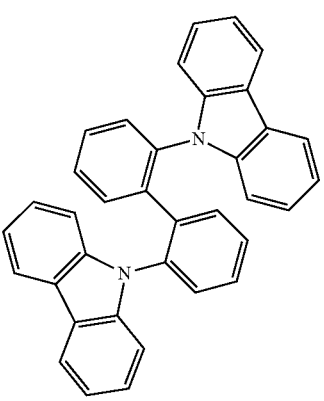
HT-09
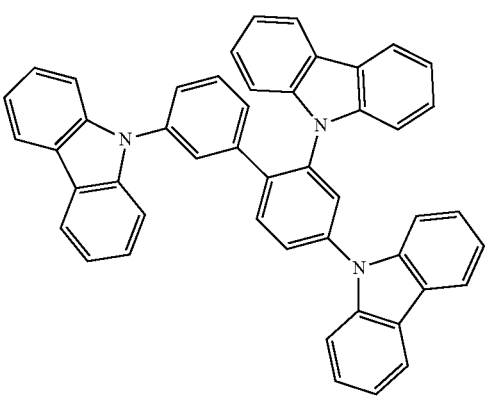

HT-10
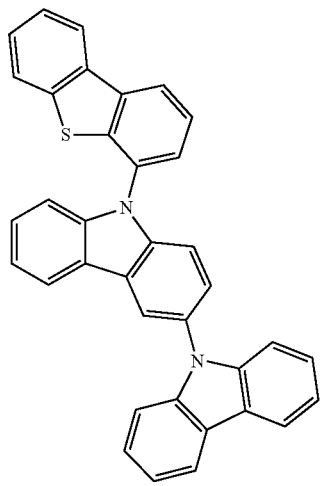
HT-11
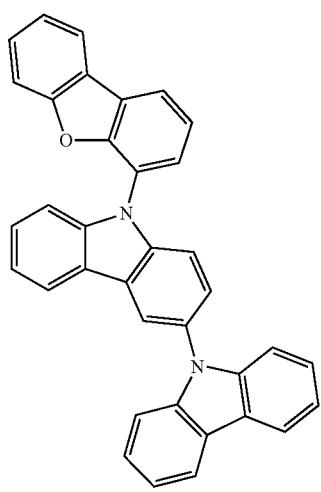
HT-12
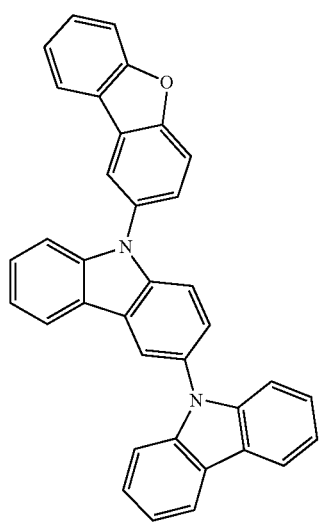
HT-13
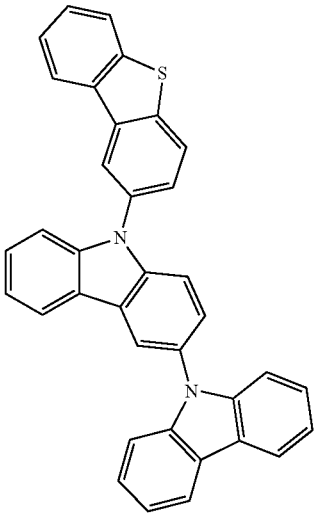
HT-14
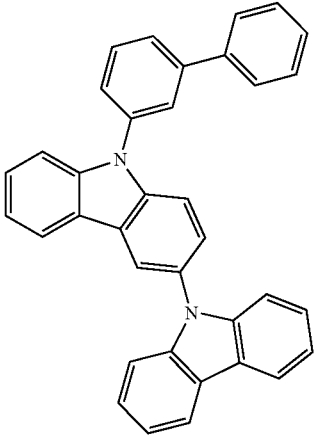
HT-15
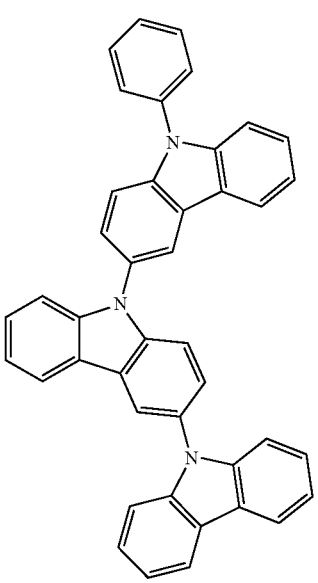

HT-16
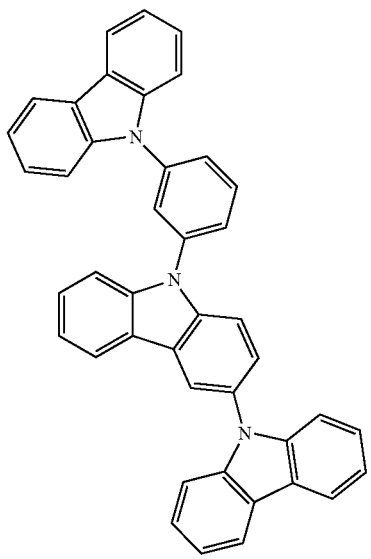
HT-17
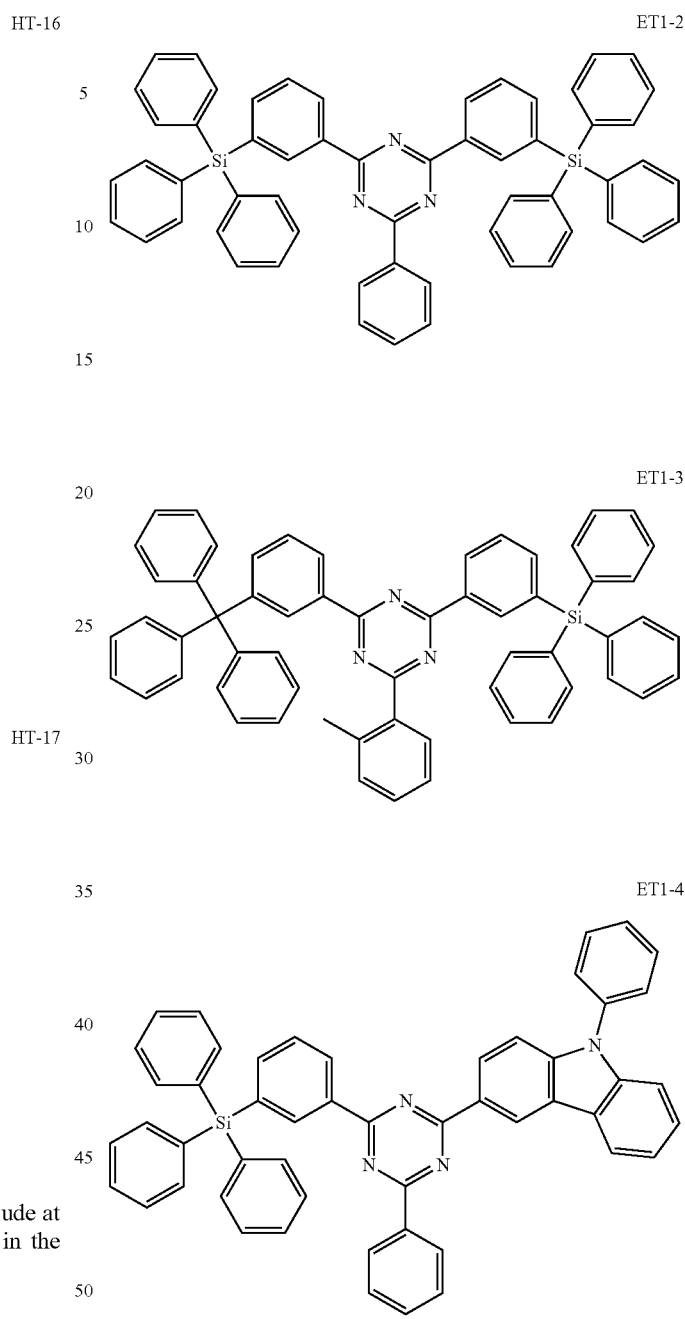
The second compound of an embodiment may include at least one selected from the compounds represented in the following Compound Group 2-1:
Compound Group 2-1
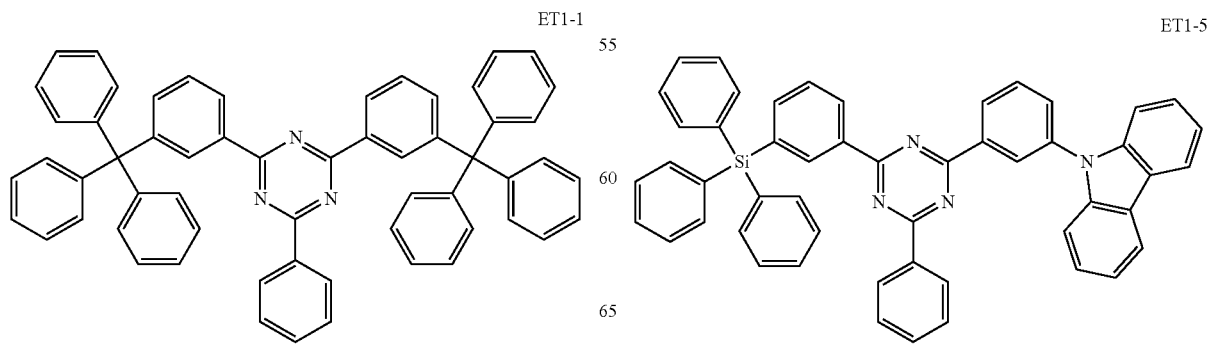

ET1-6
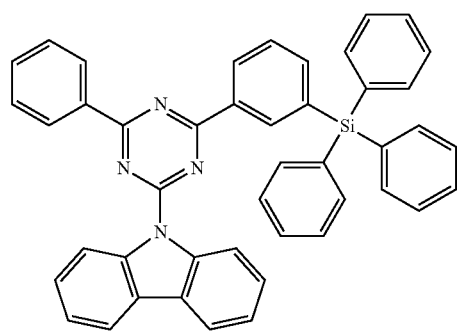
ET1-7
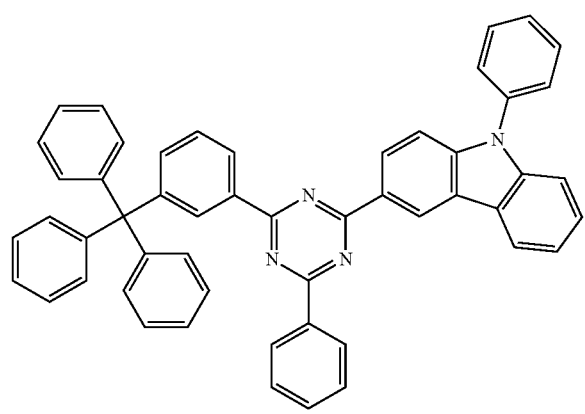
ET1-8
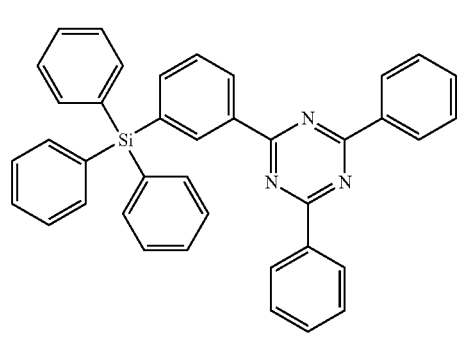
ET1-9
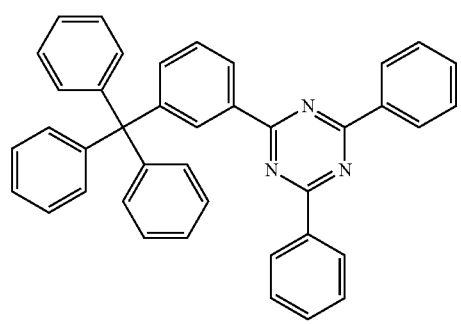
ET1-10
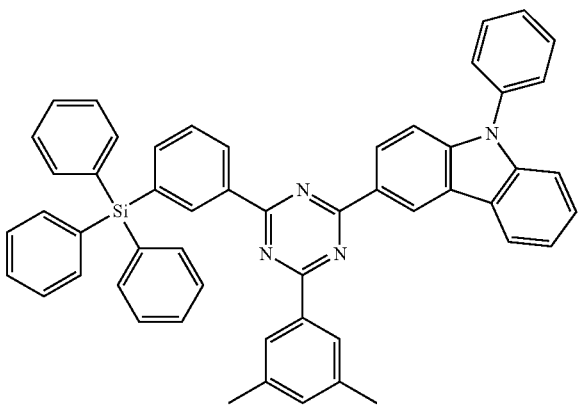
ET1-11
ET1-12
ET1-13
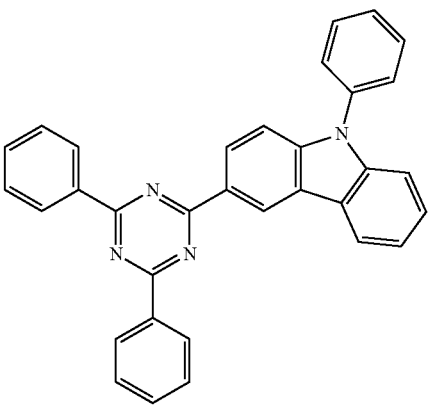

ET1-14
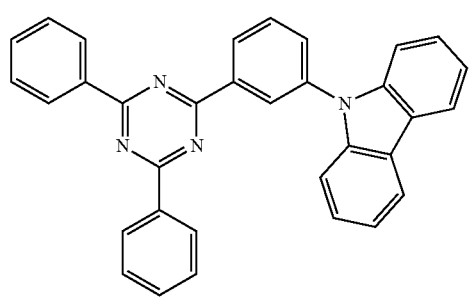
ET1-15
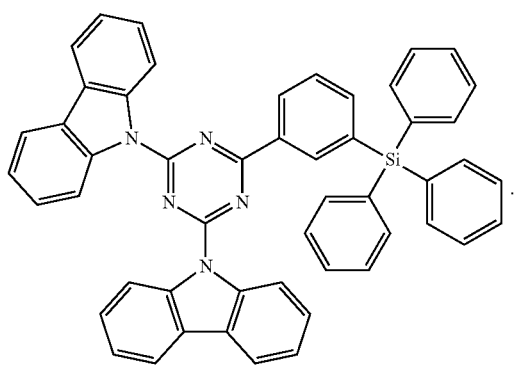
The second compound of an embodiment may include at least one selected from the compounds represented in the following Compound Group 2-2:
Compound Group 2-2
ET2-1
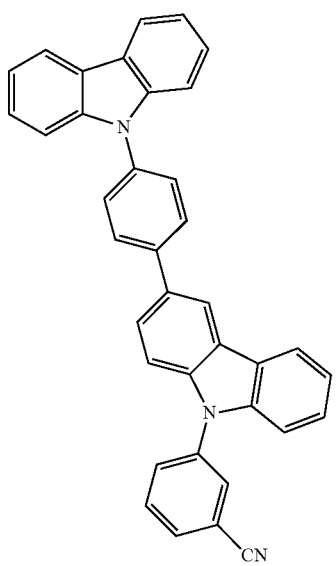
ET2-2
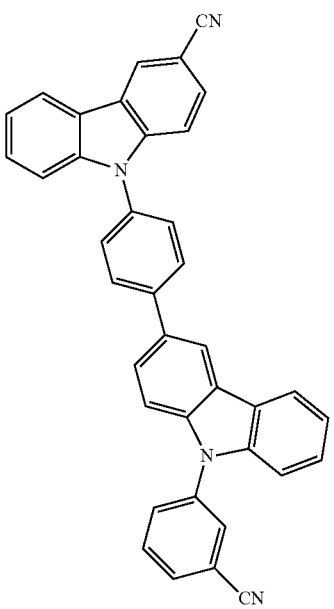
ET2-3
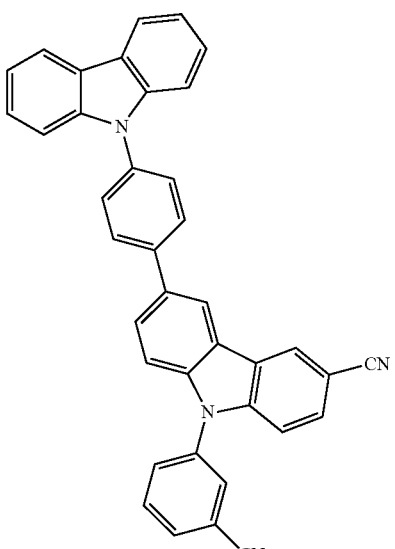
ET2-4
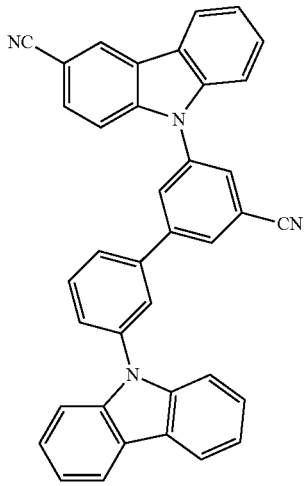

ET2-5
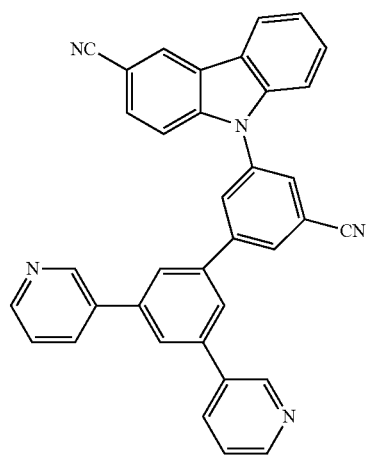
ET2-8
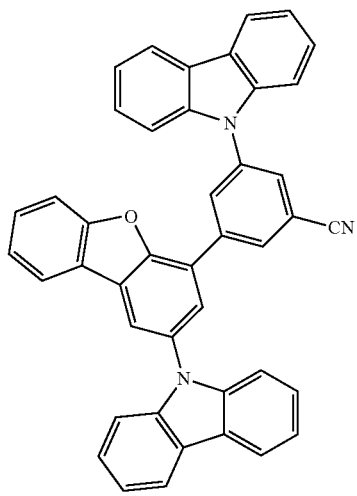
ET2-6
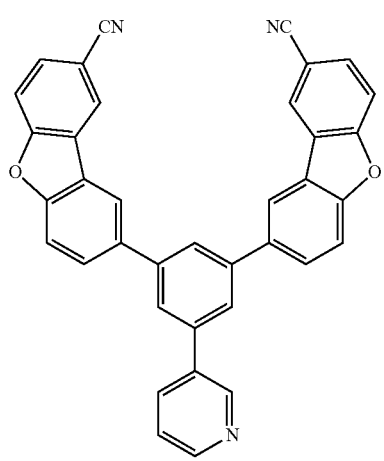
ET2-9
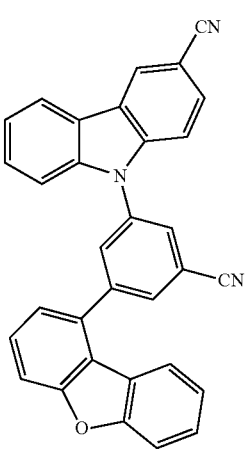
ET2-7
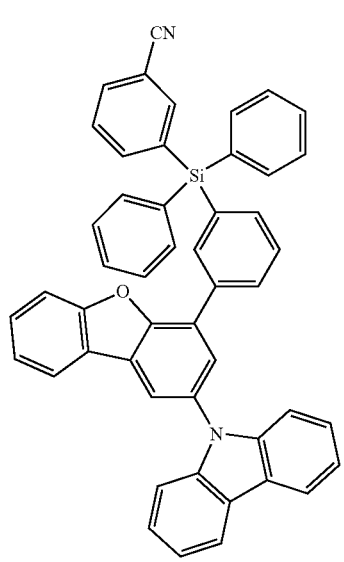
ET2-10
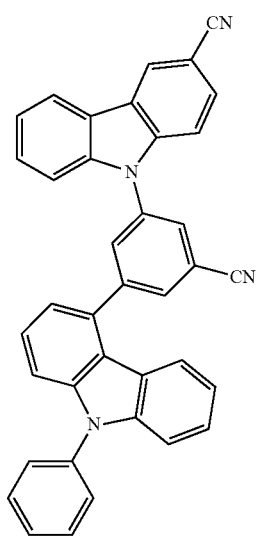

ET2-11
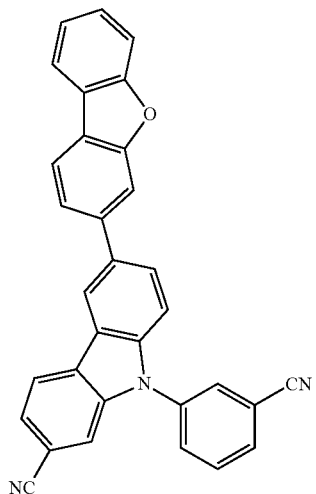
ET2-12
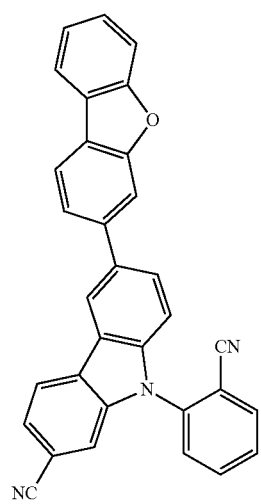
The third compound of an embodiment may include at least one selected from the compounds represented in the following Compound Group 3-1:
Compound Group 3-1
D1-1
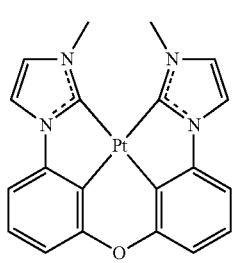
D1-2
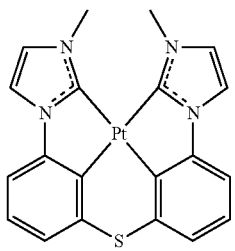
D1-3
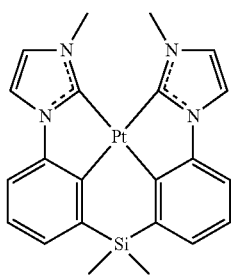
D1-4
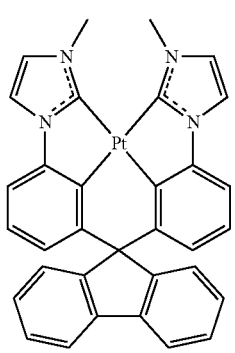
D1-5
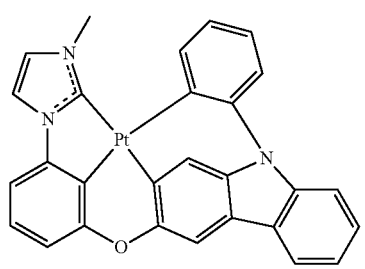
D1-6
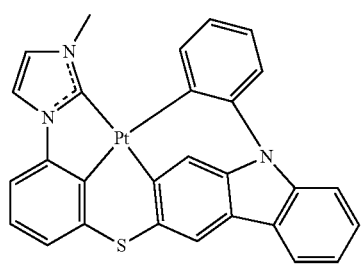

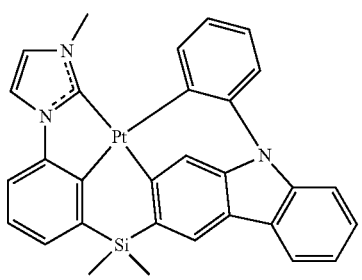
D1-7
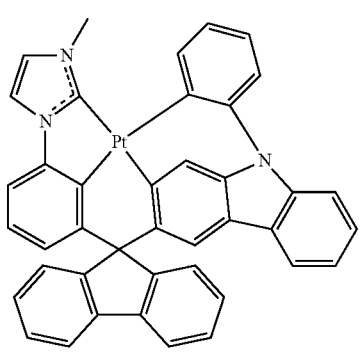
D1-8
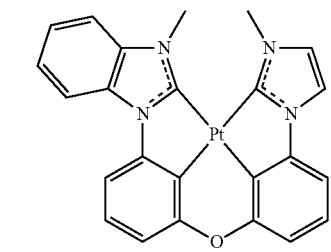
D1-9
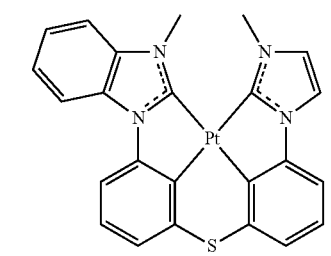
D1-10
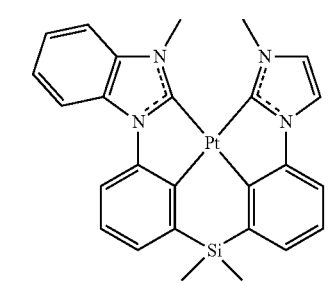
D1-11
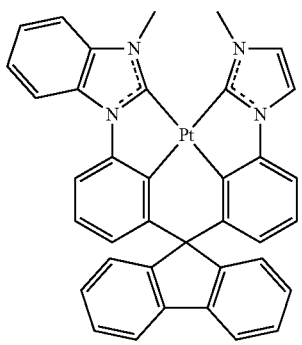
D1-12
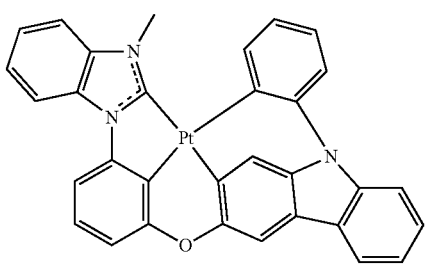
D1-13
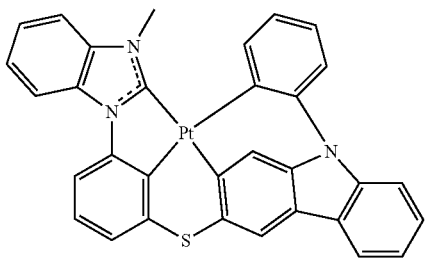
D1-14
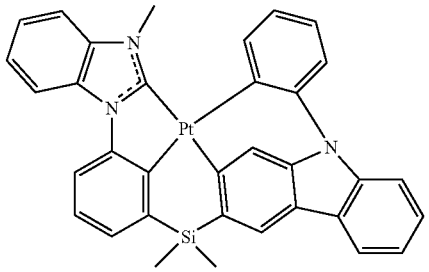
D1-15
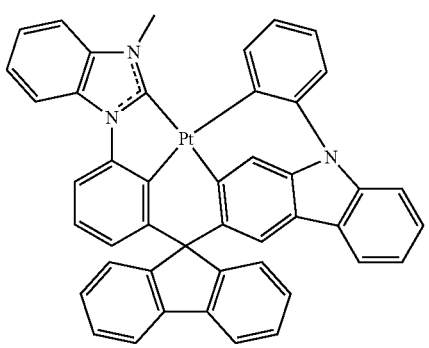
D1-16

D1-17
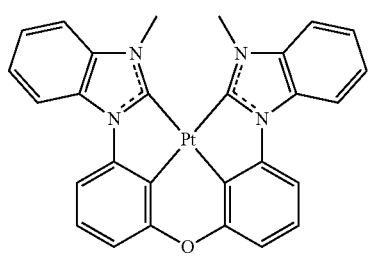
D1-18
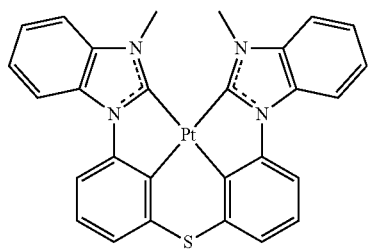
D1-19
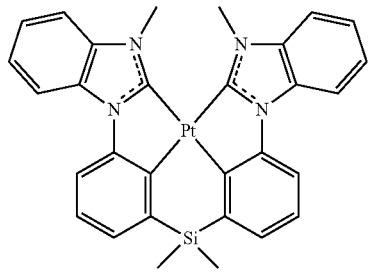
D1-20
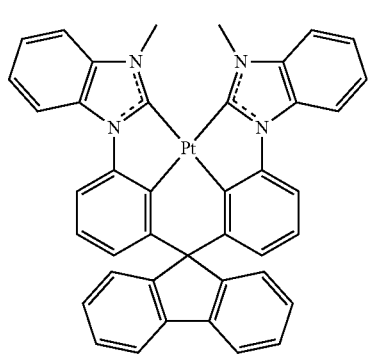
D1-21
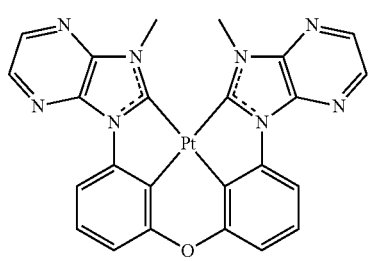
D1-22
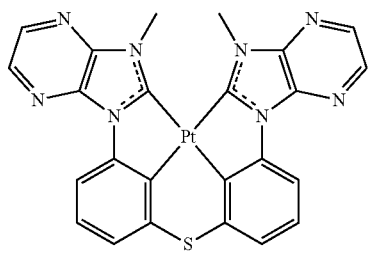
D1-23
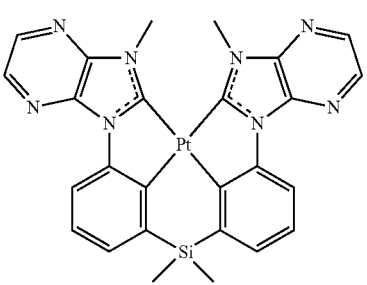
D1-24
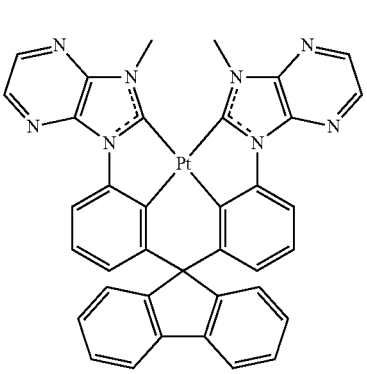
D1-25
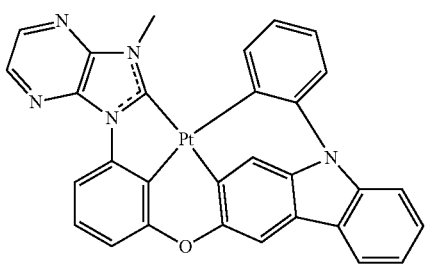
D1-26
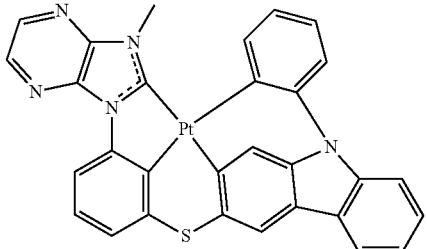
D1-27
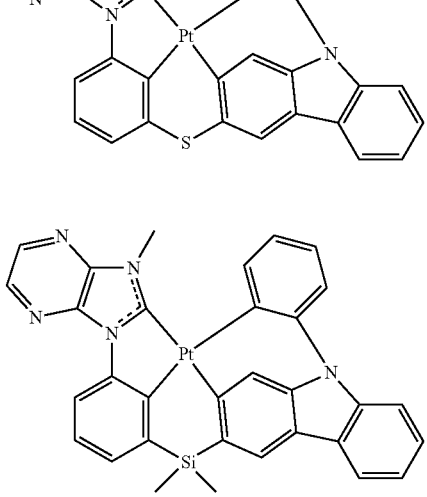

D1-28 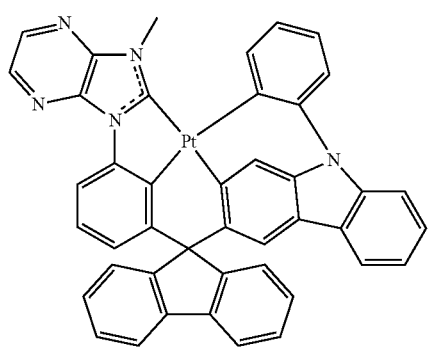
D1-33 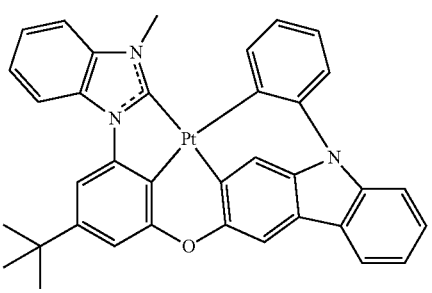
D1-29 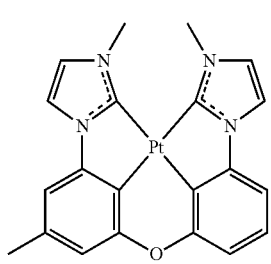
D1-34 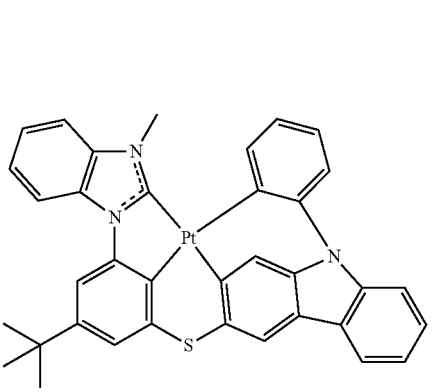
D1-30 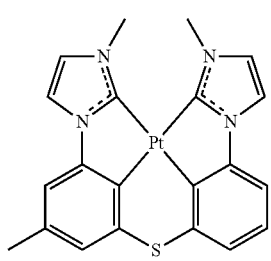
D1-31 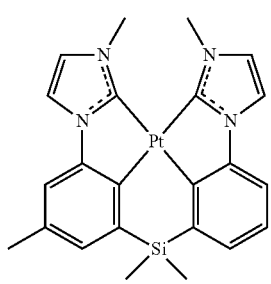
D1-35 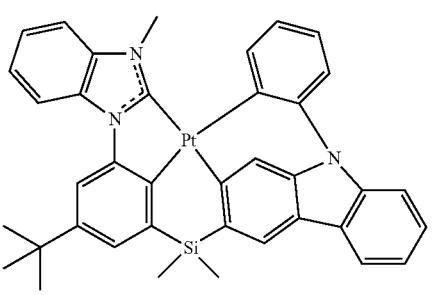
D1-32 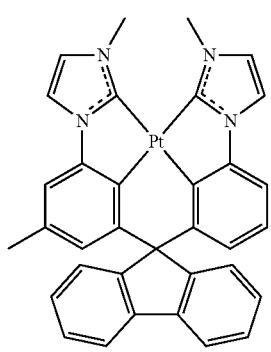
D1-36 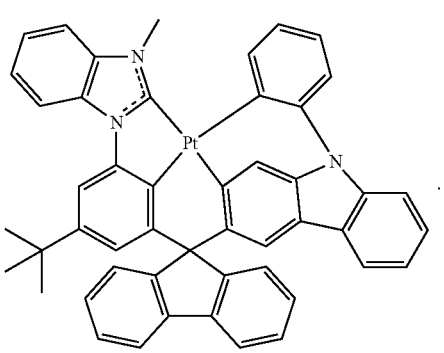

The third compound of an embodiment may include at least one selected from the compounds represented in the following Compound Group 3-2:
Compound Group 3-2
D2-1
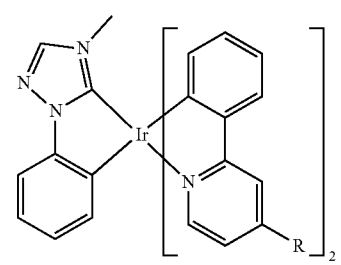
D2-2
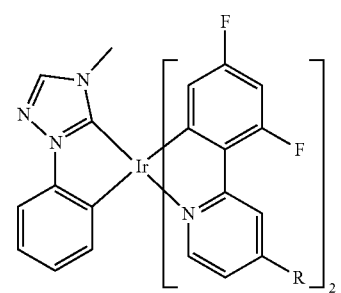
D2-3
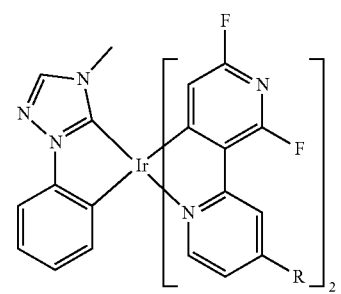
D2-4
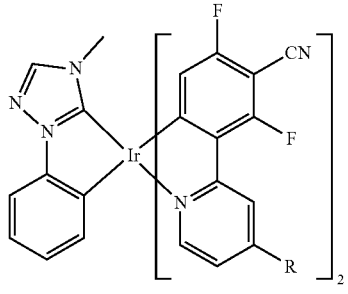
D2-5
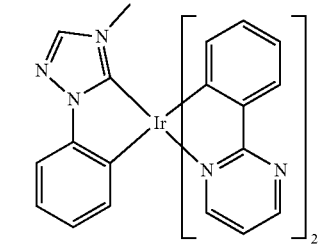
-continued
D2-6
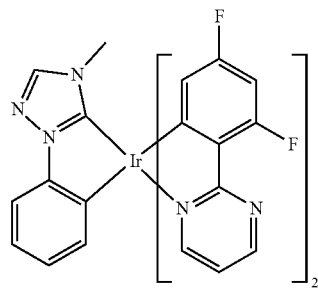
D2-7
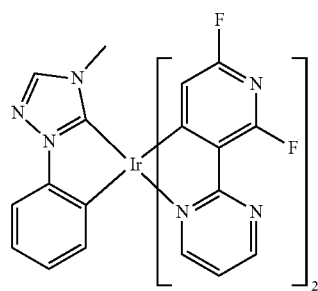
D2-8
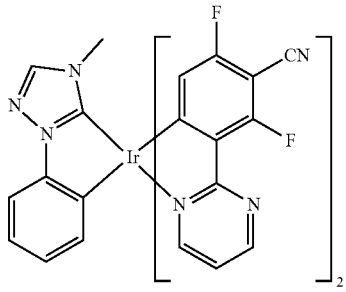
D2-9
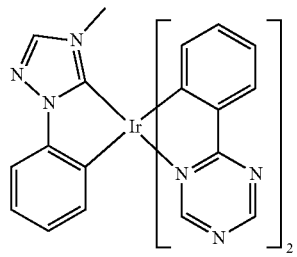
D2-10
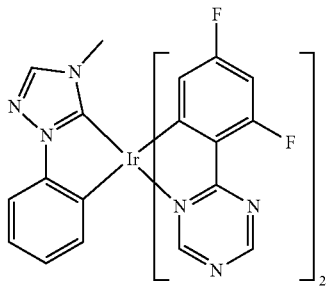

D2-11
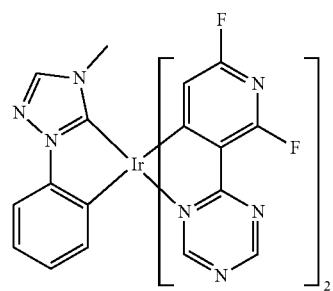
D2-12
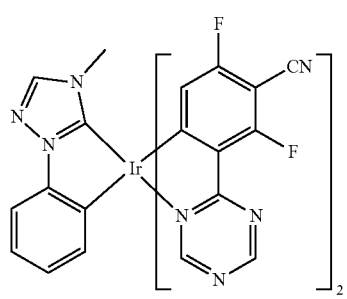
D2-13
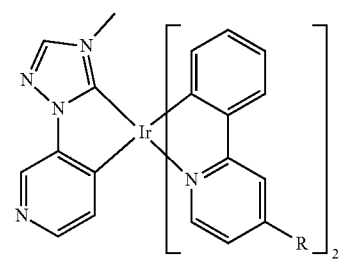
D2-14
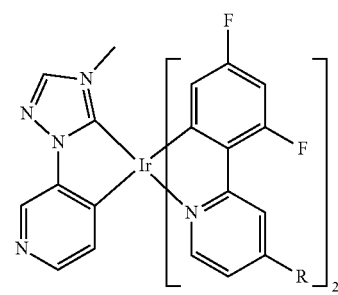
D2-15
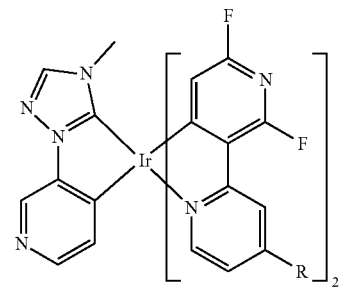
D2-16
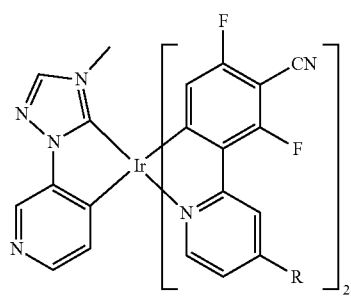
D2-17
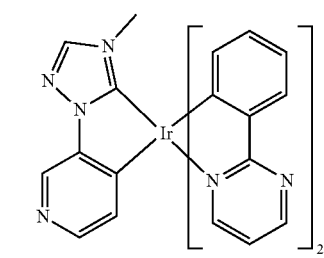
D218
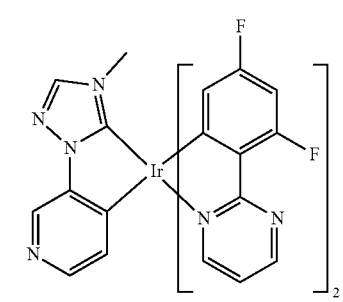
D2-19
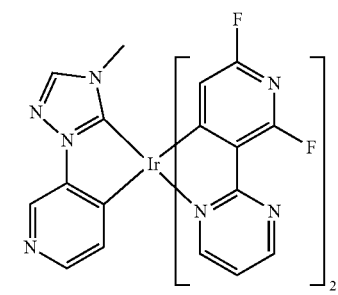
D2-20
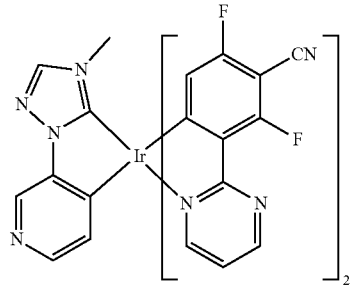

D2-21 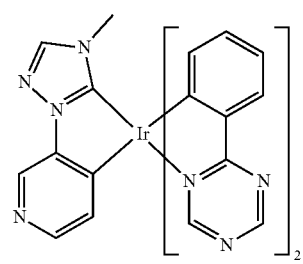
D2-22 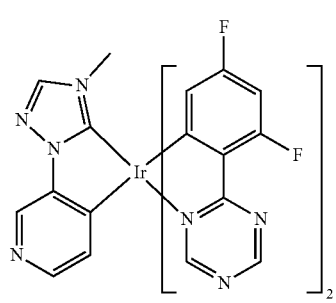
D2-23 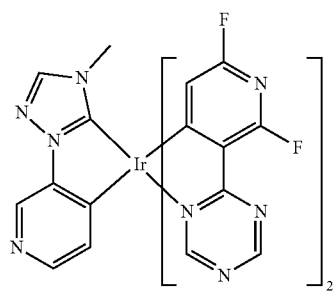
D2-24 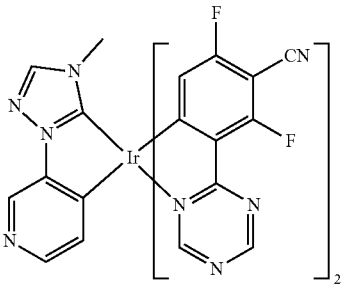
D2-25 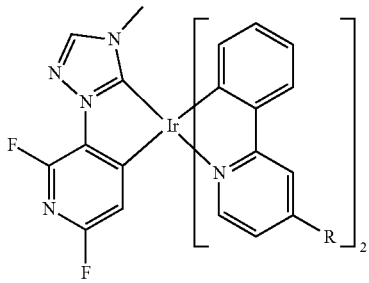
D2-26 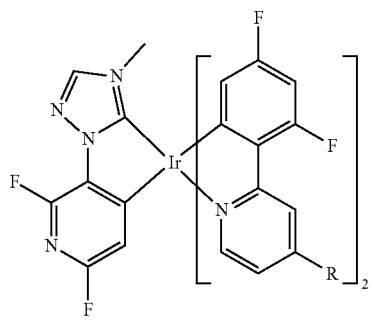
D2-27 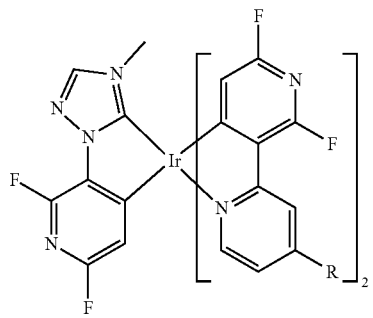
D2-28 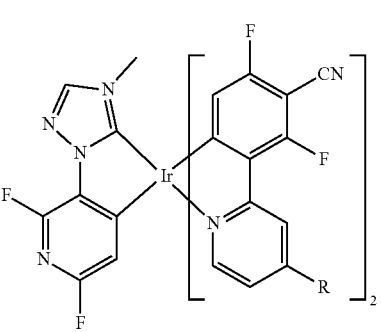
D2-29 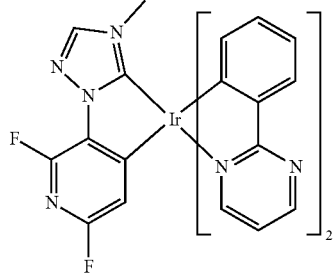
D2-30 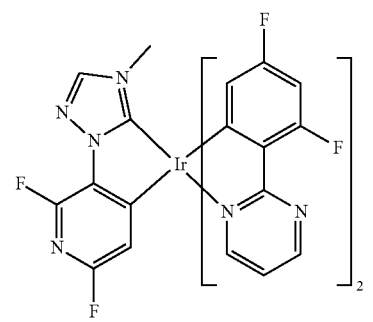

D2-31
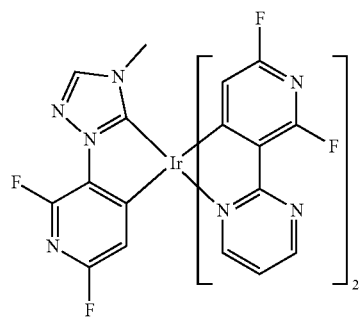
D2-32
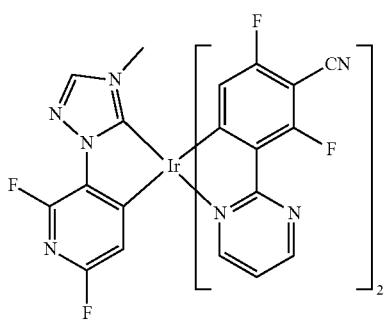
D2-33
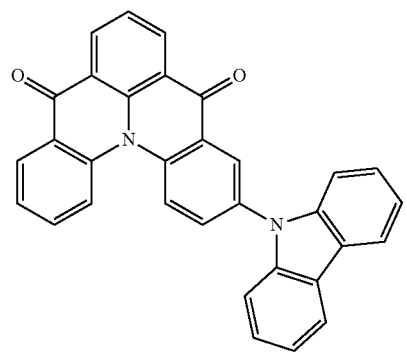
D2-34
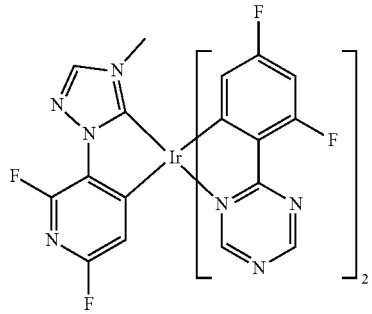
D2-35
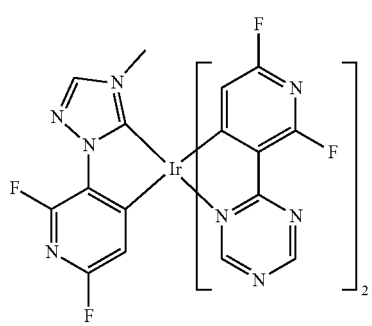
D2-36
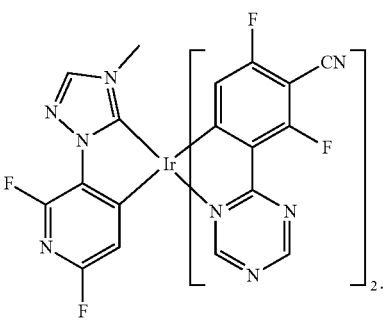
The fourth compound of an embodiment may include at least one selected from the compounds represented in the following Compound Group 4 and Formula 4-2:
Compound Group 4
D1
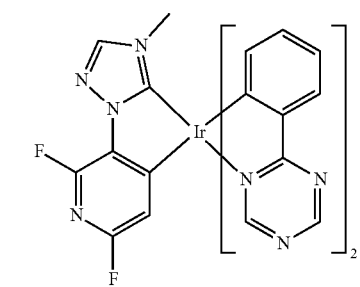
D2
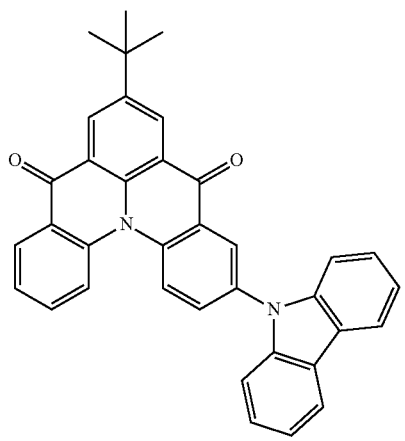

-continued
D3
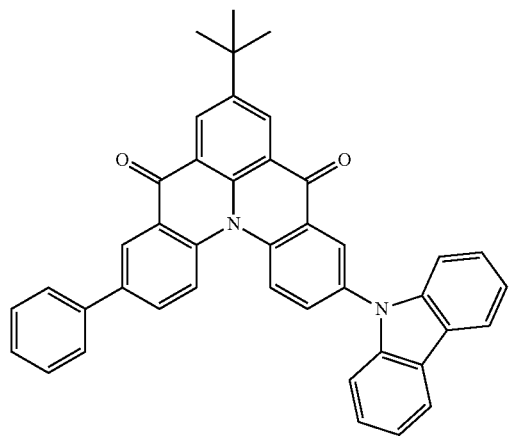
D4
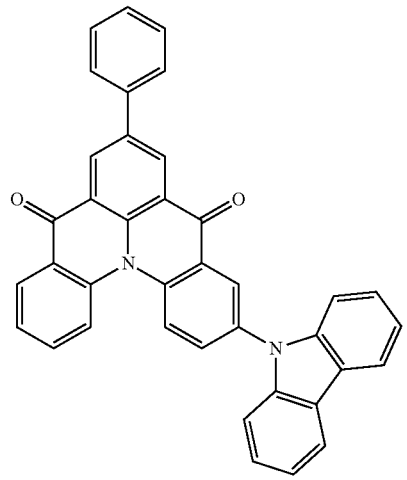
D5
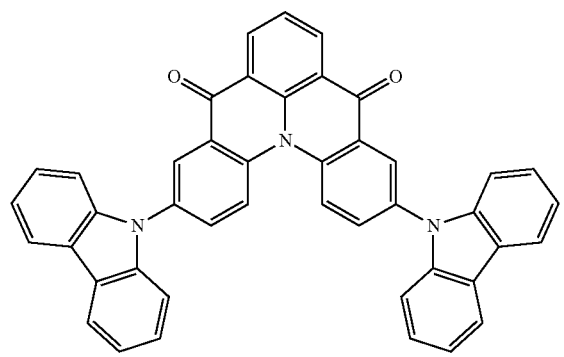
D6
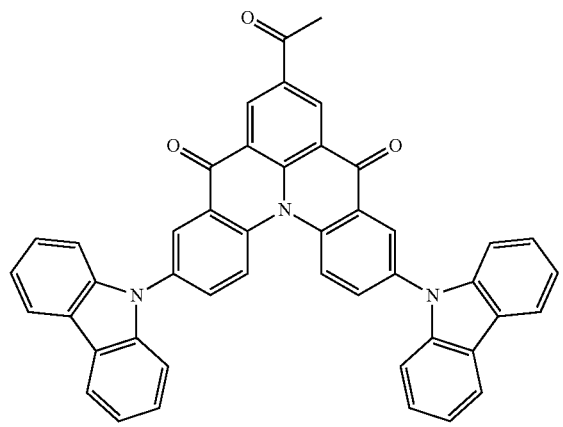
D7
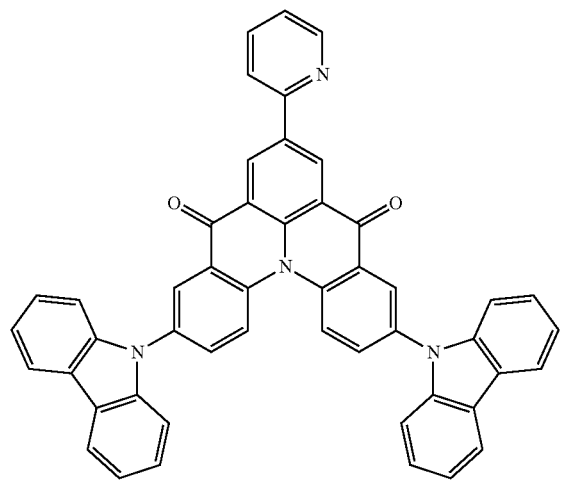
D8
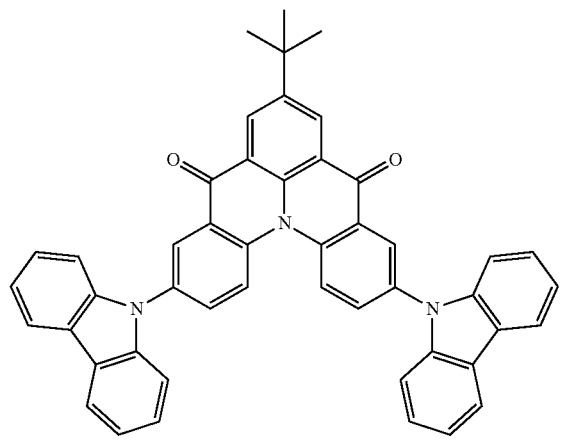

-continued
D9
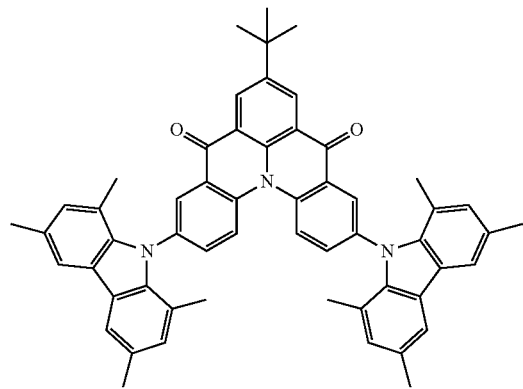
D10
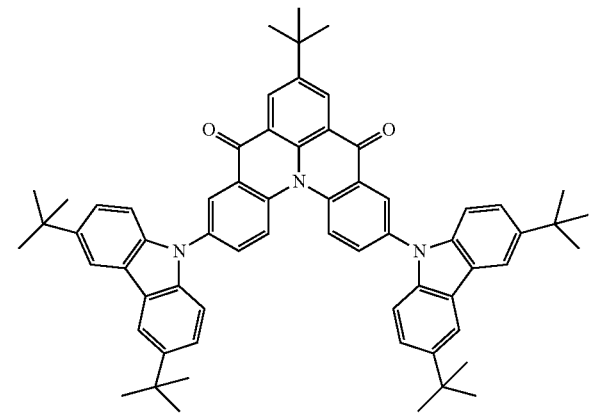
D11
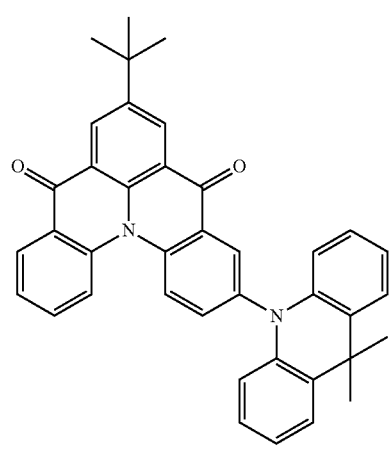
D12
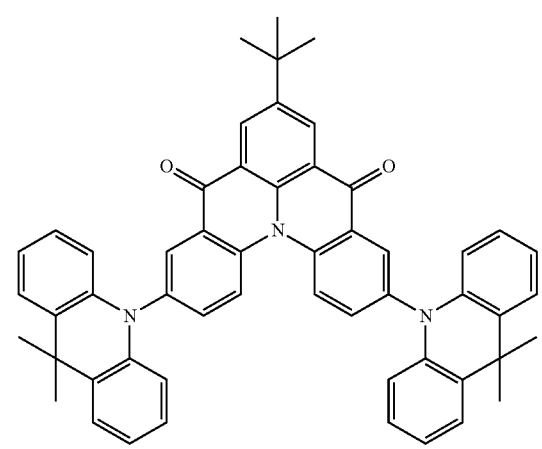
D13
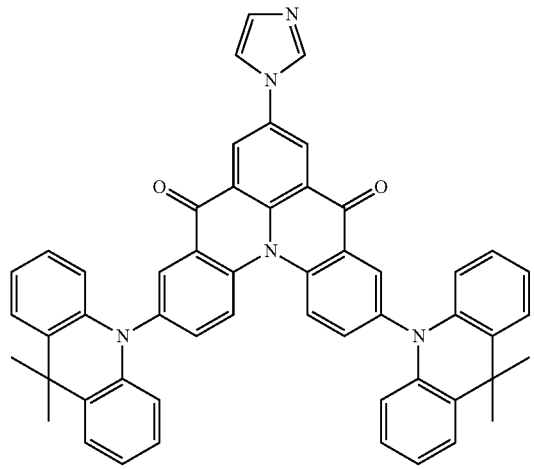
D14
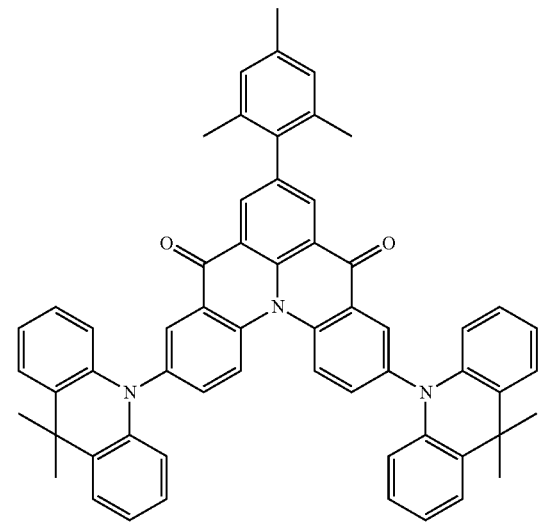

-continued
D15
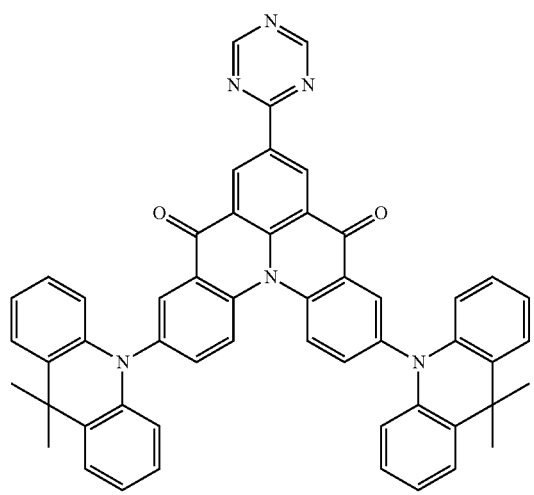
D16
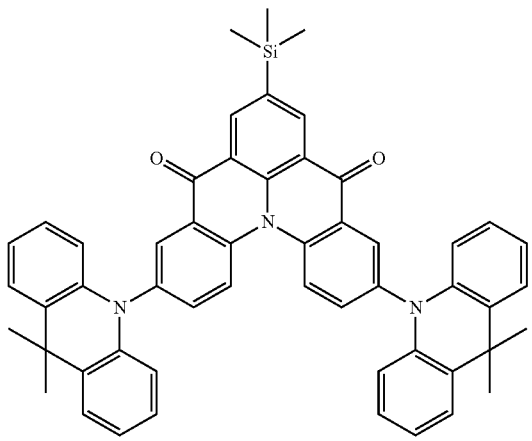
D17
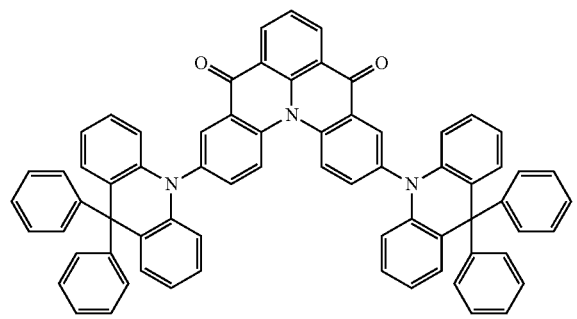
D18
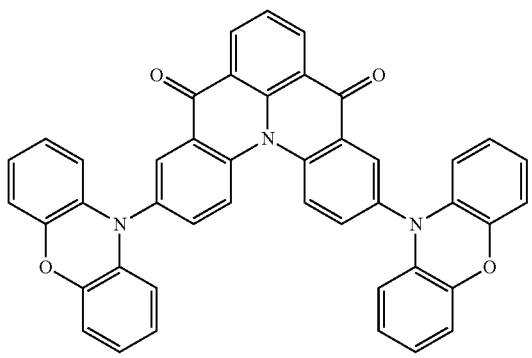
D19
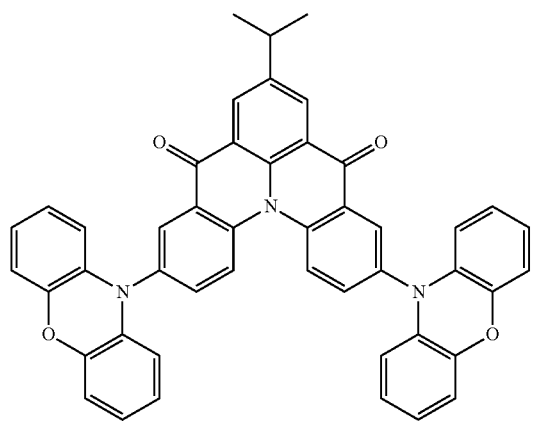
D20
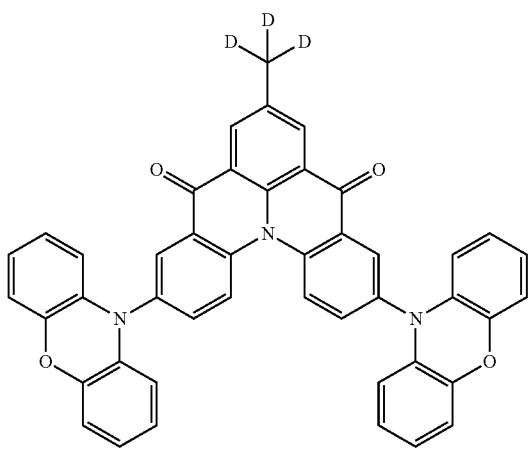

-continued
D21
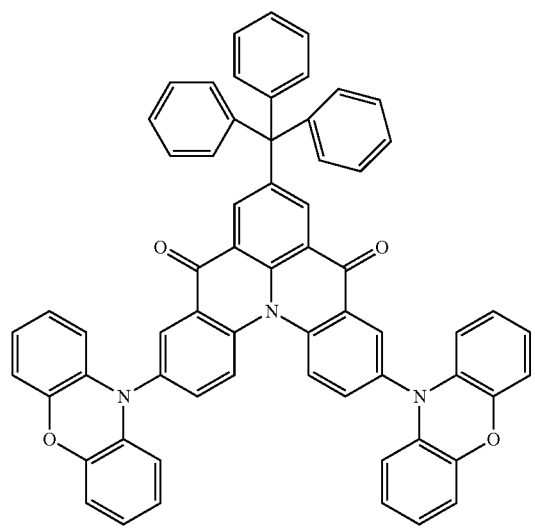
D22
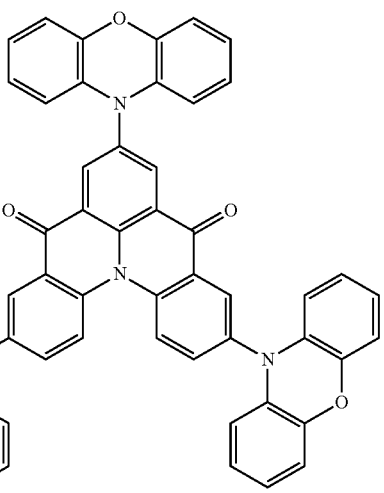
D23
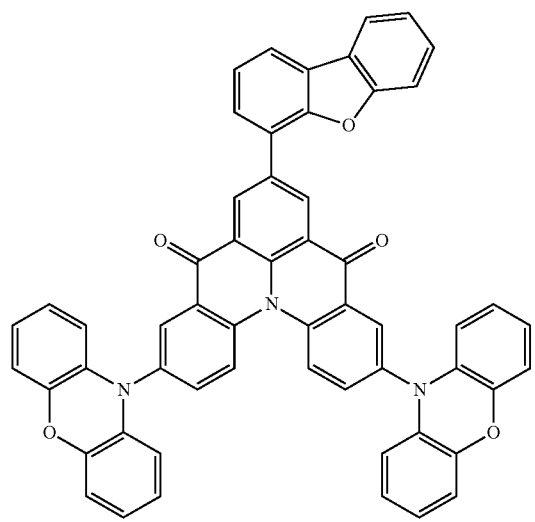
D24
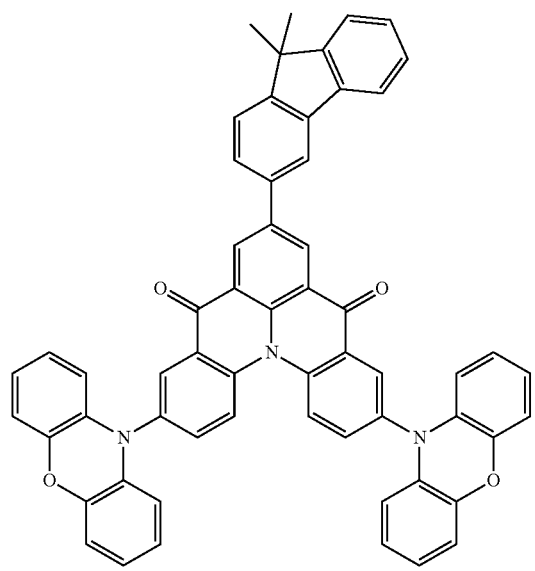
D25
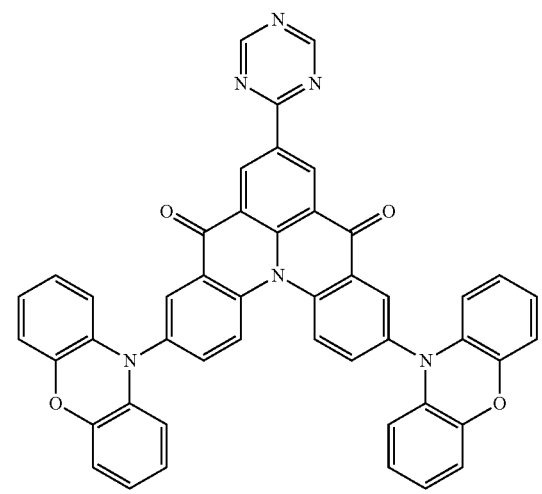
D26

-continued
D27
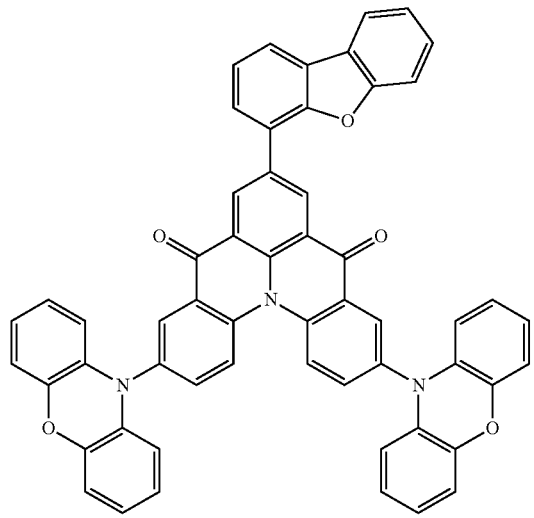
D28
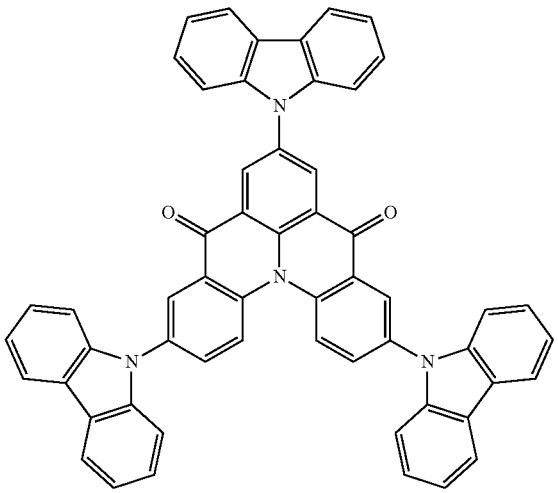
D29
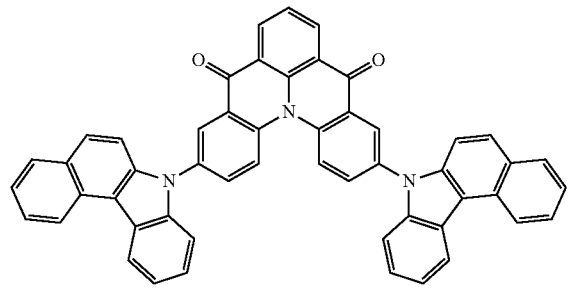
D30
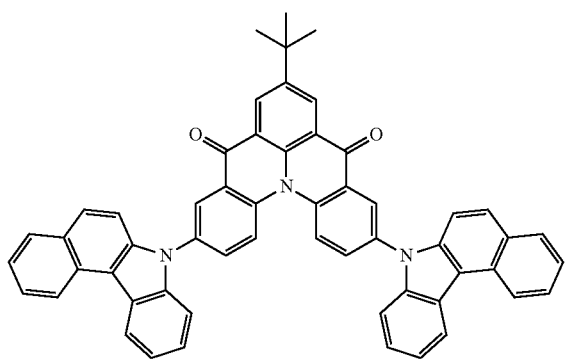
D31
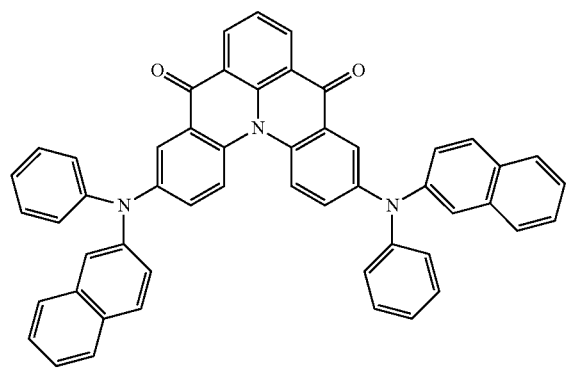
D32
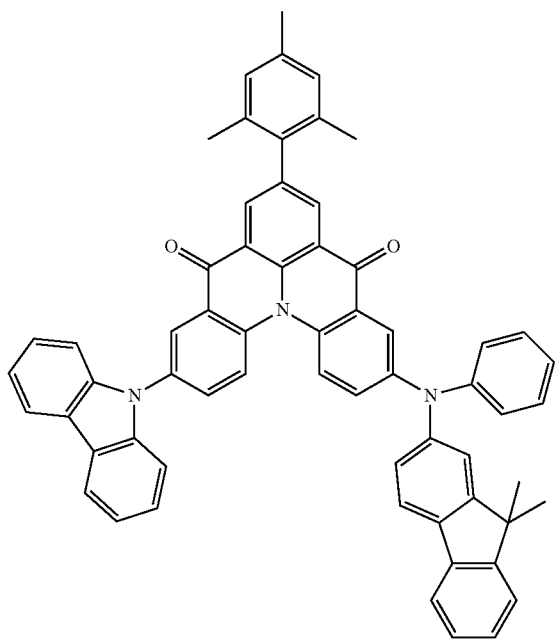

-continued
D33
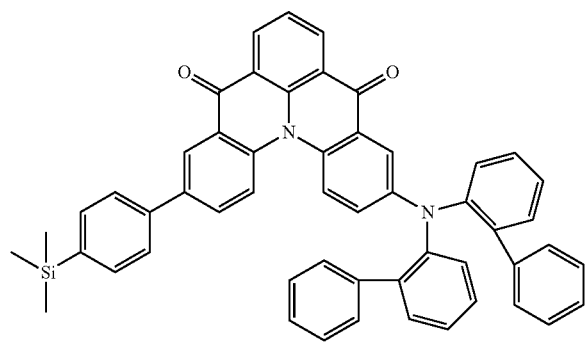
D34
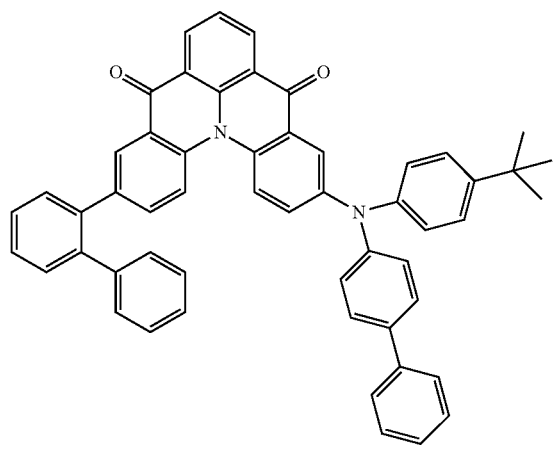
D35
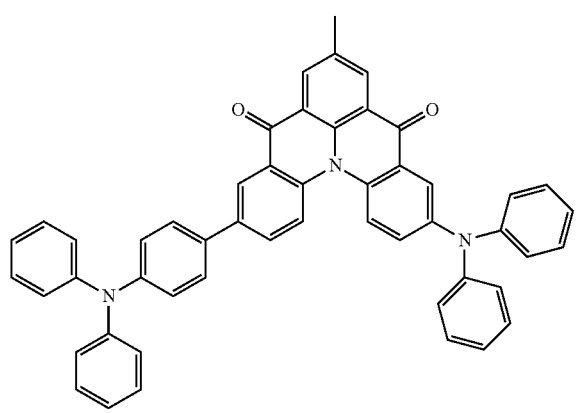
D36
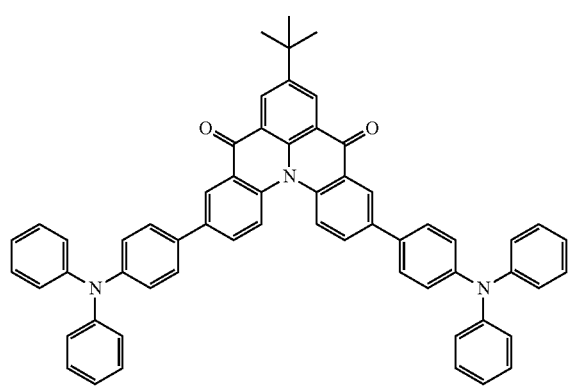
D37
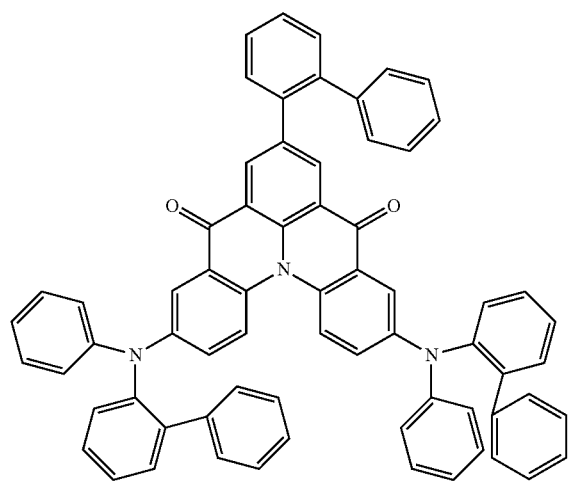
D38
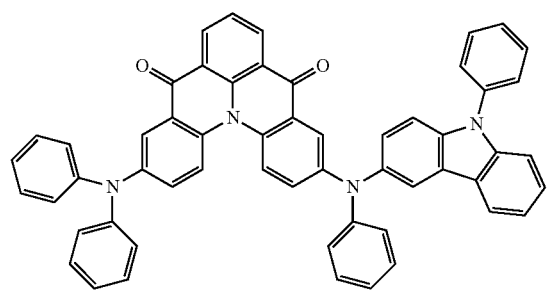

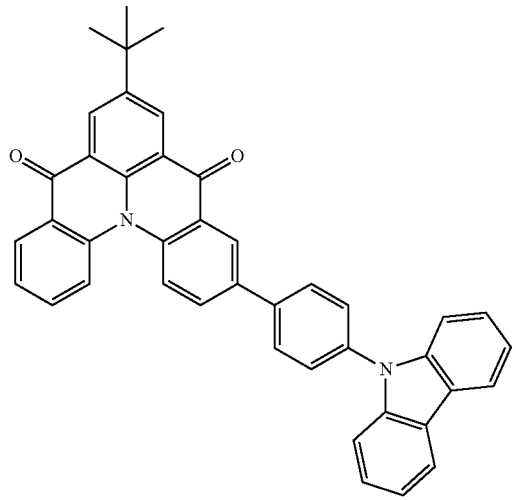

D39

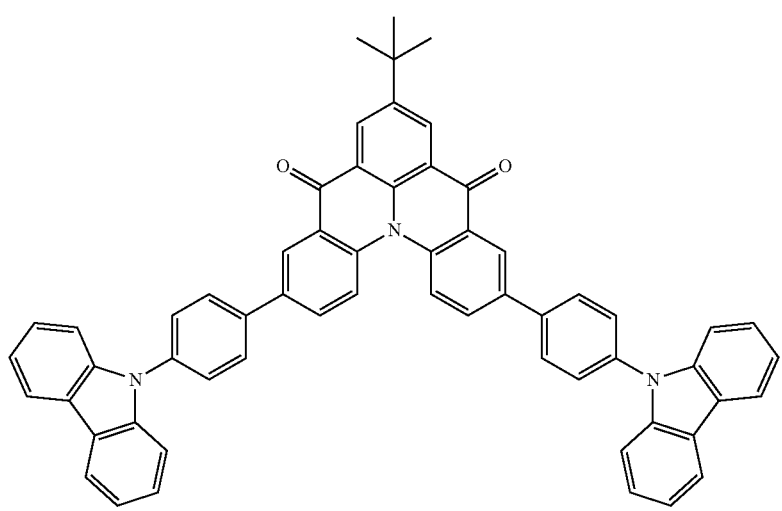

D40

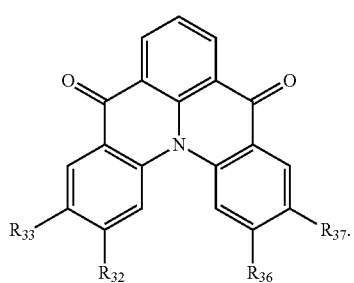

Formula 4-2

In Formula 4-2, in case where $R_{32}$ and $R_{36}$ are hydrogen atoms, $R_{33}$ and $R_{37}$ may each independently be a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group.

In Formula 4-2, in case where $R_{33}$ and $R_{37}$ are hydrogen atoms, $R_{32}$ and $R_{36}$ may each independently be a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group.

For example, in Formula 4-2, $R_{32}$, $R_{33}$, $R_{36}$, and $R_{37}$ may be defined as described in Table 1 below.

TABLE 1

| | $R_{32}$ | $R_{33}$ | $R_{36}$ | $R_{37}$ |
|---|---|---|---|---|
| D41 | H | Carbazole | H | Carbazole |
| D42 | H | Benzofurocarbazole | H | Benzofurocarbazole |
| D43 | H | Thienocarbazole | H | Thienocarbazole |

TABLE 1-continued

| | $R_{32}$ | $R_{33}$ | $R_{36}$ | $R_{37}$ |
|---|---|---|---|---|
| D44 | H | Indolocarbazole | H | Indolocarbazole |
| D45 | H | Bicarbazole | H | Bicarbazole |
| D46 | H | Amine | H | Amine |
| D47 | H | Diamine | H | Diamine |
| D48 | H | Acridane | H | Acridane |
| D49 | H | Phenoxazine | H | Phenoxazine |
| D50 | H | Phenothiazine | H | Phenothiazine |
| D51 | H | Carbazole | H | Benzofurocarbazole |
| D52 | H | Carbazole | H | Thienocarbazole |
| D53 | H | Carbazole | H | Indolocarbazole |
| D54 | H | Carbazole | H | Bicarbazole |
| D55 | H | Carbazole | H | Amine |
| D56 | H | Carbazole | H | Diamine |
| D57 | H | Carbazole | H | Acridane |
| D58 | H | Carbazole | H | Phenoxazine |
| D59 | H | Carbazole | H | Phenothiazine |
| D60 | H | Benzofurocarbazole | H | Carbazole |
| D61 | H | Benzofurocarbazole | H | Thienocarbazole |
| D62 | H | Benzofurocarbazole | H | Indolocarbazole |
| D63 | H | Benzofurocarbazole | H | Bicarbazole |
| D64 | H | Benzofurocarbazole | H | Amine |
| D65 | H | Benzofurocarbazole | H | Diamine |
| D66 | H | Benzofurocarbazole | H | Acridane |
| D67 | H | Benzofurocarbazole | H | Phenoxazine |
| D68 | H | Benzofurocarbazole | H | Phenothiazine |
| D69 | H | Thienocarbazole | H | Carbazole |
| D70 | H | Thienocarbazole | H | Benzofurocarbazole |
| D71 | H | Thienocarbazole | H | Indolocarbazole |
| D72 | H | Thienocarbazole | H | Bicarbazole |
| D73 | H | Thienocarbazole | H | Amine |
| D74 | H | Thienocarbazole | H | Diamine |
| D75 | H | Thienocarbazole | H | Acridane |
| D76 | H | Thienocarbazole | H | Phenoxazine |
| D77 | H | Thienocarbazole | H | Phenothiazine |
| D78 | H | Indolocarbazole | H | Carbazole |
| D79 | H | Indolocarbazole | H | Benzofurocarbazole |
| D80 | H | Indolocarbazole | H | Thienocarbazole |
| D81 | H | Indolocarbazole | H | Bicarbazole |
| D82 | H | Indolocarbazole | H | Amine |
| D83 | H | Indolocarbazole | H | Diamine |
| D84 | H | Indolocarbazole | H | Acridane |
| D85 | H | Indolocarbazole | H | Phenoxazine |
| D86 | H | Indolocarbazole | H | Phenothiazine |
| D87 | H | Bicarbazole | H | Carbazole |
| D88 | H | Bicarbazole | H | Benzofurocarbazole |
| D89 | H | Bicarbazole | H | Thienocarbazole |
| D90 | H | Bicarbazole | H | Indolocarbazole |
| D91 | H | Bicarbazole | H | Amine |
| D92 | H | Bicarbazole | H | Diamine |
| D93 | H | Bicarbazole | H | Acridane |
| D94 | H | Bicarbazole | H | Phenoxazine |
| D95 | H | Bicarbazole | H | Phenothiazine |
| D96 | H | Amine | H | Carbazole |
| D97 | H | Amine | H | Benzofurocarbazole |
| D98 | H | Amine | H | Thienocarbazole |
| D99 | H | Amine | H | Indolocarbazole |
| D100 | H | Amine | H | Bicarbazole |
| D101 | H | Amine | H | Diamine |
| D102 | H | Amine | H | Acridane |
| D103 | H | Amine | H | Phenoxazine |
| D104 | H | Amine | H | Phenothiazine |
| D105 | H | Diamine | H | Carbazole |
| D106 | H | Diamine | H | Benzofurocarbazole |
| D107 | H | Diamine | H | Thienocarbazole |
| D108 | H | Diamine | H | Indolocarbazole |
| D109 | H | Diamine | H | Bicarbazole |
| D110 | H | Diamine | H | Amine |
| D111 | H | Diamine | H | Acridane |
| D112 | H | Diamine | H | Phenoxazine |
| D113 | H | Diamine | H | Phenothiazine |
| D114 | H | Acridane | H | Carbazole |
| D115 | H | Acridane | H | Benzofurocarbazole |
| D116 | H | Acridane | H | Thienocarbazole |
| D117 | H | Acridane | H | Indolocarbazole |
| D118 | H | Acridane | H | Bicarbazole |
| D119 | H | Acridane | H | Amine |
| D120 | H | Acridane | H | Diamine |
| D121 | H | Acridane | H | Phenoxazine |

TABLE 1-continued

| | R$_{32}$ | R$_{33}$ | R$_{36}$ | R$_{37}$ |
|---|---|---|---|---|
| D122 | H | Acridane | H | Phenothiazine |
| D123 | H | Phenoxazine | H | Carbazole |
| D124 | H | Phenoxazine | H | Benzofurocarbazole |
| D125 | H | Phenoxazine | H | Thienocarbazole |
| D126 | H | Phenoxazine | H | Indolocarbazole |
| D127 | H | Phenoxazine | H | Bicarbazole |
| D128 | H | Phenoxazine | H | Amine |
| D129 | H | Phenoxazine | H | Diamine |
| D130 | H | Phenoxazine | H | Acridane |
| D131 | H | Phenoxazine | H | Phenothiazine |
| D132 | H | Phenothiazine | H | Carbazole |
| D133 | H | Phenothiazine | H | Benzofurocarbazole |
| D134 | H | Phenothiazine | H | Thienocarbazole |
| D135 | H | Phenothiazine | H | Indolocarbazole |
| D136 | H | Phenothiazine | H | Bicarbazole |
| D137 | H | Phenothiazine | H | Amine |
| D138 | H | Phenothiazine | H | Diamine |
| D139 | H | Phenothiazine | H | Acridane |
| D140 | H | Phenothiazine | H | Phenoxazine |
| D141 | H | Carbazole | H | Carbazole |
| D142 | H | Benzofurocarbazole | H | Benzofurocarbazole |
| D143 | H | Thienocarbazole | H | Thienocarbazole |
| D144 | H | Indolocarbazole | H | Indolocarbazole |
| D145 | H | Bicarbazole | H | Bicarbazole |
| D146 | H | Amine | H | Amine |
| D147 | H | Diamine | H | Diamine |
| D148 | H | Acridane | H | Acridane |
| D149 | H | Phenoxazine | H | Phenoxazine |
| D150 | H | Phenothiazine | H | Phenothiazine |
| D151 | Carbazole | H | Carbazole | H |
| D152 | Benzofurocarbazole | H | Benzofurocarbazole | H |
| D153 | Thienocarbazole | H | Thienocarbazole | H |
| D154 | Indolocarbazole | H | Indolocarbazole | H |
| D155 | Bicarbazole | H | Bicarbazole | H |
| D156 | Amine | H | Amine | H |
| D157 | Diamine | H | Diamine | H |
| D158 | Acridane | H | Acridane | H |
| D159 | Phenoxazine | H | Phenoxazine | H |
| D160 | Phenothiazine | H | Phenothiazine | H |
| D161 | Carbazole | H | Benzofurocarbazole | H |
| D162 | Carbazole | H | Thienocarbazole | H |
| D163 | Carbazole | H | Indolocarbazole | H |
| D164 | Carbazole | H | Bicarbazole | H |
| D165 | Carbazole | H | Amine | H |
| D166 | Carbazole | H | Diamine | H |
| D167 | Carbazole | H | Acridane | H |
| D168 | Carbazole | H | Phenoxazine | H |
| D169 | Carbazole | H | Phenothiazine | H |
| D170 | Benzofurocarbazole | H | Carbazole | H |
| D171 | Benzofurocarbazole | H | Thienocarbazole | H |
| D172 | Benzofurocarbazole | H | Indolocarbazole | H |
| D173 | Benzofurocarbazole | H | Bicarbazole | H |
| D174 | Benzofurocarbazole | H | Amine | H |
| D175 | Benzofurocarbazole | H | Diamine | H |
| D176 | Benzofuroarbazole | H | Acridane | H |
| D177 | Benzofurocarbazole | H | Phenoxazine | H |
| D178 | Benzofurocarbazole | H | Phenothiazine | H |
| D179 | Thienocarbazole | H | Carbazole | H |
| D180 | Thienocarbazole | H | Benzofurocarbazole | H |
| D181 | Thienocarbazole | H | Indolocarbazole | H |
| D182 | Thienocarbazole | H | Bicarbazole | H |
| D183 | Thienocarbazole | H | Amine | H |
| D184 | Thienocarbazole | H | Diamine | H |
| D185 | Thienocarbazole | H | Acridane | H |
| D186 | Thienocarbazole | H | Phenoxazine | H |
| D187 | Thienocarbazole | H | Phenothiazine | H |
| D188 | Indolocarbazole | H | Carbazole | H |
| D189 | Indolocarbazole | H | Benzofurocarbazole | H |
| D190 | Indolocarbazole | H | Thienocarbazole | H |
| D191 | Indolocarbazole | H | Bicarbazole | H |
| D192 | Indolocarbazole | H | Amine | H |
| D193 | Indolocarbazole | H | Diamine | H |
| D194 | Indolocarbazole | H | Acridane | H |
| D195 | Indolocarbazole | H | Phenoxazine | H |
| D196 | Indolocarbazole | H | Phenothiazine | H |
| D197 | Bicarbazole | H | Carbazole | H |
| D198 | Bicarbazole | H | Benzofurocarbazole | H |
| D199 | Bicarbazole | H | Thienocarbazole | H |

TABLE 1-continued

| | $R_{32}$ | $R_{33}$ | $R_{36}$ | $R_{37}$ |
|---|---|---|---|---|
| D200 | Bicarbazole | H | Indolocarbazole | H |
| D201 | Bicarbazole | H | Amine | H |
| D202 | Bicarbazole | H | Diamine | H |
| D203 | Bicarbazole | H | Acridane | H |
| D204 | Bicarbazole | H | Phenoxazine | H |
| D205 | Bicarbazole | H | Phenothiazine | H |
| D206 | Amine | H | Carbazole | H |
| D207 | Amine | H | Benzofurocarbazole | H |
| D208 | Amine | H | Thienocarbazole | H |
| D209 | Amine | H | Indolocarbazole | H |
| D210 | Amine | H | Bicarbazole | H |
| D211 | Amine | H | Diamine | H |
| D212 | Amine | H | Acridane | H |
| D213 | Amine | H | Phenoxazine | H |
| D214 | Amine | H | Phenothiazine | H |
| D215 | Diamine | H | Carbazole | H |
| D216 | Diamine | H | Benzofurocarbazole | H |
| D217 | Diamine | H | Thienocarbazole | H |
| D218 | Diamine | H | Indolocarbazole | H |
| D219 | Diamine | H | Bicarbazole | H |
| D220 | Diamine | H | Amine | H |
| D221 | Diamine | H | Acridane | H |
| D222 | Diamine | H | Phenoxazine | H |
| D223 | Diamine | H | Phenothiazine | H |
| D224 | Acridane | H | Carbazole | H |
| D225 | Acridane | H | Benzofurocarbazole | H |
| D226 | Acridane | H | Thienocarbazole | H |
| D227 | Acridane | H | Indolocarbazole | H |
| D228 | Acridane | H | Bicarbazole | H |
| D229 | Acridane | H | Amine | H |
| D230 | Acridane | H | Diamine | H |
| D231 | Acridane | H | Phenoxazine | H |
| D232 | Acridane | H | Phenothiazine | H |
| D233 | Phenoxazine | H | Carbazole | H |
| D234 | Phenoxazine | H | Benzofurocarbazole | H |
| D235 | Phenoxazine | H | Thienocarbazole | H |
| D236 | Phenoxazine | H | Indolocarbazole | H |
| D237 | Phenoxazine | H | Bicarbazole | H |
| D238 | Phenoxazine | H | Amine | H |
| D239 | Phenoxazine | H | Diamine | H |
| D240 | Phenoxazine | H | Acridane | H |
| D241 | Phenoxazine | H | Phenothiazine | H |
| D242 | Phenothiazine | H | Carbazole | H |
| D243 | Phenothiazine | H | Benzofurocarbazole | H |
| D244 | Phenothiazine | H | Thienocarbazole | H |
| D245 | Phenothiazine | H | Indolocarbazole | H |
| D246 | Phenothiazine | H | Bicarbazole | H |
| D247 | Phenothiazine | H | Amine | H |
| D248 | Phenothiazine | H | Diamine | H |
| D249 | Phenothiazine | H | Acridane | H |
| D250 | Phenothiazine | H | Phenoxazine | H |

In Table 1, the carbazole group, the benzofurocarbazole group, the thienocarbazole group, the indolocarbazole group, the bicarbazole group, the monoamine group, the diamine group, the acridane group, the phenoxazine group, and the phenothiazine group may each independently be substituted or unsubstituted.

In the organic electroluminescence devices 10 of embodiments shown in FIGS. 1 to 4, an emission layer EML may include a host and a dopant. The emission layer EML may include two or more host compounds and dopant compounds, respectively.

The first compound of an embodiment may be used as a host material in the emission layer EML. Because the first compound of an embodiment includes a dibenzoheterocycle such as a carbazole group and/or a dibenzofuran group, the first compound may be a host compound having excellent (or suitable) hole transport properties.

The second compound of an embodiment may be used as a host material in the emission layer EML. Because the second compound of an embodiment includes a triazine group and/or a cyano group, the second compound may be a host compound having excellent (or suitable) electron transport properties.

The emission layer of an embodiment includes the first compound having excellent (or suitable) hole transport properties as a first host, and the second compound having excellent (or suitable) electron transport properties as a second host. Accordingly, efficient energy transfer from the host to the dopant may be available.

The third compound of an embodiment may be a phosphorescence dopant compound. The third compound of an embodiment may have a higher lowest triplet energy level than the fourth compound of an embodiment. The third compound of an embodiment may transfer the energy transferred from the host to the fourth compound. For example, the third compound of an embodiment may be included in the emission layer EML and used as an assistant dopant, which assists the light emission of a light-emitting dopant.

The fourth compound of an embodiment may be a thermally activated delayed fluorescence (TADF) dopant. The fourth compound of an embodiment may be used as a light-emitting dopant in the emission layer EML. In an embodiment, the fourth compound may emit blue light. For example, the emission layer EML may emit fluorescence, more particularly, delayed fluorescence. The emission layer EML may emit blue light as delayed fluorescence.

The emission layer of an embodiment includes the third compound and the fourth compound. The third compound, which is the assistant dopant, may accelerate the delayed fluorescence of the fourth compound. Accordingly, the emission layer of an embodiment may show improved emission efficiency. In some embodiments, in case of accelerating delayed fluorescence, excitons formed in the emission layer are not accumulated in the emission layer but rapidly emit light, thereby decreasing the deterioration of a device. Accordingly, the life of an organic electroluminescence device of an embodiment may increase.

The amount of the third compound in the emission layer EML may be from about 10 wt % to about 15 wt % based on the total weight of the first compound, the second compound, the third compound, and the fourth compound. The amount of the fourth compound in the emission layer EML may be from about 1 wt % to about 5 wt % based on the total weight of the first compound, the second compound, the third compound, and the fourth compound.

When the amounts of the third compound and the fourth compound satisfy the above-described ratios, energy may be efficiently (or suitably) transferred from the third compound to the fourth compound. Accordingly, emission efficiency and device life may increase.

In the emission layer EML, the first compound and the second compound may comprise the total weight (amount), minus the weights (amounts) of the third compound and the fourth compound. For example, the amount of the first compound and the second compound in the emission layer EML may be from about 80 wt % to about 89 wt % based on the total weight of the first compound, the second compound, the third compound, and the fourth compound. The weight ratio of the first compound to the second compound may be from about 3:7 to about 7:3 in the total weight of the first compound and the second compound.

When the amount of the first compound and the second compound satisfies the above-described ratio, charge balance properties in the emission layer EML may be improved, and emission efficiency and device life may increase. When the amount of the first compound and the second compound deviates from the above-described ratio range, charge balance in the emission layer EML may be broken (or reduced), and emission efficiency may be degraded, and a device may be easily deteriorated.

When the amounts of the first to fourth compounds in the emission layer EML satisfy the above-described ranges, excellent emission efficiency and long life may be achieved.

In the organic electroluminescence device 10 of an embodiment, the emission layer EML may further include any of anthracene derivatives, pyrene derivatives, fluoranthene derivatives, chrysene derivatives, dihydrobenzanthracene derivatives, or triphenylene derivatives. For example, the emission layer EML may include anthracene derivatives and/or pyrene derivatives.

The emission layer EML may include a compound represented by Formula 2-1 as the second compound and a compound represented by Formula 3-1 as the third compound. In some embodiments, the emission layer EML may include a compound represented by Formula 2-1 as the second compound and a compound represented by Formula 3-2 as the third compound. In some embodiments, the emission layer EML may include a compound represented by Formula 2-2 as the second compound and a compound represented by Formula 3-1 as the third compound. However, embodiments of the present disclosure are not limited thereto. For example, the emission layer EML may include a compound represented by Formula 2-2 as the second compound and a compound represented by Formula 3-2 as the third compound.

The emission layer EML may further include any suitable host materials. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), tris(4-carbazolyl-9-ylphenyl)amine (TCTA), or 1,3,5-tris(1-phenyl-1H-benzo[d]imidazol-2-yl)benzene (TPBi). However, an embodiment of the present disclosure is not limited thereto. For example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), tris(4-carbazolyl-9-ylphenyl)amine (TCTA), 1,3,5-tris(1-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. may be used as the host material.

In an embodiment, the emission layer EML may include, as the dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, 1,4-bis(N,N-diphenylamino)pyrene), etc.

In the organic electroluminescence devices 10 of embodiments shown in FIGS. 1 to 4, the electron transport region ETR may be provided on the emission layer EML. The electron transport region ETR may include at least one of a hole blocking layer HBL, an electron transport layer ETL, or an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure formed using a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. An embodiment of the present disclosure is not limited thereto, but the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), 1,3-bis[3,5-di(pyridine-3-yl)phenyl]benzene (BmPyPhB), or a mixture thereof. The thickness of the electron transport layer ETL may be from about 100 Å to about 1,000 Å and may be, for example, from about 150 Å to about 500 Å. When the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may use a metal halide (such as LiF, NaCl, CsF, RbCl and/or RbI), a metal in lanthanoides (such as Yb), a metal oxide (such as $Li_2O$ and/or BaO), and/or lithium quinolate (LiQ). However, an embodiment of the present disclosure is not limited thereto. The electron injection layer EIL may also be formed using a mixture material of an electron transport material and an insulating organo metal salt. The organo metal salt may be a material having an energy band gap of about 4 eV or more. In some embodiments, the organo metal salt may include, for example, metal acetates, metal benzoates, metal acetoacetates, metal acetylacetonates, and/or metal stearates. The thickness of the electron injection layer EIL may be from about 1 Å to about 100 Å, or from about 3 Å to about 90 Å. When the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the present disclosure is not limited thereto.

The second electrode EL2 may be provided on the electron transport region ETR. The second electrode EL2 may be a common electrode and/or a cathode. The second electrode EL2 may be a transmissive electrode, a transflective electrode, or a reflective electrode. If the second electrode EL2 is the transmissive electrode, the second electrode EL2 may be formed using a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the second electrode EL2 may have a multi-layered structure including a reflective layer or a transflective layer formed using any of the above-described materials and a transparent conductive layer formed using ITO, IZO, ZnO, ITZO, etc.

In some embodiments, the second electrode EL2 may be connected with an auxiliary electrode. If the second electrode EL2 is connected with the auxiliary electrode, the resistance of the second electrode EL2 may decrease.

On the second electrode EL2 of the organic electroluminescence device 10 of an embodiment, a capping layer CPL may be further provided. The capping layer CPL may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4''-tris(carbazol-9-yl)triphenylamine (TCTA), N,N'-bis(naphthalen-1-yl), etc.

The above-described compounds of an embodiment may be included in a functional layer other than the hole transport region HTR as a material for the organic electroluminescence device 10. The organic electroluminescence device 10 according to an embodiment of the present disclosure may include any of the above-described compounds in at least one functional layer between the first electrode EU and the second electrode EL2, and/or in the capping layer CPL on the second electrode EL2.

In the organic electroluminescence device 10, according to the application of voltages to the first electrode EL1 and second electrode EL2, respectively, holes injected from the first electrode EL1 move via the hole transport region HTR to the emission layer EML, and electrons injected from the second electrode EL2 move through the electron transport region ETR to the emission layer EML. Electrons and holes are recombined in the emission layer EML to produce excitons, and the excitons emit light via the transition from an excited state to a ground state.

Hereinafter, the compounds according to the present embodiments and the organic electroluminescence device including the compounds will be particularly explained referring to embodiments and comparative embodiments. The following embodiments are only illustrations to assist the understanding of the present disclosure, and the scope of the present disclosure is not limited thereto.

1. Manufacture and Evaluation of an Organic Electroluminescence Device According to an Embodiment 1-1. Example of an Organic Electroluminescence Device Including First to Fourth Compounds (Manufacture of an Organic Electroluminescence Device)

Organic electroluminescence devices of Examples 1 to 30 and Comparative Examples 1 to 27 were manufactured as follows. A glass substrate on which ITO was deposited to about 500 Å was cut into a size of about 50 mm×50 mm×0.5 mm, washed by ultrasonic waves using isopropyl alcohol and distilled water for 10 minutes, respectively, washed by exposing to ultraviolet light and then ozone for about 10 minutes, and then installed in a vacuum deposition apparatus. Then, a hole injection layer HIL was formed using 2-MTDATA to a thickness of about 40 Å, and a hole transport layer HTL was formed using NPB to a thickness of about 10 Å. After that, the first compound, the second compound, the third compound, and the fourth compound of the present embodiments were co-deposited in a weight ratio of 44.5:44.5:10:1 to form an emission layer EML to a thickness of about 300 Å. An electron transport layer ETL was formed using an ETL1 compound to a thickness of about 300 Å. Then, a second electrode EL2 was formed using Al to a thickness of about 1,200 Å. Each layer was formed by a vacuum deposition method.

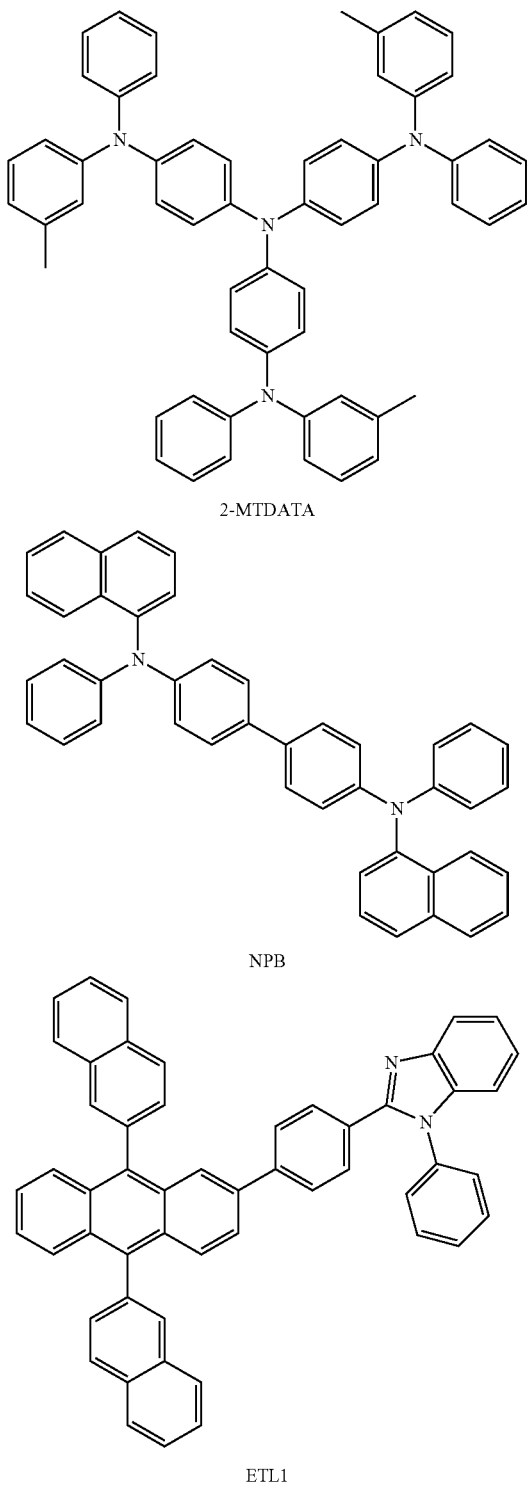

2-MTDATA

NPB

ETL1

The combination of the materials for the emission layer used in the Examples and the Comparative Examples are shown in Table 2 below.

TABLE 2

| Device manufacturing example | First compound | Second compound | Third compound | Fourth compound |
|---|---|---|---|---|
| Example 1 | HT1 | ET2 | D1-1 | D42 |
| Example 2 | HT3 | ET4 | D1-3 | D44 |
| Example 3 | HT5 | ET6 | D1-5 | D46 |
| Example 4 | HT7 | ET8 | D1-7 | D48 |
| Example 5 | HT9 | ET10 | D1-9 | D50 |
| Example 6 | HT1 | ET2 | D2-1-4 | D50 |
| Example 7 | HT3 | ET4 | D2-2-2 | D67 |
| Example 8 | HT6 | ET5 | D2-9 | D70 |
| Example 9 | HT8 | ET8 | D2-4-1 | D70 |
| Example 10 | HT6 | ET15 | D2-16-1 | D67 |
| Example 11 | HT9 | ET8 | D2-14-2 | D60 |
| Example 12 | HT7 | ET15 | D2-6 | D60 |
| Example 13 | HT4 | ET5 | D2-4-1 | D60 |
| Example 14 | HT8 | ET15 | D2-3-1 | D67 |
| Example 15 | HT12 | ET15 | D2-2-3 | D70 |
| Example 16 | HT1 | ET2 | D2-1-2 | D3 |
| Example 17 | HT3 | ET3 | D2-2-1 | D5 |
| Example 18 | HT3 | ET5 | D2-2-5 | D5 |
| Example 19 | HT6 | ET6 | D2-4-5 | D8 |
| Example 20 | HT8 | ET6 | D2-13-4 | D8 |
| Example 21 | HT8 | ET8 | D2-14-5 | D9 |
| Example 22 | HT11 | ET10 | D2-15-5 | D12 |
| Example 23 | HT12 | ET13 | D2-25-3 | D20 |
| Example 24 | HT15 | ET14 | D2-27-3 | D27 |
| Example 25 | HT17 | ET15 | D2-28-5 | D29 |
| Example 26 | HT1 | ET1 | D1-1 | D44 |
| Example 27 | HT4 | ET2 | D1-3 | D65 |
| Example 28 | HT6 | ET3 | D1-2 | D228 |
| Example 29 | HT8 | ET7 | D1-11 | D81 |
| Example 30 | HT12 | ET15 | D1-8 | D48 |
| Comparative Example 1 | HT1 | — | D1-1 | D41 |
| Comparative Example 2 | HT5 | — | D1-3 | D45 |
| Comparative Example 3 | ET1 | — | D1-3 | D45 |
| Comparative Example 4 | ET5 | — | D1-5 | D45 |
| Comparative Example 5 | HT4 | — | D1-8 | D43 |
| Comparative Example 6 | HT1 | — | D2-14-2 | D50 |
| Comparative Example 7 | — | ET3 | D2-6 | D57 |
| Comparative Example 8 | HT5 | — | D2-4-1 | D60 |
| Comparative Example 9 | — | ET6 | D2-3-5 | D60 |
| Comparative Example 10 | HT8 | — | D2-14-2 | D57 |
| Comparative Example 11 | — | ET15 | D2-6 | D50 |
| Comparative Example 12 | HT7 | — | D2-4-1 | D50 |
| Comparative Example 13 | HT4 | — | D2-2-3 | D60 |
| Comparative Example 14 | HT1 | — | D2-1-1 | D5 |
| Comparative Example 15 | HT5 | — | D2-1-3 | D11 |
| Comparative Example 16 | — | ET1 | D2-1-5 | D13 |
| Comparative Example 17 | — | ET5 | D2-2-5 | D24 |
| Comparative Example 18 | HT4 | — | D2-4-3 | D32 |
| Comparative Example 19 | HT1 | — | D1-1 | D90 |
| Comparative Example 20 | HT5 | — | D1-2 | D65 |
| Comparative | — | ET1 | D1-4 | D138 |

TABLE 2-continued

| Device manufacturing example | First compound | Second compound | Third compound | Fourth compound |
|---|---|---|---|---|
| Example 21 | | | | |
| Comparative Example 22 | — | ET5 | D1-10 | D63 |
| Comparative Example 23 | HT4 | — | D1-8 | D48 |
| Comparative Example 24 | HT1 | ET15 | — | D01 |
| Comparative Example 25 | HT5 | ET15 | D1-10 | — |
| Comparative Example 26 | HT1 | ET5 | — | D06 |
| Comparative Example 27 | HT5 | ET5 | D2-4-1 | — |

(Evaluation of Properties of Organic Electroluminescence Device)

The evaluation of the properties of the organic electroluminescence devices was conducted using a brightness light distribution characteristics measurement system. In order to evaluate the properties of the organic electroluminescence devices according to the Examples and the Comparative examples, driving voltage, luminance, efficiency, emission wavelength, and life ($T_{90}$) were measured. In Table 3, emission efficiency (cd/A) at a current density of about 10 mA/cm², and a luminance of about 1,000 cd/m², of the organic electroluminescence devices thus manufactured is shown. Also, device life ($T_{90}$), which is a time period required for decreasing the luminance from a standard of 1,000 cd/m² to a 90% degree, is shown. The device life ($T_{90}$) was measured by continuously driving at a current density of about 10 mA/cm², and its unit was hour. In some embodiments, the luminance spectrum of the Examples and the Comparative Examples was measured by a spectroradiometer. From the spectrum thus measured, emission peak, which was the maximum emission wavelength, was measured.

TABLE 3

| Device manufacturing example | Device life ($T_{90}$, h) | Emission efficiency (cd/A) | Maximum emission wavelength (nm) |
|---|---|---|---|
| Example 1 | 20 | 140.89 | 457 |
| Example 2 | 21 | 135.26 | 457 |
| Example 3 | 32 | 144.16 | 458 |
| Example 4 | 18 | 128.56 | 455 |
| Example 5 | 24 | 126.68 | 458 |
| Example 6 | 21 | 135.26 | 457 |
| Example 7 | 32 | 144.16 | 458 |
| Example 8 | 18 | 128.56 | 455 |
| Example 9 | 24 | 126.68 | 458 |
| Example 10 | 21 | 130.5 | 457 |
| Example 11 | 32 | 100.45 | 458 |
| Example 12 | 18 | 110.67 | 455 |
| Example 13 | 24 | 134.68 | 458 |
| Example 14 | 24 | 121.68 | 458 |
| Example 15 | 24 | 137.68 | 458 |
| Example 16 | 15 | 111.16 | 457 |
| Example 17 | 20 | 135.56 | 457 |
| Example 18 | 35 | 127.68 | 457 |
| Example 19 | 36 | 111.26 | 457 |
| Example 20 | 45 | 100.16 | 457 |
| Example 21 | 40 | 106.7 | 457 |
| Example 22 | 32 | 132.5 | 457 |
| Example 23 | 41 | 126.7 | 457 |
| Example 24 | 40 | 122.2 | 457 |
| Example 25 | 35 | 128.9 | 457 |
| Example 26 | 14 | 119.5 | 457 |
| Example 27 | 10 | 100.45 | 457 |
| Example 28 | 19 | 110.67 | 457 |
| Example 29 | 31 | 117.4 | 457 |
| Example 30 | 54 | 134.5 | 453 |
| Comparative Example 1 | 3 | 54.25 | 458 |
| Comparative Example 2 | 2 | 28.33 | 458 |
| Comparative Example 3 | 0.8 | 25.36 | 477 |
| Comparative Example 4 | 3 | 39.46 | 465 |
| Comparative Example 5 | 1 | 28.55 | 475 |
| Comparative Example 6 | 0.1 | 38.4 | 458 |
| Comparative Example 7 | 0.5 | 13.56 | 456 |
| Comparative Example 8 | 0.7 | 19.56 | 485 |
| Comparative Example 9 | 1.0 | 29.00 | 485 |
| Comparative Example 10 | 2.0 | 34.17 | 465 |
| Comparative Example 11 | 0.1 | 56.54 | 458 |
| Comparative Example 12 | 0.5 | 27.56 | 456 |
| Comparative Example 13 | 0.7 | 19.56 | 485 |
| Comparative Example 14 | 1.0 | 29.00 | 485 |
| Comparative Example 15 | 2.0 | 14.17 | 465 |
| Comparative Example 16 | 0.5 | 15 | 485 |
| Comparative Example 17 | 0.5 | 25 | 485 |
| Comparative Example 18 | 2.0 | 38 | 465 |
| Comparative Example 19 | 0.1 | 8.54 | 458 |
| Comparative Example 20 | 0.5 | 10.56 | 456 |
| Comparative Example 21 | 0.7 | 15.56 | 485 |
| Comparative Example 22 | 1.0 | 29.00 | 485 |
| Comparative Example 23 | 2.0 | 14.17 | 465 |
| Comparative Example 24 | 0.5 | 38.2 | 457 |
| Comparative Example 25 | 0.5 | 45.3 | 457 |
| Comparative Example 26 | 3 | 43.1 | 458 |
| Comparative Example 27 | 3 | 44.7 | 468 |

Referring to the results of Table 3, the first compound to fourth compound according to embodiments of the present disclosure are materials for an emission layer EML, to emit blue color, and when applied to an organic electroluminescence device 10, the high efficiency, and the long life of a device may be achieved.

Referring to the results of Examples 1 to 30 and Comparative Examples 1 to 27, it could be found that the Examples, which include the first compound represented by Formula 1, the second compound represented by Formula 2, the third compound represented by Formula 3, and the fourth compound represented by Formula 4, as the materials for an emission layer, achieved higher efficiency, and longer life when compared with the Comparative Examples, which do not include one or both of the first compound and the second compound, or do not include one or both of the third compound and the fourth compound.

More particularly, Example 1 to Example 30, which include all of the first to fourth compounds, showed better device life and emission efficiency when compared with Comparative Example 1 to Comparative Example 23, which exclude the first compound and/or the second compound. It is believed, without being bound by any particular theory, that because the emission layer includes both the first compound having excellent hole transport properties and the second compound having excellent electron transport properties, charge balance in the emission layer may be improved, and energy transfer from the host compound to the dopant compound may be smoothly performed.

In addition, Example 1 to Example 30, which include all of the first to fourth compounds, showed better device life and emission efficiency when compared with Comparative Example 24 to Comparative Example 27, which exclude the third compound and/or the fourth compound. It is believed that because the emission layer includes both the third compound, which was used as the assistant dopant, and the fourth compound, which was used as the light-emitting dopant, delayed fluorescence may be rapidly achieved using transferred energy from the host, and device efficiency may be improved.

When the organic electroluminescence device 10 of an embodiment included the first compound and the second compound as the host, charge balance properties in the emission layer EML were improved. Also, when the organic electroluminescence device 10 of an embodiment included the third compound as the assistant dopant, and the fourth compound as the light-emitting dopant, the emission of thermally activated fluorescence was efficiently achieved, and the high efficiency and long life of a device were achieved.

The organic electroluminescence device 10 of an embodiment includes the first compound represented by Formula 1, the second compound represented by Formula 2, the third compound represented by Formula 3, and the fourth compound represented by Formula 4. Accordingly, the organic electroluminescence device 10 of an embodiment may achieve high efficiency and long life.

The organic electroluminescence device according to an embodiment of the present disclosure may achieve high efficiency and long life.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments, but various changes and modifications can be made by one ordinary skilled in the art within the spirit and scope of the present disclosure as hereinafter claimed by the following claims and their equivalents.

What is claimed is:

1. An organic electroluminescence device, comprising:

a first electrode;

a second electrode on the first electrode; and an emission layer between the first electrode and the second electrode, wherein the emission layer comprises host compounds and dopant compounds, the host compounds comprise a first host compound represented by Formula 1, and a second host compound represented by Formula 2, and the dopant compounds comprise an assistant dopant compound represented by Formula 3 and a light-emitting dopant compound represented by Formula 4:

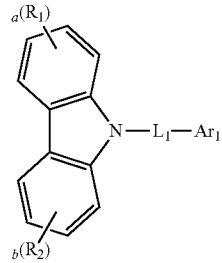

Formula 1

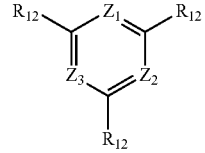

Formula 2

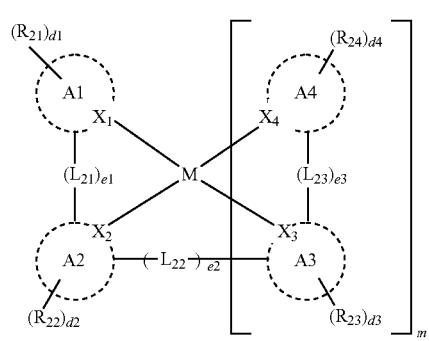

Formula 3

-continued

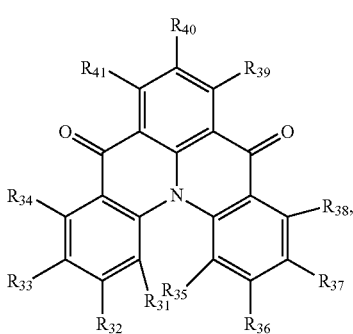

Formula 4 wherein, in Formula 1,
$R_1$ and $R_2$ are each independently a substituted or unsubstituted aryl group of 6 to 30 carbon atoms for forming a ring, or a substituted or unsubstituted heteroaryl group of 3 to 30 carbon atoms for forming a ring,
$L_1$ is a substituted or unsubstituted arylene group of 6 to 30 carbon atoms for forming a ring, or a substituted or unsubstituted heteroarylene group of 3 to 30 carbon atoms for forming a ring,
$Ar_1$ is a substituted or unsubstituted aryl group of 6 to 30 carbon atoms for forming a ring, or a substituted or unsubstituted heteroaryl group of 3 to 30 carbon atoms for forming a ring, and
a and b are each independently an integer of 0 to 4,
in Formula 2,
$Z_1$ to $Z_3$ are each independently $CR_{11}$ or N, and
a plurality of $R_{11}$ and a plurality of $R_{12}$ are each independently a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring,
in Formula 3,
A1 to A4 are each independently a substituted or unsubstituted aryl group of 6 to 30 carbon atoms for forming a ring, or a substituted or unsubstituted heteroaryl group of 1 to 30 carbon atoms for forming a ring,
$X_1$ to $X_4$ are each independently C or N,
$R_{21}$ to $R_{24}$ are each independently a hydrogen atom, a deuterium atom, a halogen atom, a cyano group, a substituted or unsubstituted amine group, a substituted or unsubstituted alkyl group of 1 o 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{21}$ to $R_{24}$ are optionally combined with an adjacent group to form a ring,
d1 to d4 are each independently an integer of 0 to 4,
$L_{21}$ to $L_{23}$ are each independently a direct linkage,

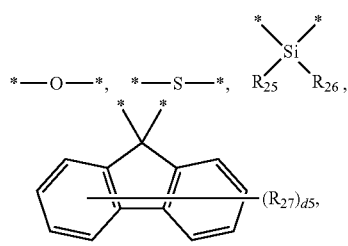

a substituted or unsubstituted divalent alkyl group of 1 to 20 carbon atoms, a substituted or unsubstituted arylene group of 6 to 30 carbon atoms for forming a ring, or a substituted or unsubstituted heteroarylene group of 2 to 30 carbon atoms for forming a ring,
$R_{25}$ to $R_{27}$ are each independently a substituted or unsubstituted alkyl group of 1 to 20 carbon atoms, a substituted or unsubstituted aryl group of 6 to 30 carbon atoms for forming a ring, or a substituted or unsubstituted heteroaryl group of 3 to 30 carbon atoms for forming a ring, and any of $R_{25}$ to $R_{27}$ are optionally combined with an adjacent group to form a ring,
d5 is an integer of 0 to 8,
M is platinum, palladium, copper, osmium, iridium, rubidium, or rhodium,
e1 to e3 are each independently 0 or 1, and
m is 1 or 2,
when M is platinum, palladium, copper or osmium, m is 1, and
when M is iridium, rubidium, or rhodium, m is 2 and e2 is 0, and
in Formula 4,
$R_{31}$ to $R_{41}$ are each independently a hydrogen atom, a deuterium atom, a halogen atom, a substituted or unsubstituted silyl group, a substituted or unsubstituted amine group, a substituted or unsubstituted carbonyl group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 3 to 30 carbon atoms for forming a ring.

2. The organic electroluminescence device of claim 1, wherein $L_1$ is a substituted or unsubstituted phenylene group, a substituted or unsubstituted divalent biphenyl group, or a substituted or unsubstituted carbazolene group.

3. The organic electroluminescence device of claim 1, wherein $Ar_1$ is a substituted or unsubstituted carbazole group, a substituted or unsubstituted dibenzofuran group, a substituted or unsubstituted dibenzothiophene group, or a substituted or unsubstituted biphenyl group.

4. The organic electroluminescence device of claim 1, wherein Formula 2 is represented by the following Formula 2-1:

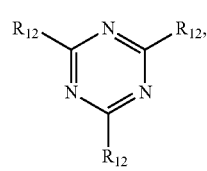

Formula 2-1 wherein, in Formula 2-1,
a plurality of $R_{12}$ are each independently a substituted or unsubstituted aryl group of 6 to 30 carbon atoms for forming a ring, or a substituted or unsubstituted heteroaryl group of 3 to 30 carbon atoms for forming a ring.

5. The organic electroluminescence device of claim 1, wherein Formula 2 is represented by the following Formula 2-2:

Formula 2-2

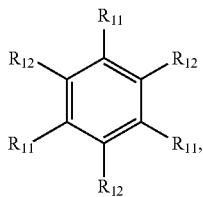

wherein, in Formula 2-2, a plurality of $R_{11}$ and a plurality of $R_{12}$ are each independently a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring, and at least one selected from the plurality of $R_{11}$ and the plurality of $R_{12}$ is a cyano group, an aryl group of 6 to 30 carbon atoms, which comprises at least one cyano group as a substituent, or a heteroaryl group of 3 to 20 carbon atoms for forming a ring, which comprises at least one cyano group as a substituent.

6. The organic electroluminescence device of claim 1, wherein Formula 3 is represented by the following Formula 3-1:

Formula 3-1

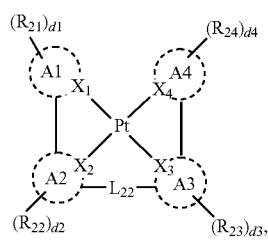

wherein, in Formula 3-1,

A1 to A4, $X_1$ to $X_4$, $R_{21}$ to $R_{24}$, d1 to d4, and $L_{22}$ are the same as defined in Formula 3.

7. The organic electroluminescence device of claim 6, wherein A1 to A4 are each independently represented by any one selected from Structures 1-1 to 1-3:

1-1

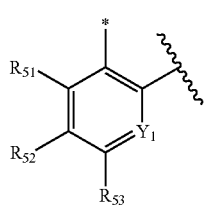

1-2

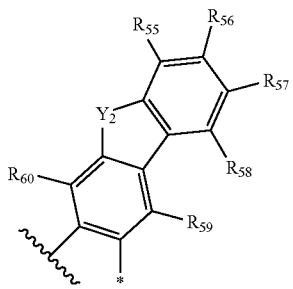

1-3

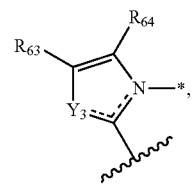

wherein in Structures 1-1 to 1-3,
$Y_1$ is $$C—*$$

or $CR_{54}$, $Y_2$ is $$N—*$$

or $NR_{61}$, $Y_3$ is $$N—*$$

or $NR_{62}$, $R_{51}$ to $R_{64}$ are each independently a substituted or unsubstituted alkyl group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, and any of $R_{51}$ to $R_{64}$ are optionally combined with an adjacent group to form a ring.

8. The organic electroluminescence device of claim 1, wherein Formula 3 is represented by the following Formula 3-2:

Formula 3-2

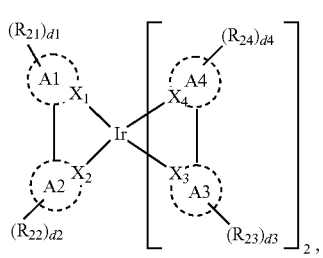

wherein, in Formula 3-2,
A1 to A4, $X_1$ to $X_4$, $R_{21}$ to $R_{24}$, and d1 to d4 are the same as defined in Formula 3.

9. The organic electroluminescence device of claim 8, wherein A1 to A4 are each independently represented by the following Structure 2-1 or Structure 2-2:

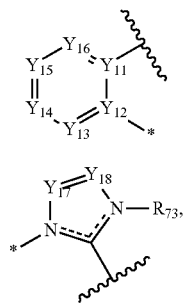

wherein, in Structure 2-1,
$Y_{11}$ and $Y_{12}$ are each independently C or N,
$Y_{13}$ to $Y_{16}$ are each independently N or $CR_{71}$, and
$R_{71}$ is each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{71}$ are optionally combined with an adjacent group to form a ring, and
in Structure 2-2,
$Y_{17}$ and $Y_{18}$ are each independently N or $CR_{72}$, and
$R_{72}$ and $R_{73}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{72}$ and $R_{73}$ are optionally combined with an adjacent group to form a ring.

10. The organic electroluminescence device of claim 1, wherein Formula 4 is represented by the following Formula 4-1:

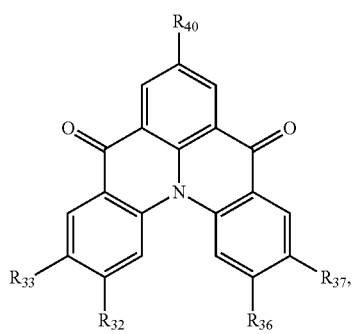

wherein, in Formula 4-1,
$R_{32}$, $R_{33}$, $R_{36}$, $R_{37}$, and $R_{40}$ are each independently a hydrogen atom, a deuterium atom, a halogen atom, a substituted or unsubstituted silyl group, a substituted or unsubstituted amine group, a substituted or unsubstituted carbonyl group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 3 to 30 carbon atoms for forming a ring, and at least one selected from $R_{32}$, $R_{33}$, $R_{36}$, $R_{37}$, and $R_{40}$ is not a hydrogen atom.

11. The organic electroluminescence device of claim 1, wherein the emission layer is to emit blue light as delayed fluorescence.

12. The organic electroluminescence device of claim 1, wherein, based on a total weight of the first host compound, the second host compound, the assistant dopant compound, and the light-emitting dopant compound,
an amount of the assistant dopant compound is from about 10 wt % to about 15 wt %, and
an amount of the light-emitting dopant compound is from about 1 wt % to about 5 wt %.

13. The organic electroluminescence device of claim 1, wherein, based on a total weight of the host compounds,
a weight ratio of the first host compound to the second host compound is from about 7:3 to about 3:7.

14. The organic electroluminescence device of claim 1, wherein the first host compound comprises at least one selected from compounds represented in Compound Group 1:

Compound Group 1

HT-01

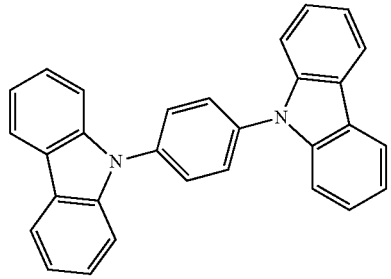

HT-02

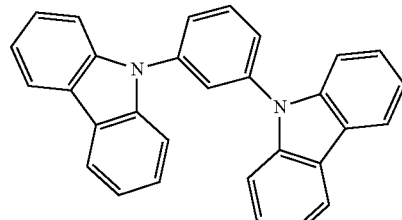

HT-03

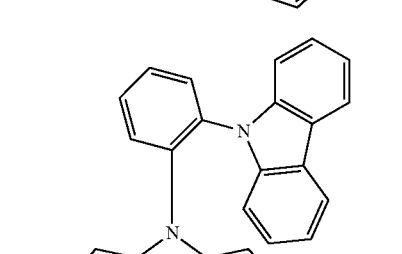

HT-04
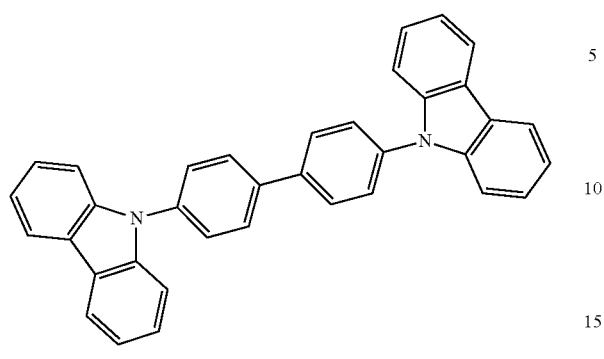
HT-05
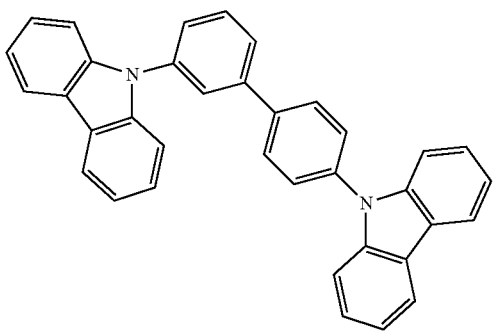
HT-06
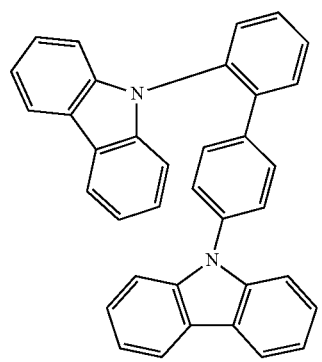
HT-07
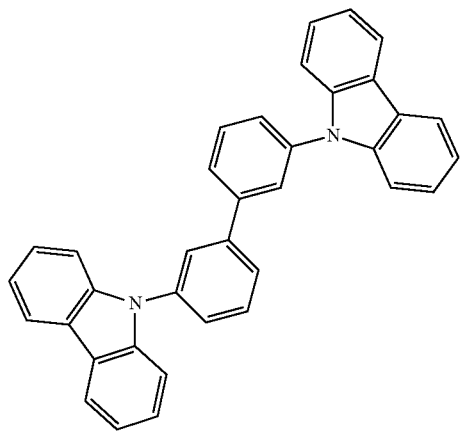
HT-08
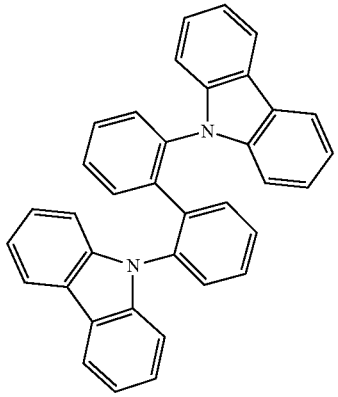
HT-09
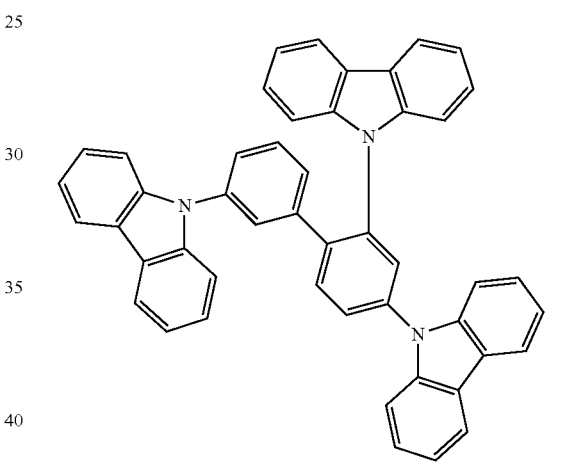
HT-10
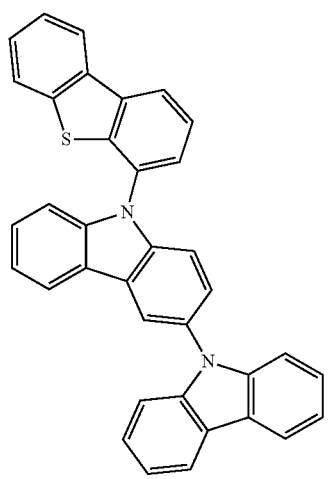

HT-11
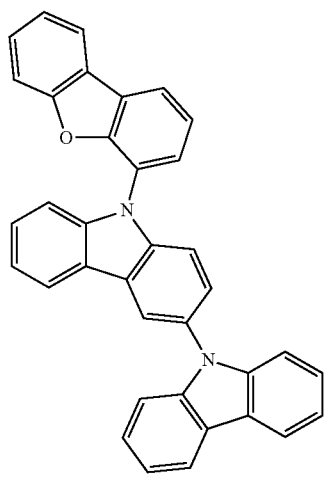
HT-12
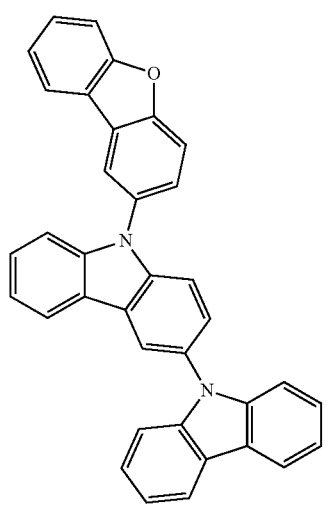
HT-13
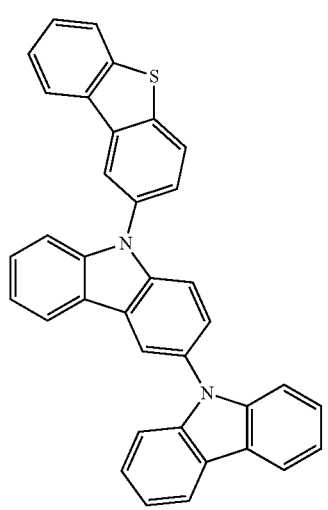
HT-14
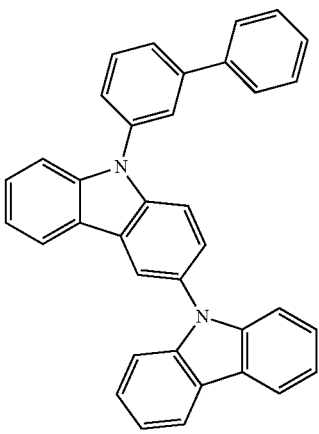
HT-15
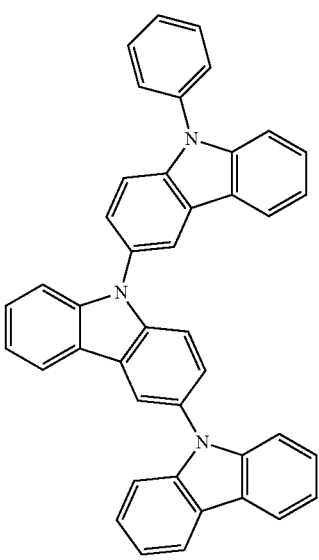
HT-16
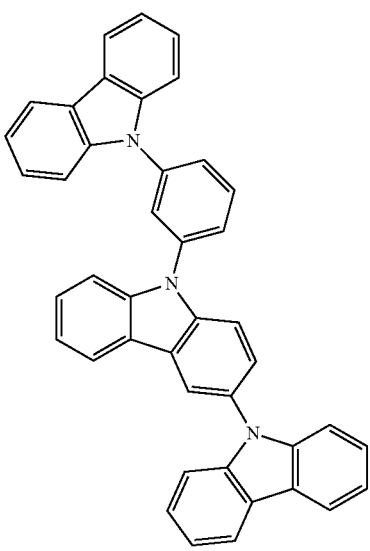

HT-17
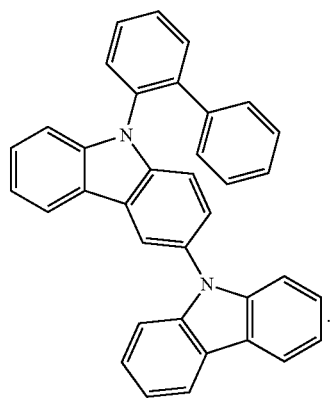
ET1-4
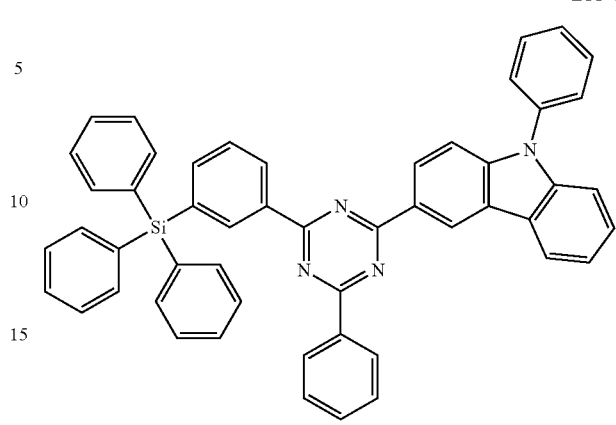
15. The organic electroluminescence device of claim 1, wherein the second host compound comprises at least one selected from compounds represented in Compound Group 2-1:
Compound Group 2-1
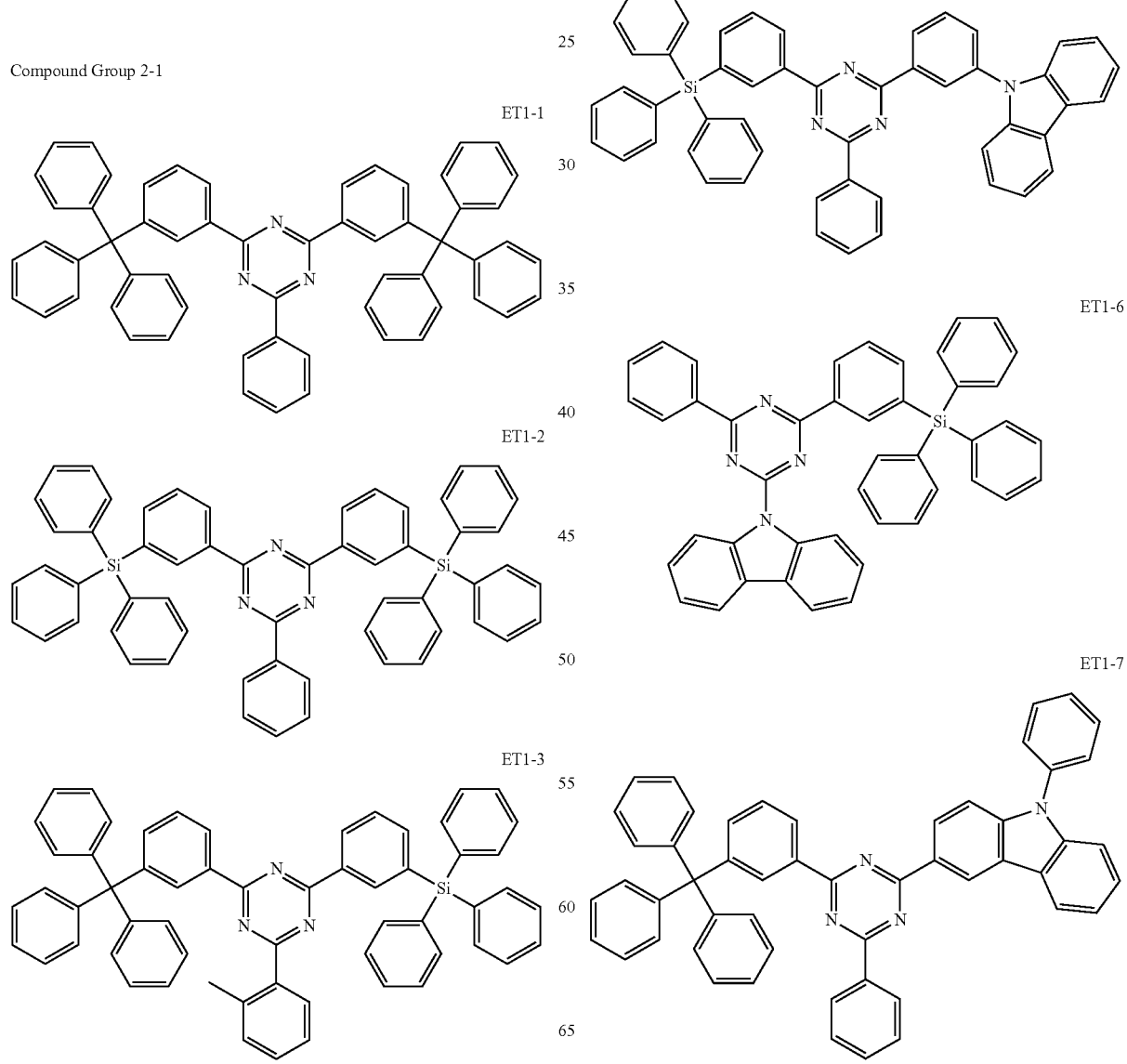

-continued
ET1-8
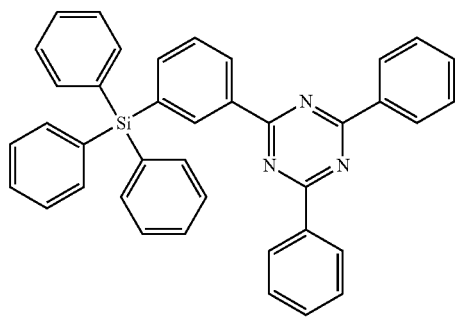
ET1-12
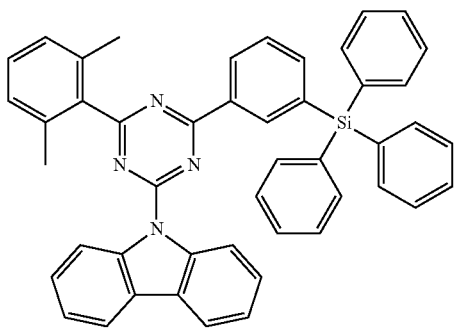
ET1-9
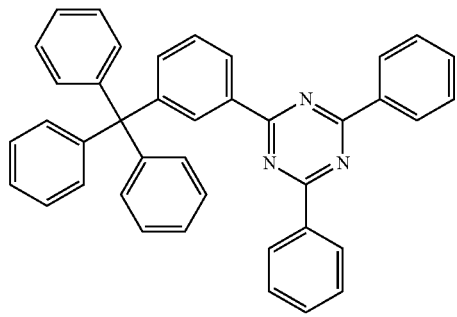
ET1-13
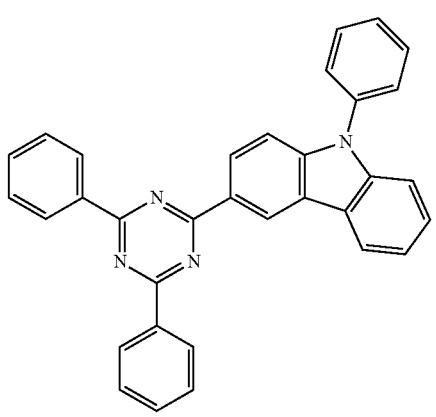
ET1-10
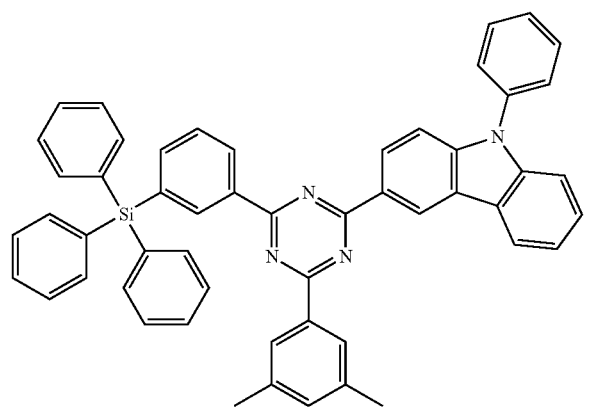
ET1-14
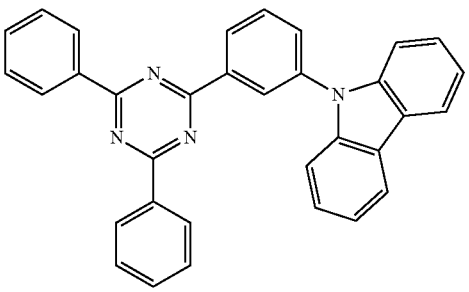
ET1-11
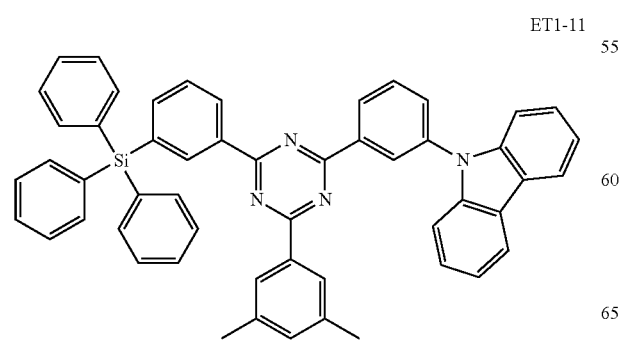
ET1-15
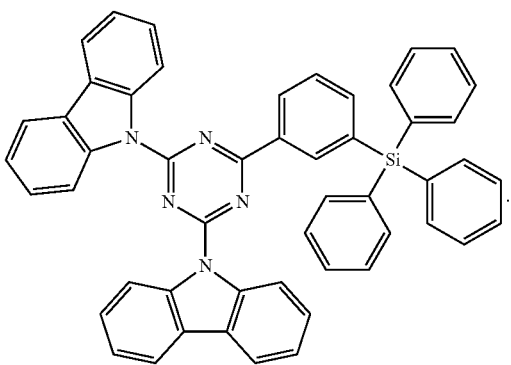

16. The organic electroluminescence device of claim 1, wherein the second host compound comprises at least one selected from compounds represented in the following Compound Group 2-2:
Compound Group 2-2
ET2-1
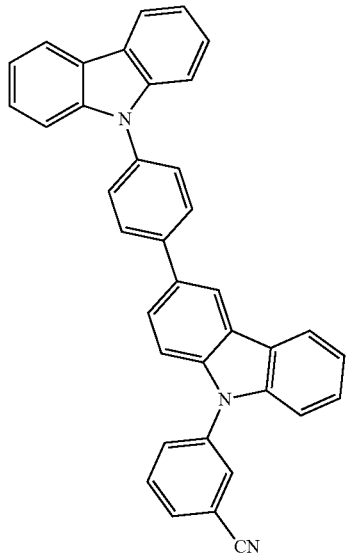
ET2-2
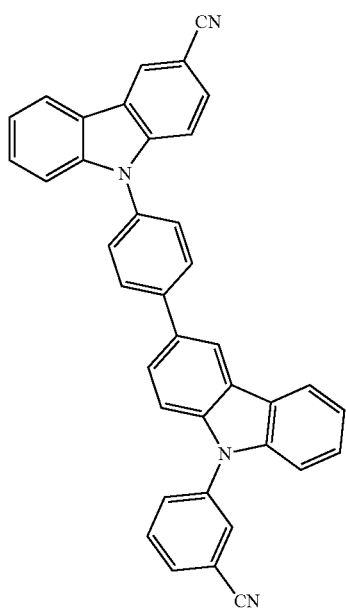
ET2-3
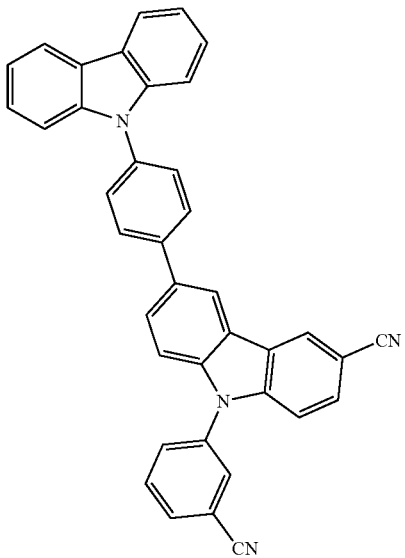
ET2-4
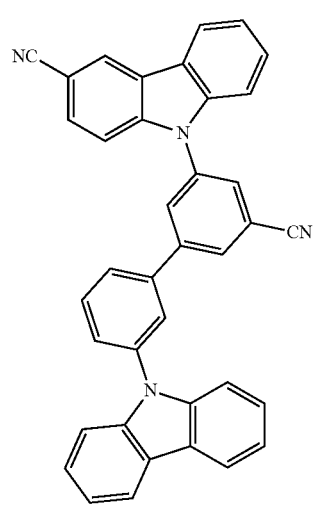
ET2-5
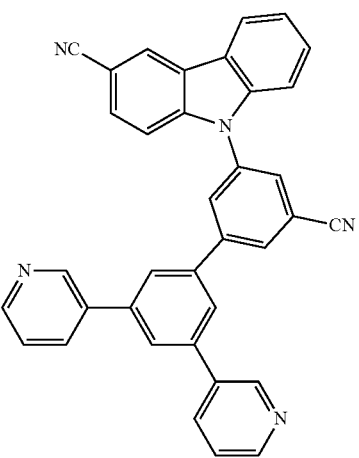

ET2-6
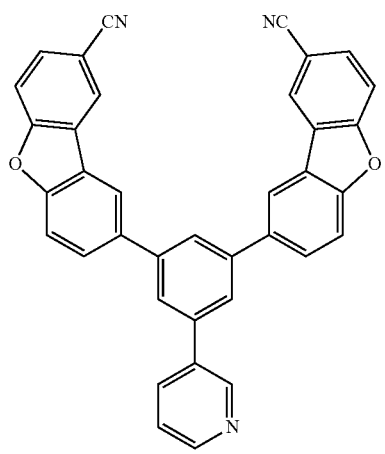
ET2-7
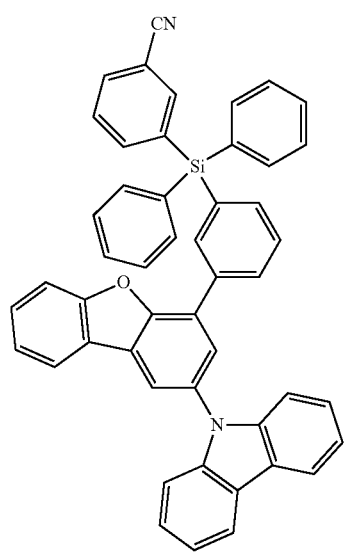
ET2-8
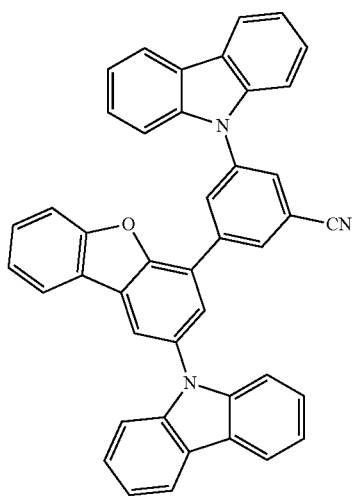
ET2-9
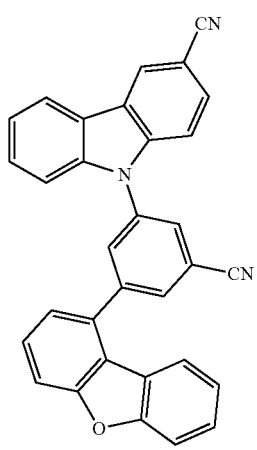
ET2-10
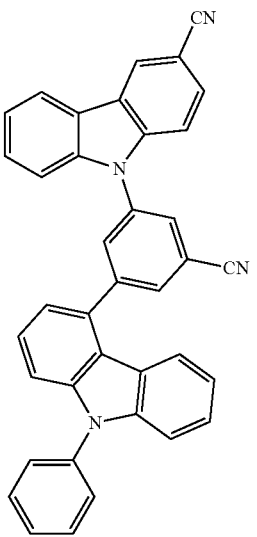
ET2-11
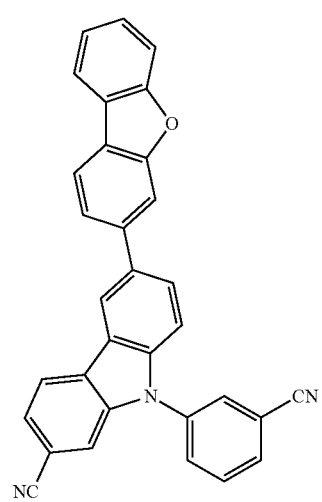

ET2-12
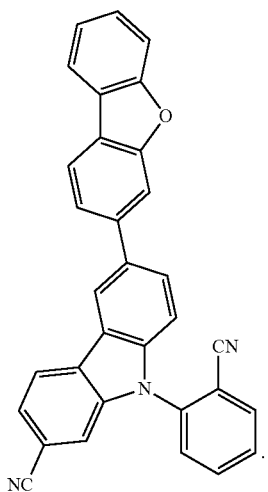
17. The organic electroluminescence device of claim 1, wherein the assistant dopant compound comprises at least one selected from compounds represented in Compound Group 3-1:
Compound Group 3-1
D1-1
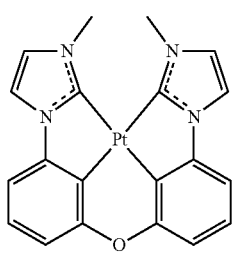
D1-2
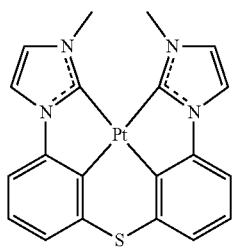
D1-3
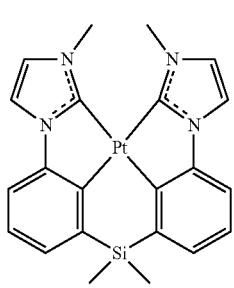
D1-4
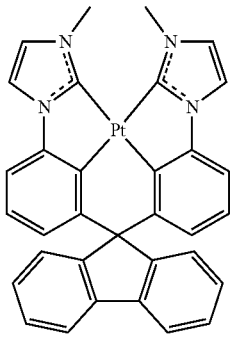
D1-5
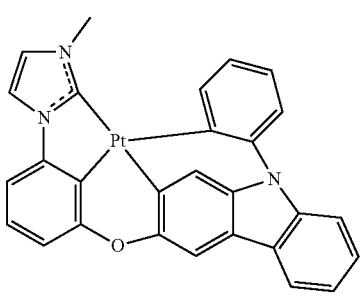
D1-6
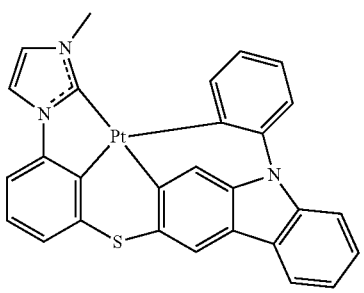
D1-7
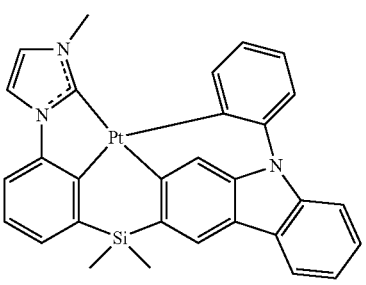
D1-8
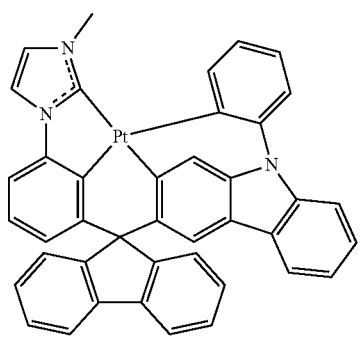

-continued
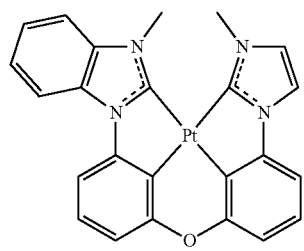
D1-9
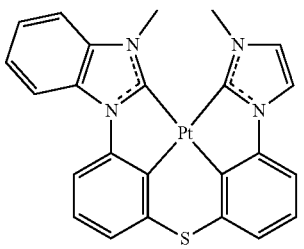
D1-10
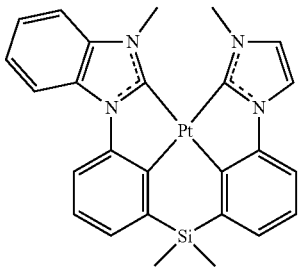
D1-11
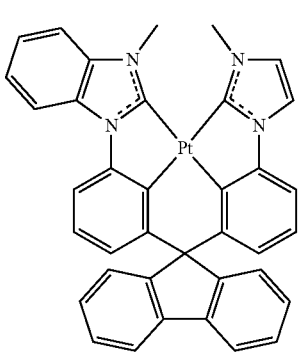
D1-12
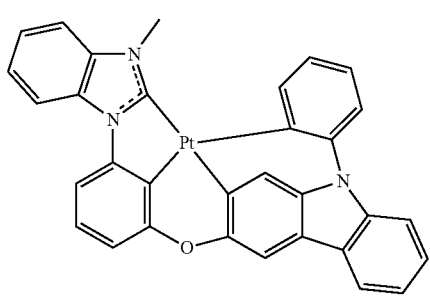
D1-13
-continued
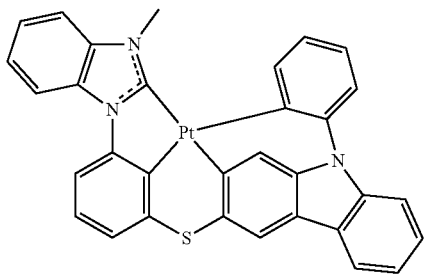
D1-14
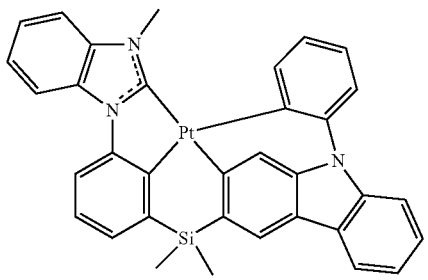
D1-15
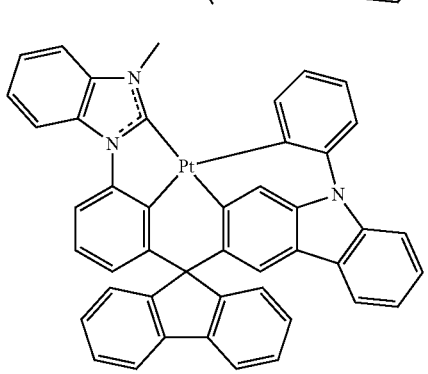
D1-16
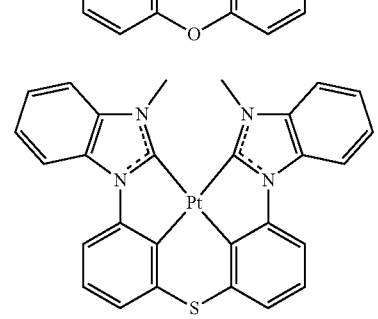
D1-17
D1-18

D1-19
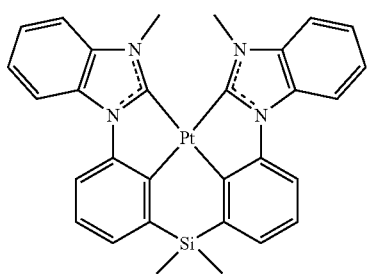
D1-20
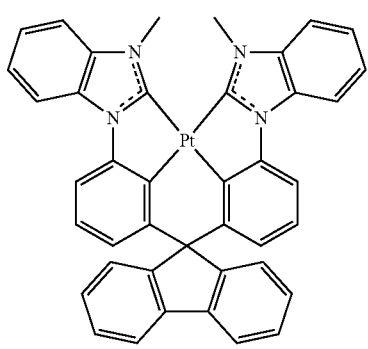
D1-21
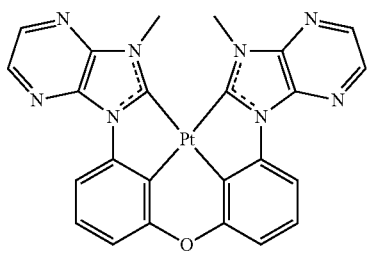
D1-22
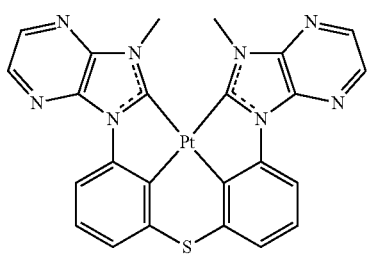
D1-23
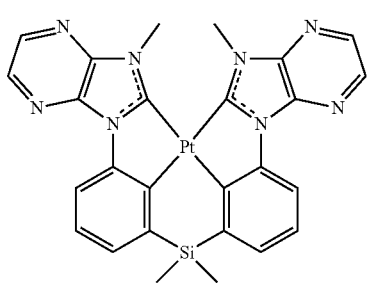
D1-24
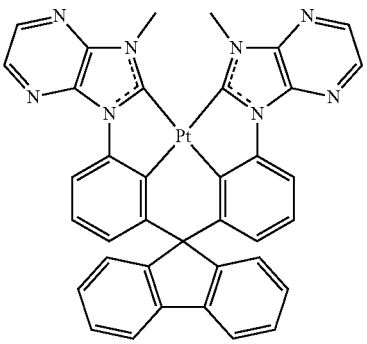
D1-25
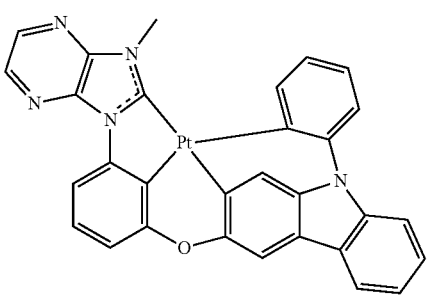
D1-26
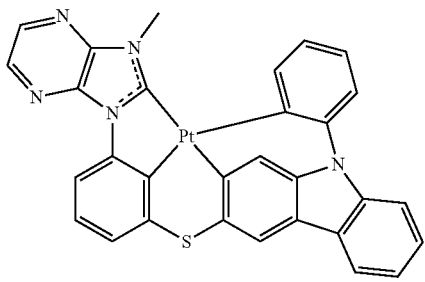
D1-27
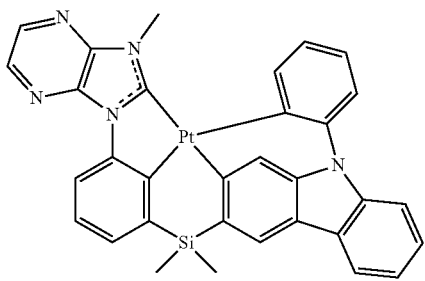
D1-28
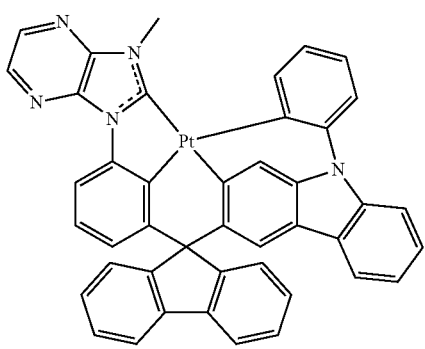

-continued
D129
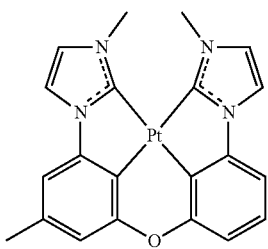
D1-30
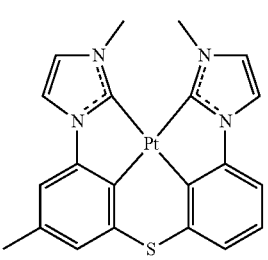
D1-31
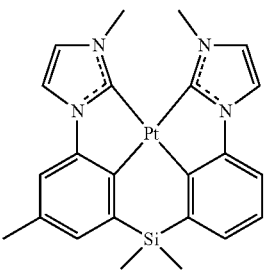
D1-32
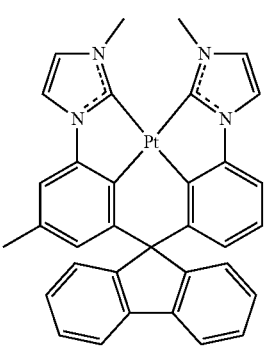
D1-33
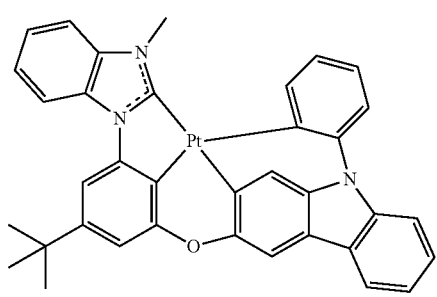
-continued
D1-34
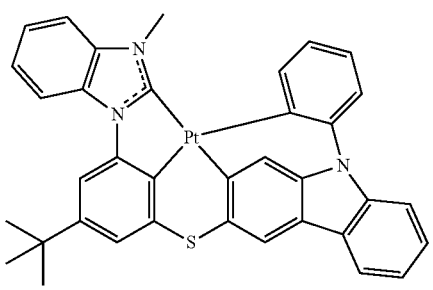
D1-35
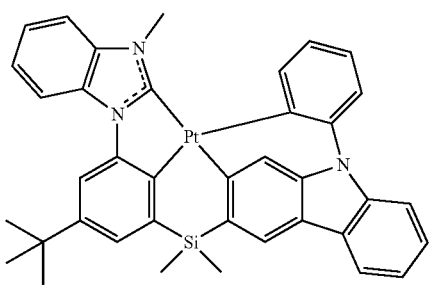
D1-36
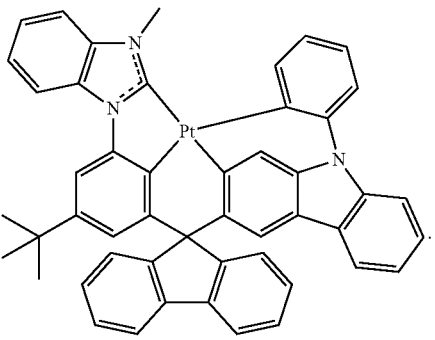
18. The organic electroluminescence device of claim 1, wherein the assistant dopant compound comprises at least one selected from compounds represented in Compound Group 3-2:
Compound Group 3-2
D2-1
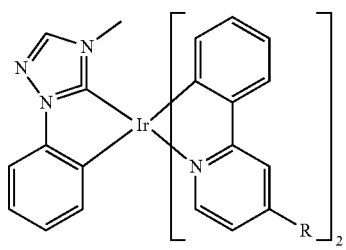

-continued
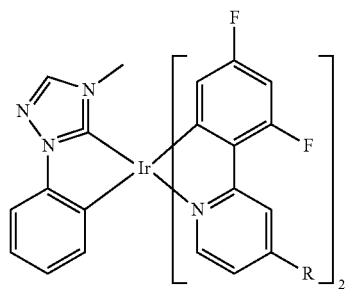 D2-2
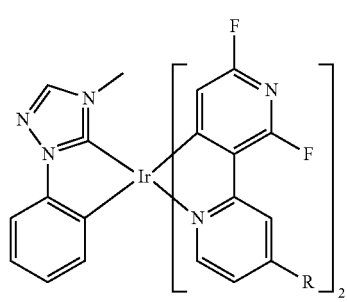 D2-3
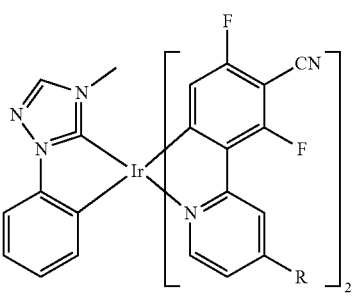 D2-4
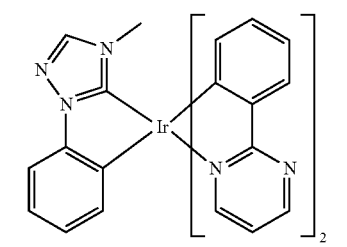 D2-5
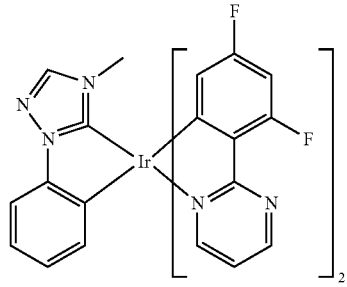 D2-6
-continued
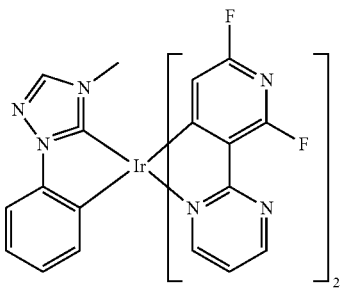 D2-7
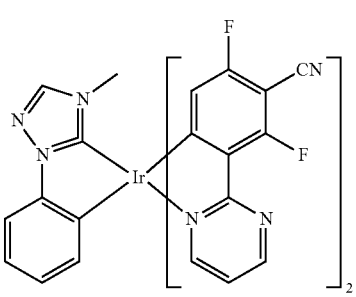 D2-8
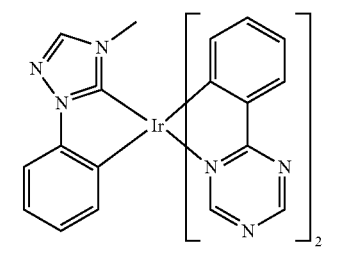 D2-9
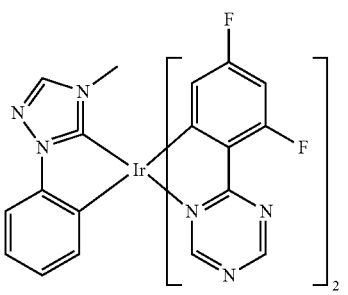 D2-10
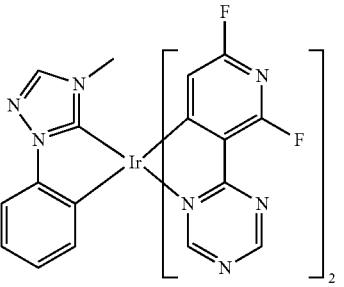 D2-11

D2-12 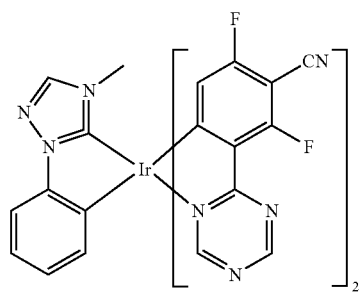
D2-13 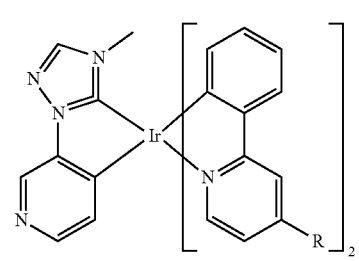
D2-14 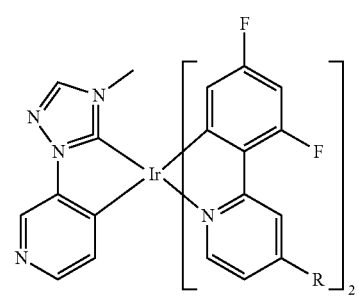
D2-15 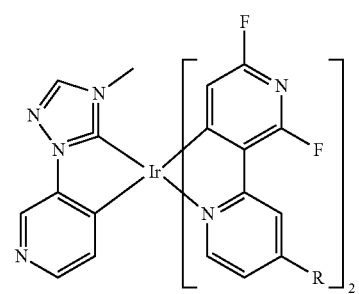
D2-16 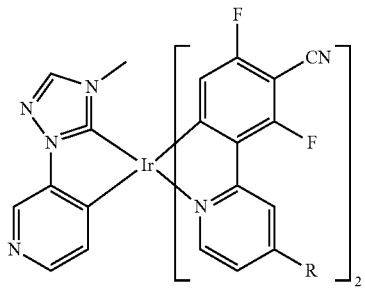
D2-17 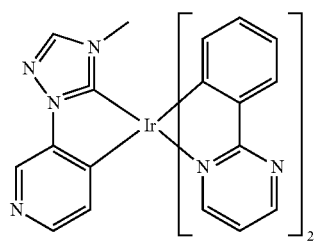
D2-18 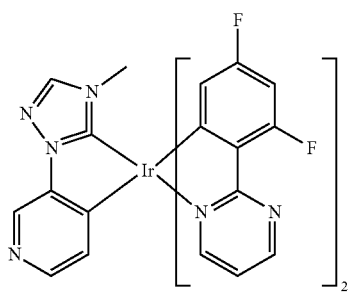
D2-19 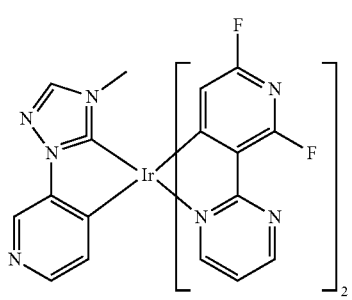
D2-20 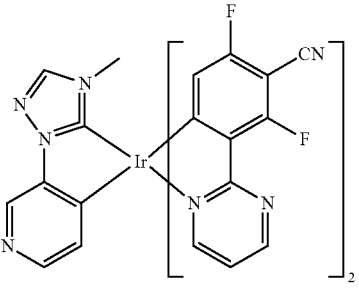
D2-21 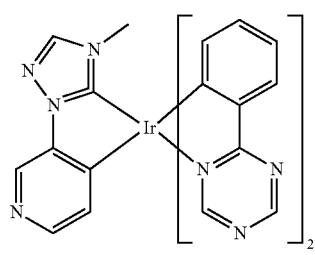

D2-22
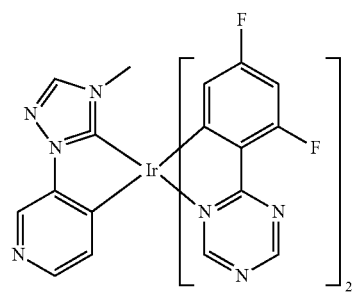
D2-23
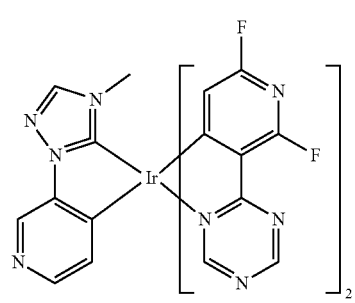
D2-24
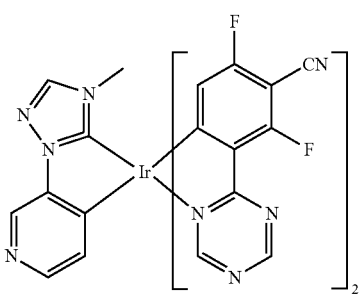
D2-25
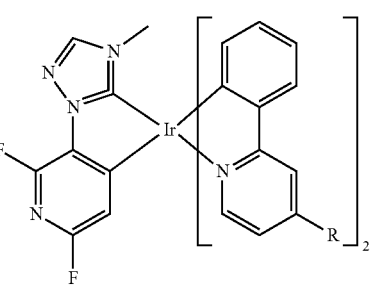
D2-26
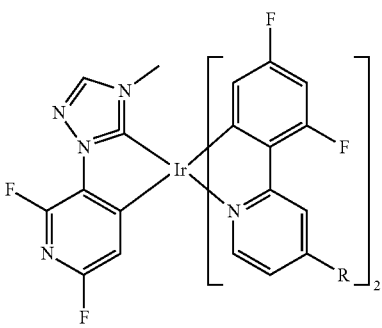
D2-27
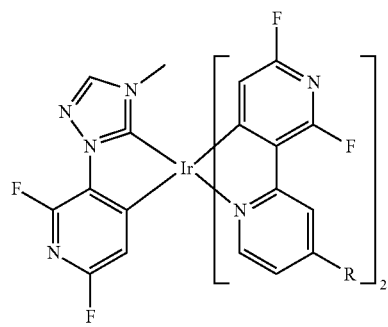
D2-28
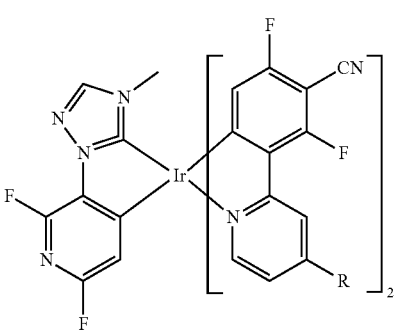
D2-29
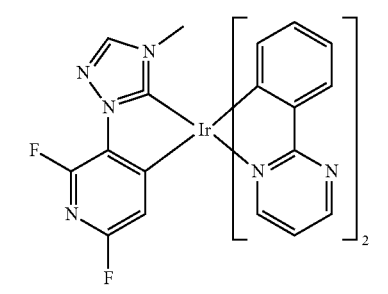
D2-30
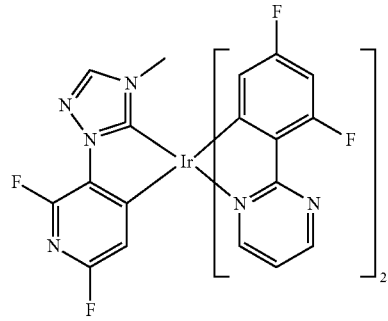
D2-31
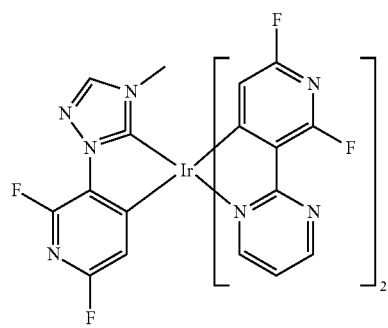

-continued

D2-32
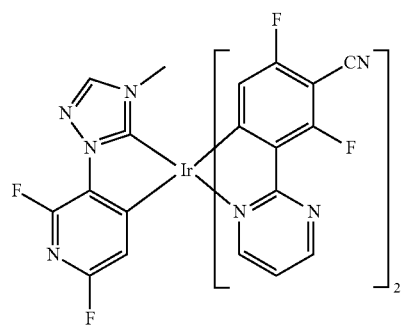

D2-33
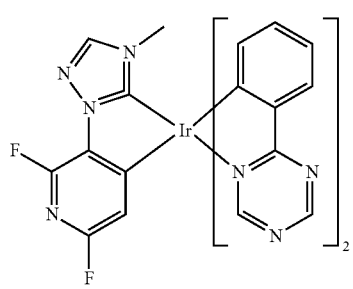

D2-34
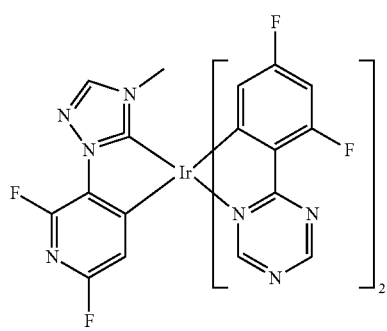

-continued

D2-35
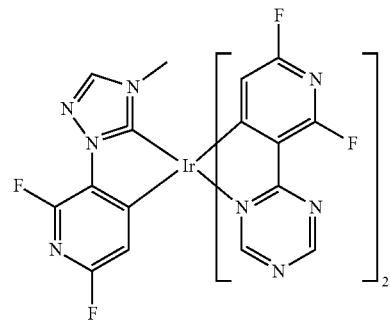

D2-36
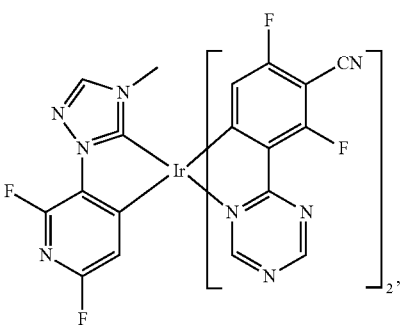

wherein in compounds D2-1 to D2-4, D2-13 to D2-16, and D2-25 to D2-28, one or more R may be each independently a hydrogen atom, a methyl group, an isopropyl group, a tert-butyl group, or a dimethylamine group.

19. The organic electroluminescence device of claim 1, wherein the light-emitting dopant compound comprises at least one selected from compounds represented in Compound Group 4 and Formula 4-2:

Compound Group 4

D1
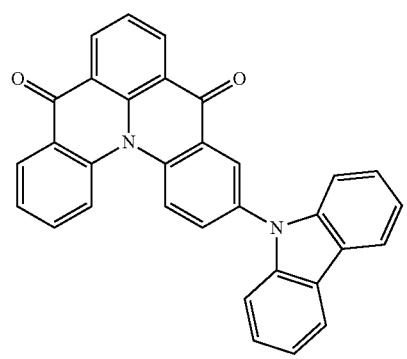

D2
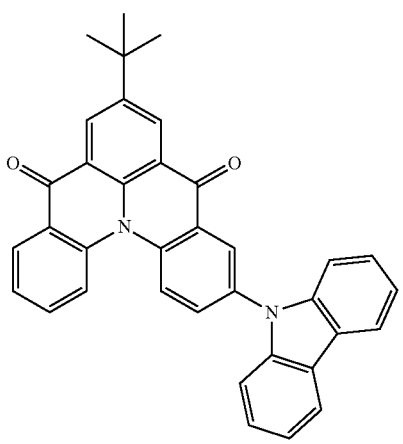

-continued
D3
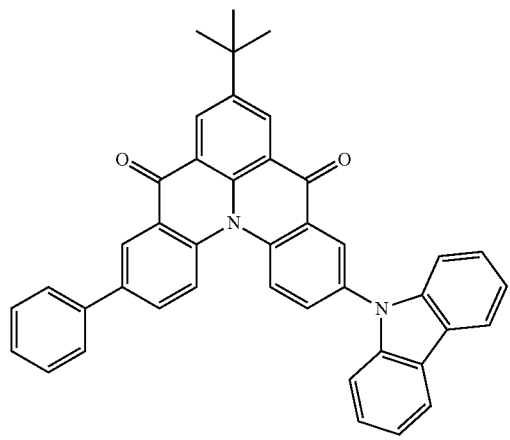
D4
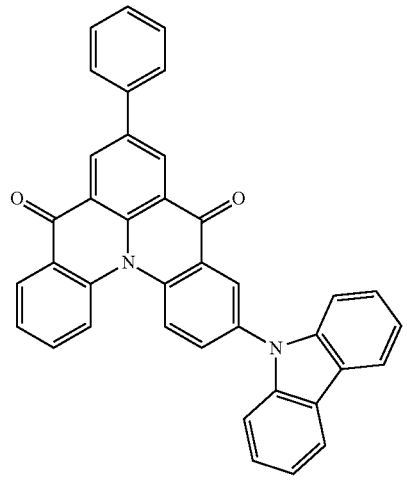
D5
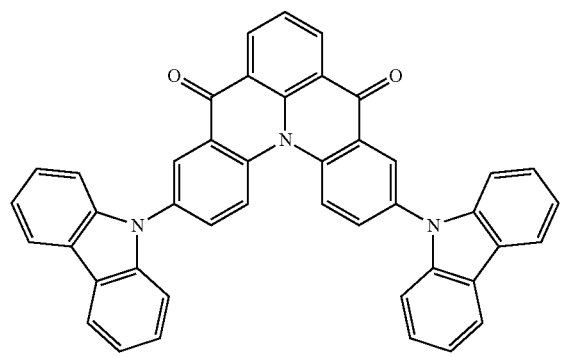
D6
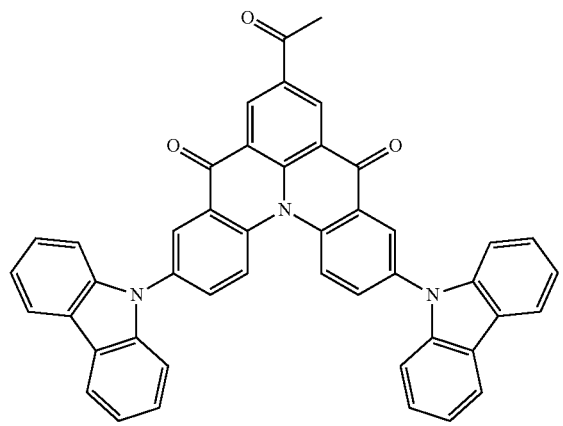
D7
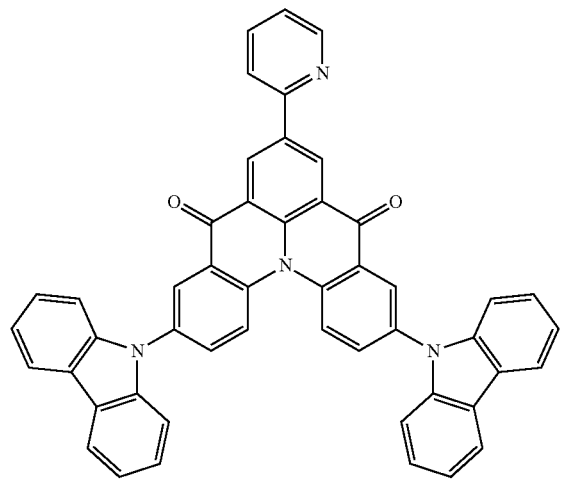
D8
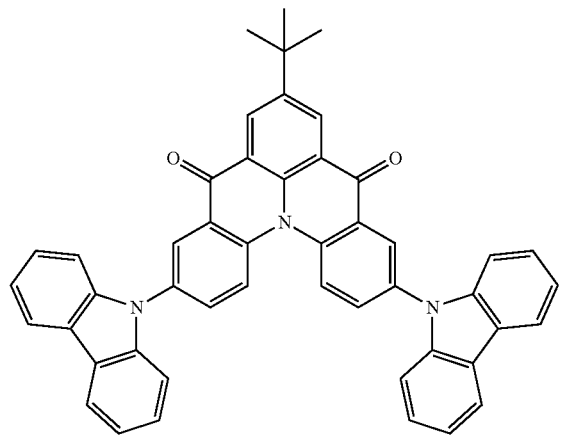

-continued
D9
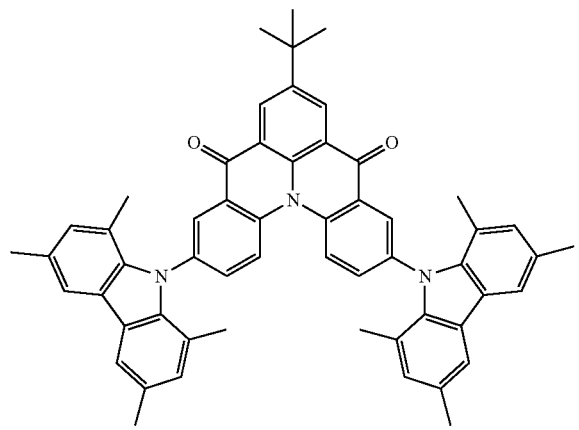
D10
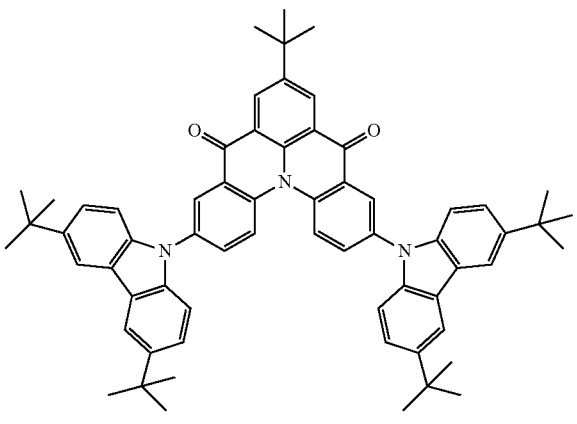
D11
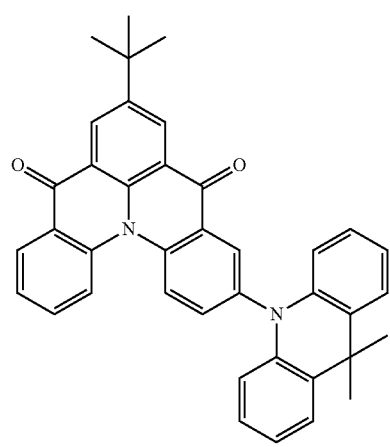
D12
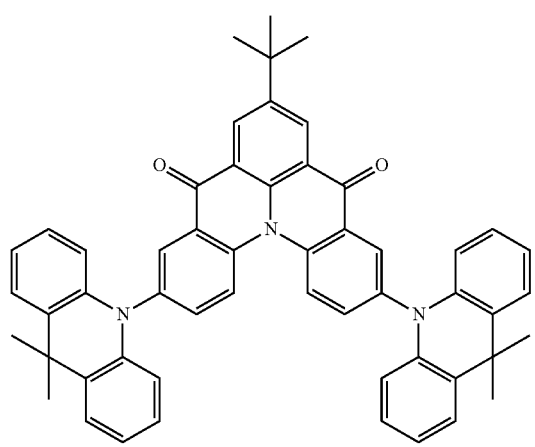
D13
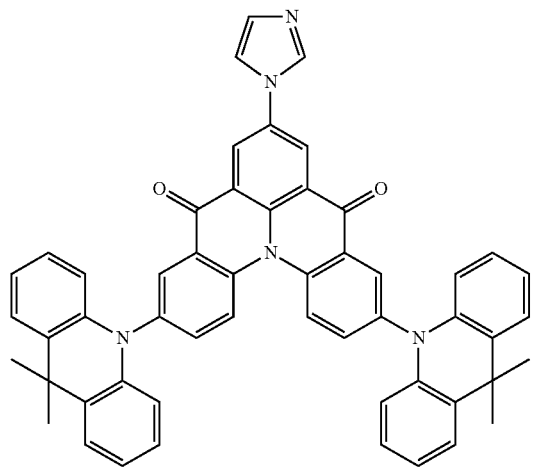
D14
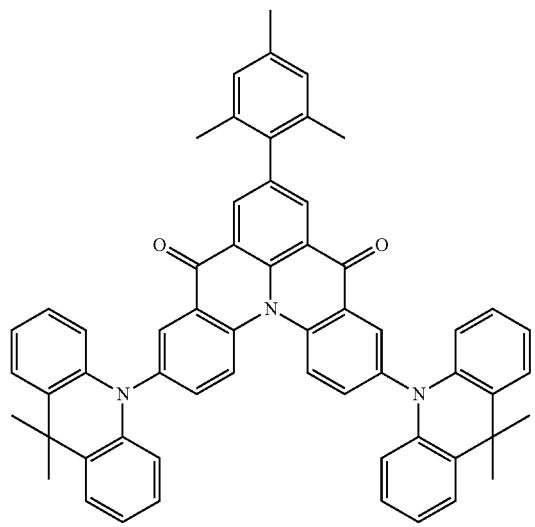

-continued
D15
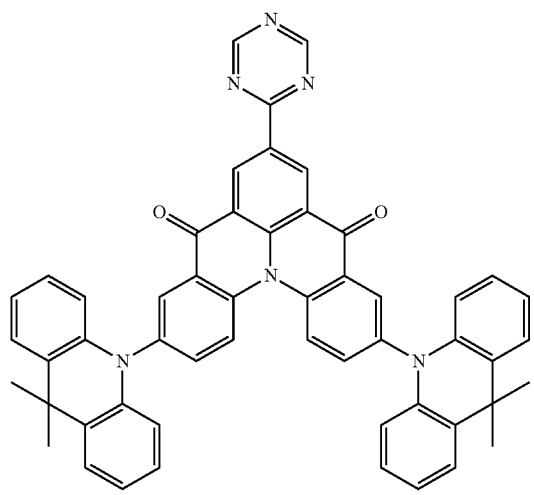
D16
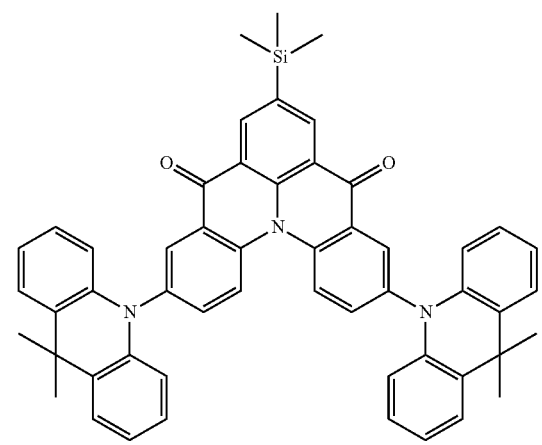
D17
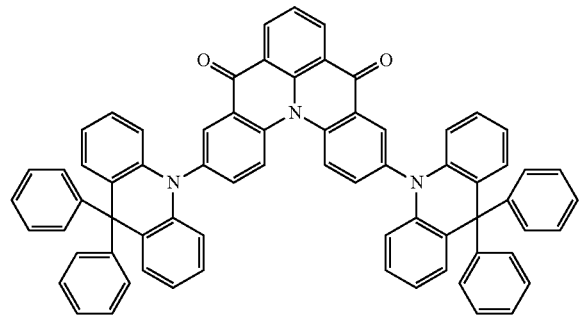
D18
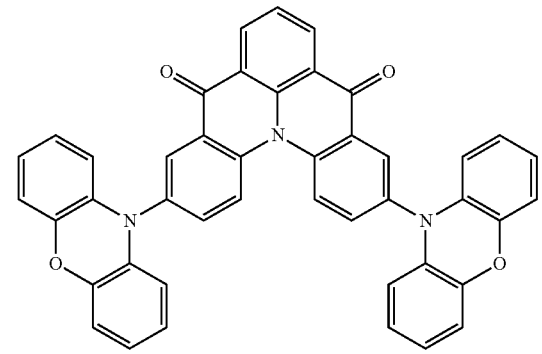
D19
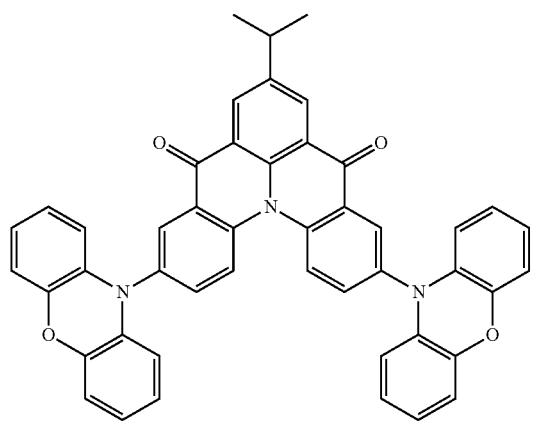
D20
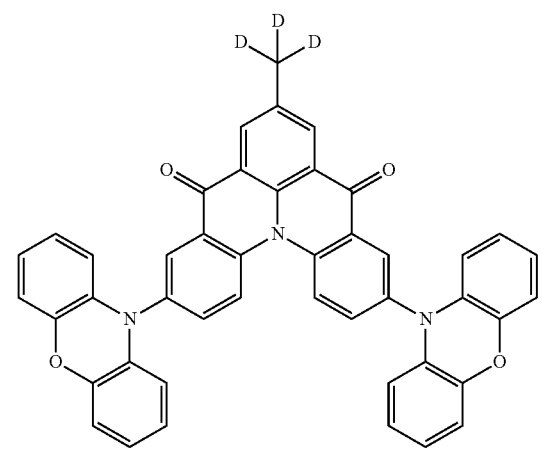

-continued
D21
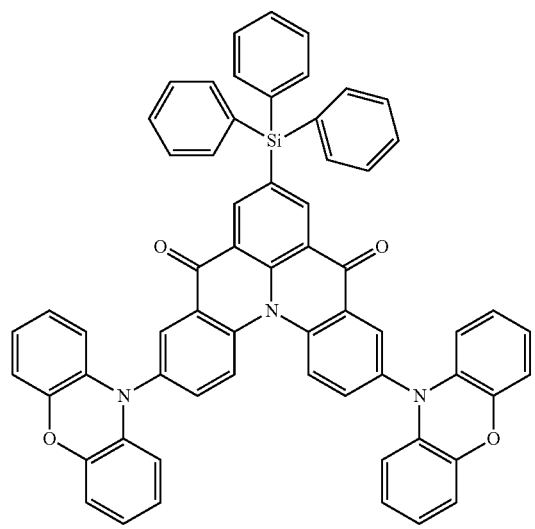
D22
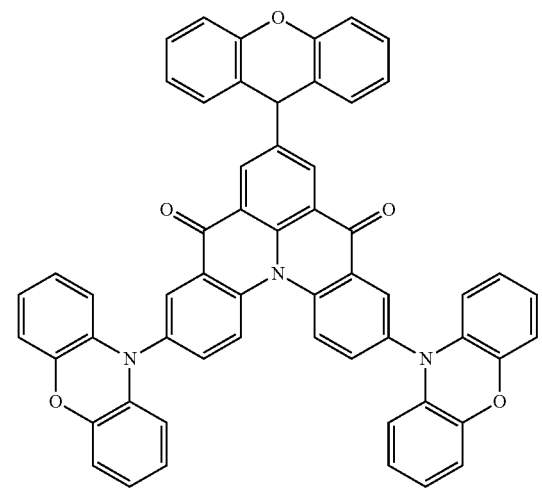
D23
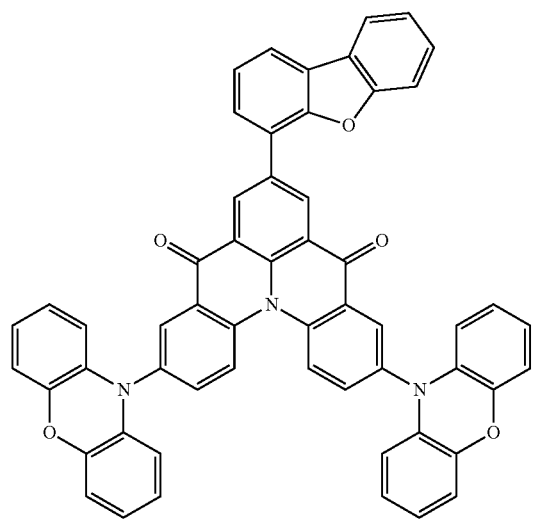
D24
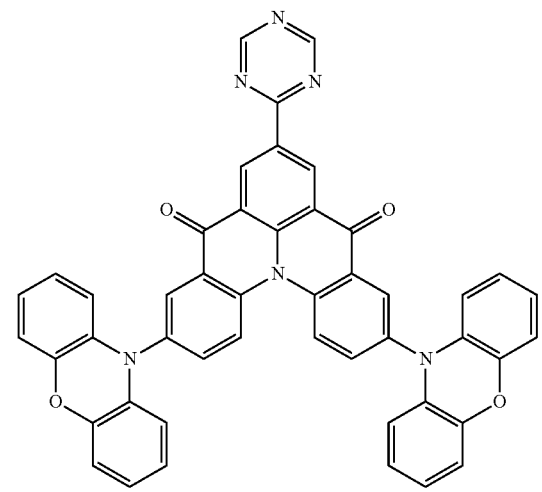
D25
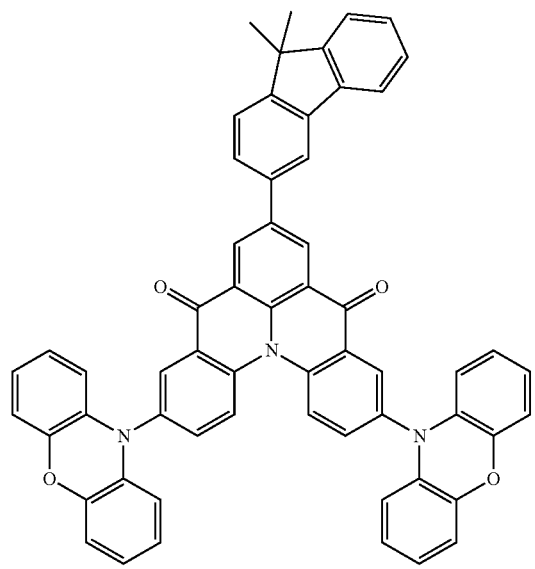
D26

-continued
D27
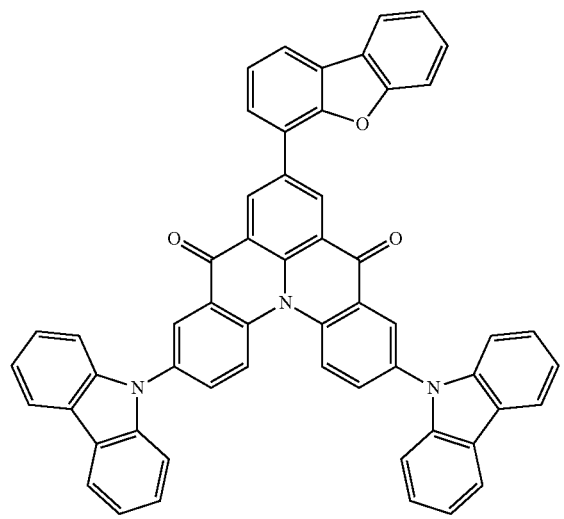
D28
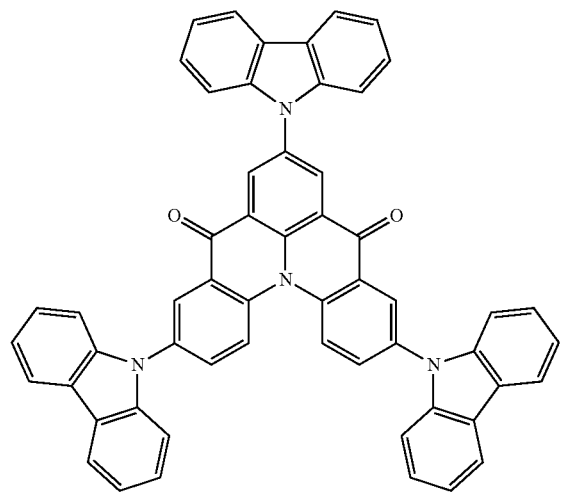
D29
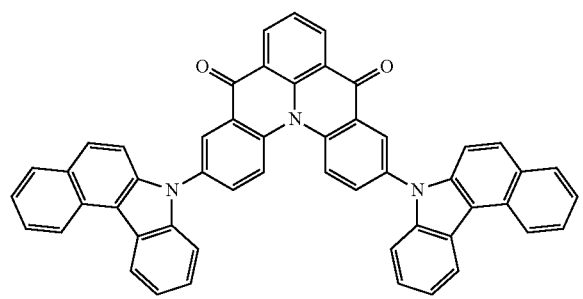
D30
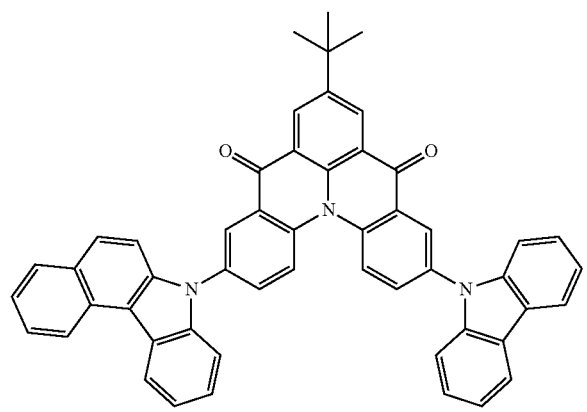
D31
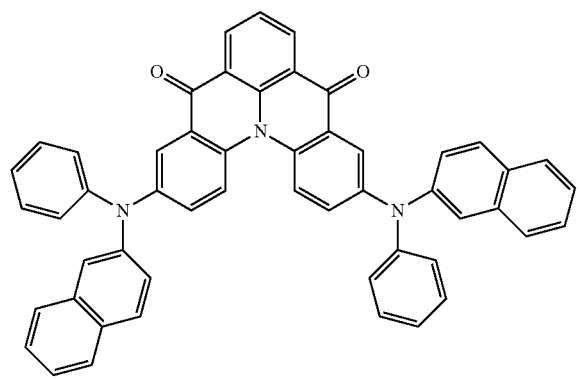
D32
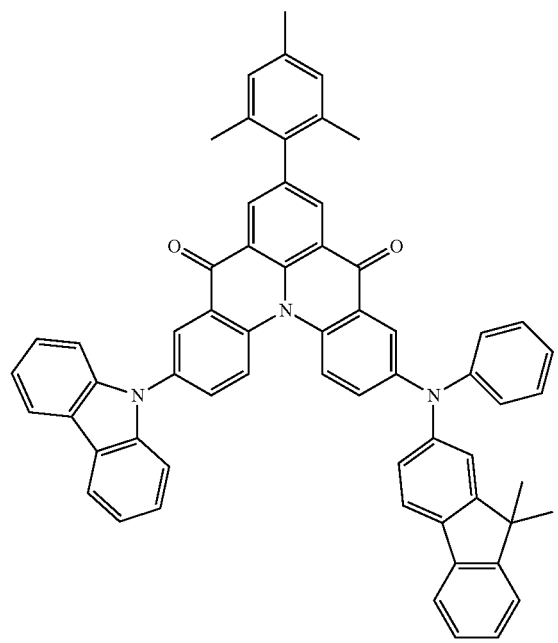

-continued
D33
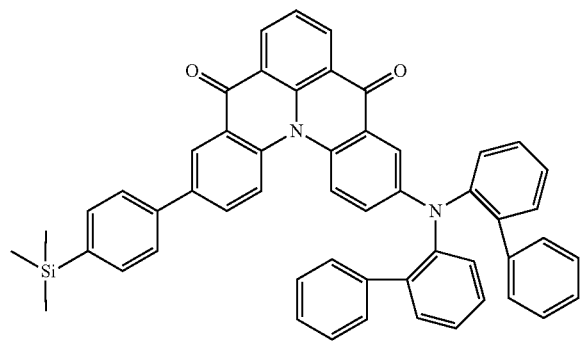
D34
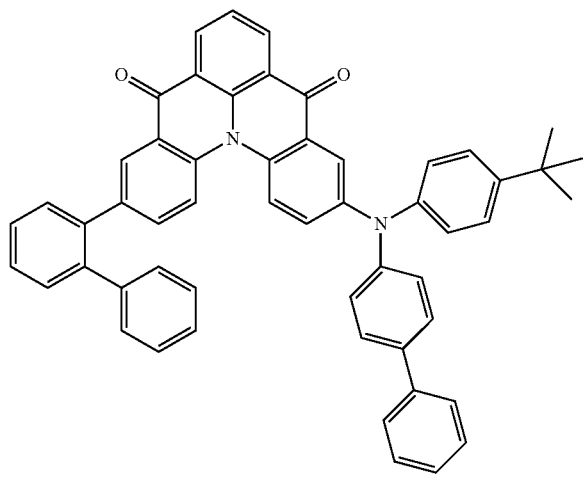
D35
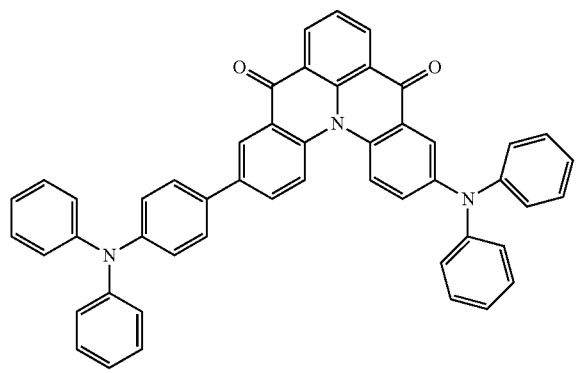
D36
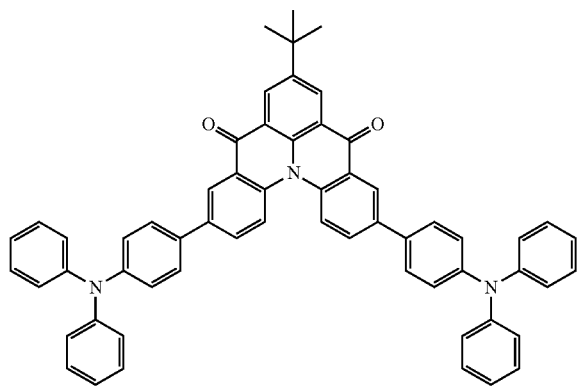
D37
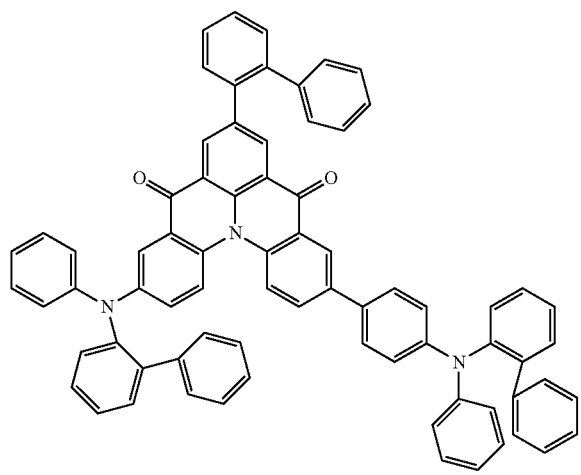
D38
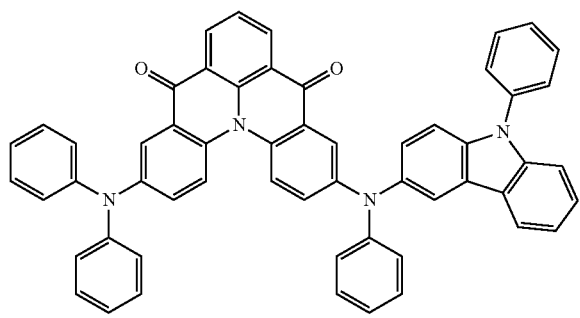

D39

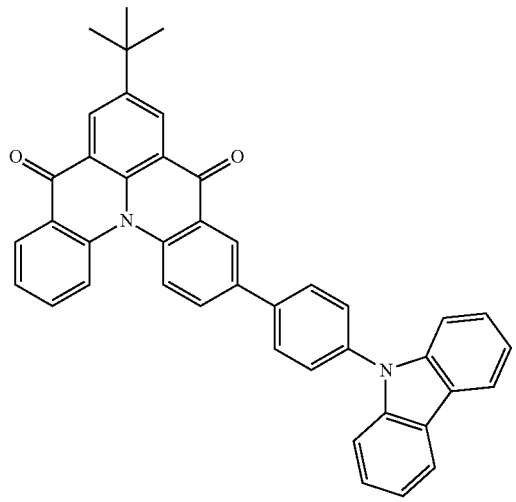

D40

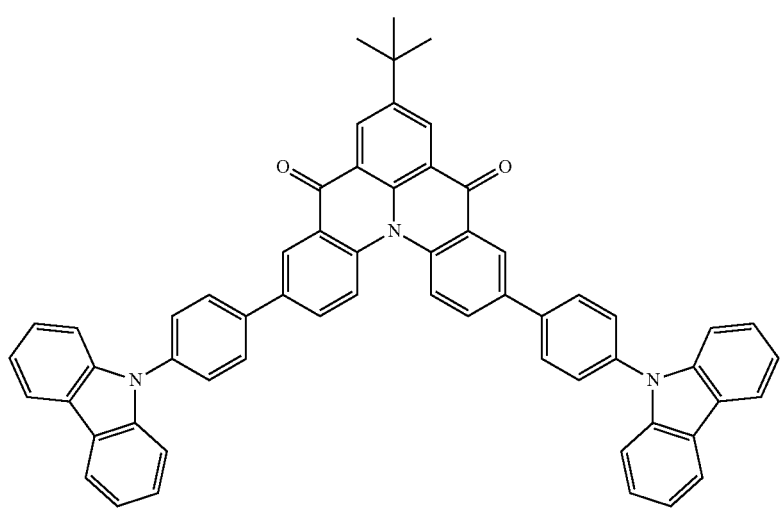

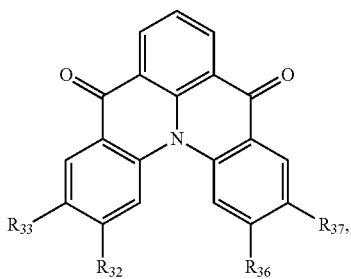

Formula 4-2 wherein, in Formula 4-2,

R$_{32}$ and R$_{36}$ are hydrogen atoms, and R$_{33}$ and R$_{37}$ are each independently a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group, or R$_{33}$ and R$_{37}$ are hydrogen atoms, and R$_{32}$ and R$_{36}$ are each independently a substituted or unsubstituted carbazole group, a substituted or unsubstituted benzofurocarbazole group, a substituted or unsubstituted thienocarbazole group, a substituted or unsubstituted indolocarbazole group, a substituted or unsubstituted bicarbazole group, a substituted or unsubstituted monoamine group, a substituted or unsubstituted diamine group, a substituted or unsubstituted acridane group, a substituted or unsubstituted phenoxazine group, or a substituted or unsubstituted phenothiazine group.

20. An organic electroluminescence device, comprising:
a first electrode;
a second electrode on the first electrode; and
an emission layer between the first electrode and the second electrode, the emission layer comprising a first compound represented by Formula 1, a second compound represented by Formula 2, a third compound represented by Formula 3, and a fourth compound represented by Formula 4,
wherein, based on a total weight of the first to fourth compounds, an amount of the third compound is from about 10 wt % to about 15 wt %, and an amount of the fourth compound is from about 1 wt % to about 5 wt %:

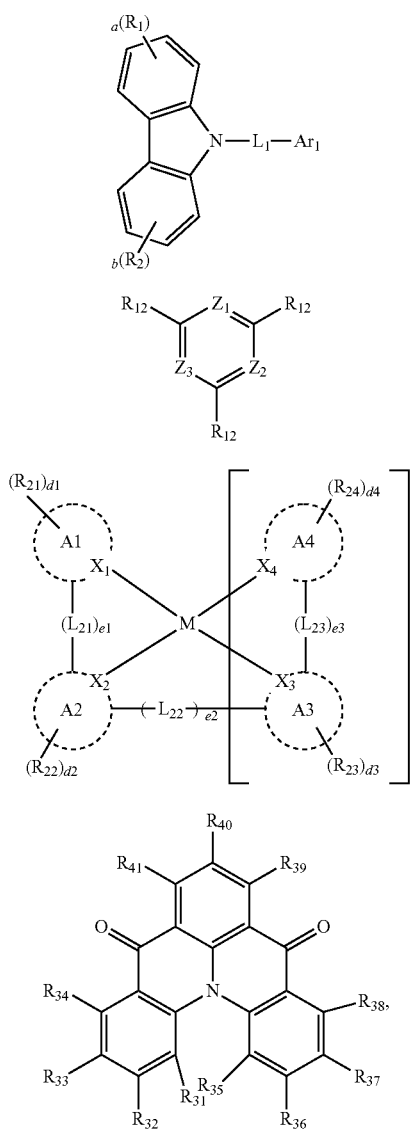

wherein, in Formula 1, $R_1$ and $R_2$ are each independently a substituted or unsubstituted aryl group of 6 to 30 carbon atoms for forming a ring, or a substituted or unsubstituted heteroaryl group of 3 to 30 carbon atoms for forming a ring, $L_1$ is a substituted or unsubstituted arylene group of 6 to 30 carbon atoms for forming a ring, or a substituted or unsubstituted heteroarylene group of 3 to 30 carbon atoms for forming a ring, $Ar_1$ is a substituted or unsubstituted aryl group of 6 to 30 carbon atoms for forming a ring, or a substituted or unsubstituted heteroaryl group of 3 to 30 carbon atoms for forming a ring, and a and b are each independently an integer of 0 to 4, in Formula 2, $Z_1$ to $Z_3$ are each independently $CR_{11}$ or N, a plurality of $R_{11}$ are each independently a substituted or unsubstituted aryl group of 6 to 30 carbon atoms for forming a ring, or a substituted or unsubstituted heteroaryl group of 3 to 30 carbon atoms for forming a ring, and a plurality of $R_{12}$ are each independently a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring, in Formula 3, A1 to A4 are each independently a substituted or unsubstituted aryl group of 6 to 30 carbon atoms for forming a ring, or a substituted or unsubstituted heteroaryl group of 1 to 30 carbon atoms for forming a ring, $X_1$ to $X_4$ are each independently C or N, $R_{21}$ to $R_{24}$ are each independently a hydrogen atom, a deuterium atom, a halogen atom, a cyano group, a substituted or unsubstituted amine group, a substituted or unsubstituted alkyl group of 1 o 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{21}$ to $R_{24}$ are optionally combined with an adjacent group to form a ring, d1 to d4 are each independently an integer of 0 to 4, $L_{21}$ to $L_{23}$ are each independently a direct linkage,

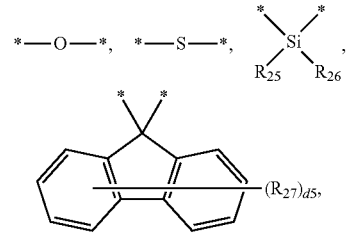

a substituted or unsubstituted divalent alkyl group of 1 to 20 carbon atoms, a substituted or unsubstituted arylene group of 6 to 30 carbon atoms for forming a ring, or a substituted or unsubstituted heteroarylene group of 2 to 30 carbon atoms for forming a ring, $R_{25}$ to $R_{27}$ are each independently a substituted or unsubstituted alkyl group of 1 to 20 carbon atoms, a substituted or unsubstituted aryl group of 6 to 30 carbon atoms for forming a ring, or a substituted or unsubstituted heteroaryl group of 3 to 30 carbon atoms for forming a ring, and any of $R_{25}$ to $R_{27}$ are optionally combined with an adjacent group to form a ring, d5 is an integer of 0 to 8, M is platinum, palladium, copper, osmium, iridium, rubidium, or rhodium, e1 to e3 are each independently 0 or 1, m is 1 or 2, when M is platinum, palladium, copper or osmium, m is 1, and when M is iridium, rubidium, or rhodium, m is 2 and e2 is 0, and in Formula 4, $R_{31}$ to $R_{41}$ are each independently a hydrogen atom, a deuterium atom, a halogen atom, a substituted or unsubstituted silyl group, a substituted or unsubstituted amine group, a substituted or unsubstituted carbonyl group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 3 to 30 carbon atoms for forming a ring.

21. The organic electroluminescence device of claim 20, wherein a weight ratio of the first compound to the second compound is from about 3:7 to about 7:3.

22. The organic electroluminescence device of claim 20, wherein the second compound is represented by Formula 2-1, and the third compound is represented by Formula 3-1:

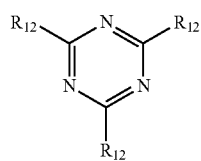

Formula 2-1

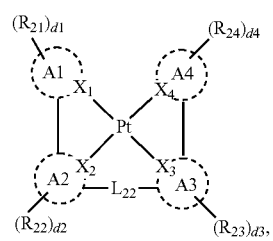

Formula 3-1 wherein, in Formula 2-1, a plurality of $R_{12}$ are each independently a substituted or unsubstituted aryl group of 6 to 30 carbon atoms for forming a ring, or a substituted or unsubstituted heteroaryl group of 3 to 30 carbon atoms for forming a ring, and in Formula 3-1, A1 to A4, $X_1$ to $X_4$, $R_{21}$ to $R_{24}$, d1 to d4, and $L_{22}$ are the same as defined in Formula 3.

23. The organic electroluminescence device of claim 20, wherein the second compound is represented by Formula 2-1, and the third compound is represented by the following Formula 3-2:

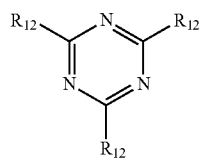

Formula 2-1

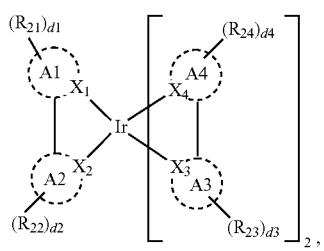

Formula 3-2 wherein, in Formula 2-1, a plurality of $R_{12}$ are each independently a substituted or unsubstituted aryl group of 6 to 30 carbon atoms for forming a ring, or a substituted or unsubstituted heteroaryl group of 3 to 30 carbon atoms for forming a ring, and in Formula 3-2, A1 to A4, $X_1$ to $X_4$, $R_{21}$ to $R_{24}$, and d1 to d4 are the same as defined in Formula 3.

24. The organic electroluminescence device of claim 20, wherein the second compound is represented by Formula 2-2, and the third compound is represented by Formula 3-1:

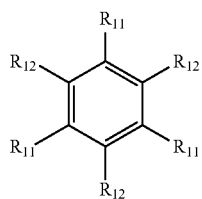

Formula 2-2

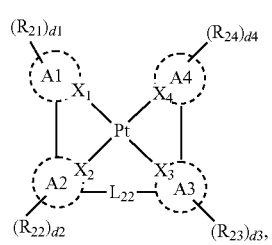

Formula 3-1 wherein, in Formula 2-2, a plurality of $R_{11}$ and a plurality of $R_{12}$ are each independently a hydrogen atom, a deuterium atom, a cyano group, a substituted silyl group, a substituted or unsubstituted pyridine group, a substituted or unsubstituted carbazole group, or a substituted or unsubstituted dibenzofuran group, and at least one selected from the plurality of $R_{11}$ and the plurality of $R_{12}$ is a cyano group, an aryl group of 6 to 30 carbon atoms, which comprises at least one cyano group as a substituent, or a heteroaryl group of 3 to 20 carbon atoms for forming a ring, which comprises at least one cyano group as a substituent, and in Formula 3-1, A1 to A4, $X_1$ to $X_4$, $R_{21}$ to $R_{24}$, d1 to d4, and $L_{22}$ are the same as defined in Formula 3.

25. An organic electroluminescence device, comprising:

a first electrode;

a second electrode on the first electrode; and an emission layer between the first electrode and the second electrode, wherein the emission layer comprises one or more compounds represented by Formula 1 to Formula 4 and is to emit delayed fluorescence:

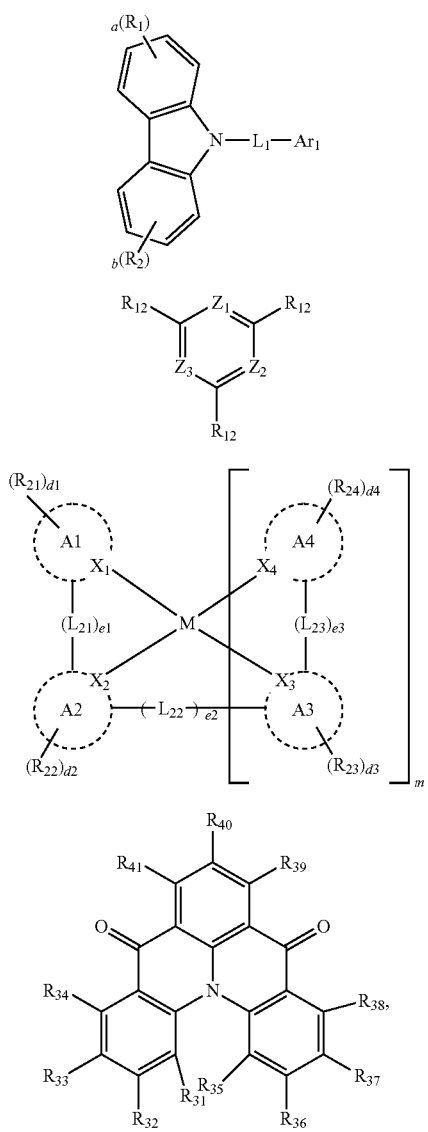

Formula 1

Formula 2

Formula 3

Formula 4 wherein, in Formula 1,

R₁ and R₂ are each independently a substituted or unsubstituted aryl group of 6 to 30 carbon atoms for forming a ring, or a substituted or unsubstituted heteroaryl group of 3 to 30 carbon atoms for forming a ring, $L_1$ is a substituted or unsubstituted arylene group of 6 to 30 carbon atoms for forming a ring, or a substituted or unsubstituted heteroarylene group of 3 to 30 carbon atoms for forming a ring, $Ar_1$ is a substituted or unsubstituted aryl group of 6 to 30 carbon atoms for forming a ring, or a substituted or unsubstituted heteroaryl group of 3 to 30 carbon atoms for forming a ring, and a and b are each independently an integer of 0 to 4, in Formula 2, $Z_1$ to $Z_3$ are each independently $CR_{11}$ or N, a plurality of $R_{11}$ are each independently a substituted or unsubstituted aryl group of 6 to 30 carbon atoms for forming a ring, or a substituted or unsubstituted heteroaryl group of 3 to 30 carbon atoms for forming a ring, and a plurality of $R_{12}$ are each independently a hydrogen atom, a deuterium atom, a cyano group, a substituted silyl group, a substituted or unsubstituted aryl group of 6 to 30 carbon atoms for forming a ring, or a substituted or unsubstituted heteroaryl group of 3 to 30 carbon atoms for forming a ring, in Formula 3, A1 to A4 are each independently a substituted or unsubstituted aryl group of 6 to 30 carbon atoms for forming a ring, or a substituted or unsubstituted heteroaryl group of 1 to 30 carbon atoms for forming a ring, $X_1$ to $X_4$ are each independently C or N, $R_{21}$ to $R_{24}$ are each independently a hydrogen atom, a deuterium atom, a halogen atom, a cyano group, a substituted or unsubstituted amine group, a substituted or unsubstituted alkyl group of 1 o 20 carbon atoms, a substituted or unsubstituted aryl group of 6 to 30 carbon atoms for forming a ring, or a substituted or unsubstituted heteroaryl group of 1 to 30 carbon atoms for forming a ring, and any of $R_{21}$ to $R_{24}$ are optionally combined with an adjacent group to form a ring, d1 to d4 are each independently an integer of 0 to 4, $L_{21}$ to $L_{23}$ are each independently a direct linkage,

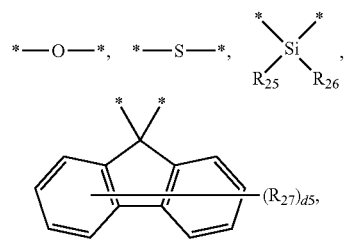

a substituted or unsubstituted divalent alkyl group of 1 to 20 carbon atoms, a substituted or unsubstituted arylene group of 6 to 30 carbon atoms for forming a ring, or a substituted or unsubstituted heteroarylene group of 2 to 30 carbon atoms for forming a ring, $R_{25}$ to $R_{27}$ are each independently a substituted or unsubstituted alkyl group of 1 to 20 carbon atoms, a substituted or unsubstituted aryl group of 6 to 30 carbon atoms for forming a ring, or a substituted or unsubstituted heteroaryl group of 3 to 30 carbon atoms for forming a ring, and any of $R_{25}$ to $R_{27}$ are optionally combined with an adjacent group to form a ring, d5 is an integer of 0 to 8, M is platinum, palladium, copper, osmium, iridium, rubidium, or rhodium, e1 to e3 are each independently 0 or 1, m is 1 or 2, when M is platinum, palladium, copper or osmium, m is 1, and when M is iridium, rubidium, or rhodium, m is 2 and e2 is 0, and in Formula 4, $R_{31}$ to $R_{41}$ are each independently a hydrogen atom, a deuterium atom, a halogen atom, a substituted or unsubstituted silyl group, a substituted or unsubstituted amine group, a substituted or unsubstituted carbonyl group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 3 to 30 carbon atoms for forming a ring.

\* \* \* \* \*